(12) United States Patent
Wang et al.

(10) Patent No.: US 12,713,771 B2
(45) Date of Patent: Aug. 18, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Mengqi Wang, Beijing (CN); Wenbo Chen, Beijing (CN); Zhengkun Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 539 days.

(21) Appl. No.: 18/255,099

(22) PCT Filed: Aug. 30, 2022

(86) PCT No.: PCT/CN2022/115714

§ 371 (c)(1),
(2) Date: May 31, 2023

(87) PCT Pub. No.: WO2024/044933

PCT Pub. Date: Mar. 7, 2024

(65) Prior Publication Data

US 2024/0365593 A1 Oct. 31, 2024

(51) Int. Cl.
*H10K 59/121* (2023.01)
*G09G 3/3258* (2016.01)
(Continued)

(52) U.S. Cl.
CPC ....... *H10K 59/1216* (2023.02); *G09G 3/3258* (2013.01); *G09G 3/3291* (2013.01);
(Continued)

(58) Field of Classification Search
CPC .......... H10K 59/1216; H10K 59/1213; H10K 59/131; H10K 59/12; H10K 59/00;
(Continued)

(56) References Cited

U.S. PATENT DOCUMENTS

2004/0135496 A1 7/2004 Park et al.
2015/0221705 A1 8/2015 Amano
(Continued)

FOREIGN PATENT DOCUMENTS

CN 105321474 A 2/2016
CN 105845082 A 8/2016
(Continued)

OTHER PUBLICATIONS

Extended European Search Report in the European Patent Application No. 22956768.0, dated Nov. 14, 2024.
(Continued)

*Primary Examiner* — Chad M Dicke
*Assistant Examiner* — Gary Abel
(74) *Attorney, Agent, or Firm* — Intellectual Valley Law, P.C.

(57) ABSTRACT

An array substrate is provided. The array substrate includes a plurality of pixel driving circuits configured to drive light emission in a plurality of subpixels; at least one dummy circuit incapable of driving light emission; and a plurality of voltage supply lines configured to provide a voltage. The voltage is provided to a second capacitor electrode of at least one pixel driving circuit of the plurality of pixel driving circuits, and is provided to both capacitor electrodes of the at least one dummy circuit.

19 Claims, 46 Drawing Sheets

(51) Int. Cl.

| | |
|---|---|
| ***G09G 3/3291*** | (2016.01) |
| ***H10K 59/131*** | (2023.01) |
| ***H10K 59/88*** | (2023.01) |

(52) U.S. Cl.

CPC ....... *H10K 59/1213* (2023.02); *H10K 59/131* (2023.02); *H10K 59/88* (2023.02); *G09G 2300/0842* (2013.01)

(58) Field of Classification Search

CPC ............. H10K 59/70; H10K 59/80–88; G09G 3/3258; G09G 3/3291; G09G 2300/0842; G09G 2300/0413; G09G 2300/0426; G09G 3/3233; G09G 3/2074; G09G 2300/0809; H02J 7/0031

See application file for complete search history.

(56) References Cited

U.S. PATENT DOCUMENTS

| | | | | |
|---|---|---|---|---|
| 2015/0325593 | A1* | 11/2015 | Shih | G09G 5/00 345/206 |
| 2016/0035284 | A1 | 2/2016 | Jung et al. | |
| 2016/0217746 | A1 | 7/2016 | An et al. | |
| 2016/0218155 | A1* | 7/2016 | Park | H10K 59/131 |
| 2016/0321992 | A1 | 11/2016 | Kim et al. | |
| 2018/0247597 | A1 | 8/2018 | An et al. | |
| 2019/0122626 | A1 | 4/2019 | Du et al. | |
| 2020/0027901 | A1 | 1/2020 | Cho et al. | |
| 2020/0143741 | A1* | 5/2020 | Tsuboi | G09G 3/3233 |
| 2020/0176551 | A1* | 6/2020 | Park | H10K 50/86 |
| 2020/0211477 | A1 | 7/2020 | Lai et al. | |
| 2021/0043147 | A1 | 2/2021 | Hao et al. | |
| 2021/0050405 | A1 | 2/2021 | Na et al. | |
| 2021/0134223 | A1* | 5/2021 | Li | G09G 3/3233 |
| 2021/0313415 | A1* | 10/2021 | Ma | H10K 59/1315 |
| 2021/0408202 | A1 | 12/2021 | Liu et al. | |
| 2022/0180809 | A1 | 6/2022 | Wang et al. | |
| 2022/0302230 | A1 | 9/2022 | Dai et al. | |
| 2022/0302236 | A1 | 9/2022 | Wang et al. | |
| 2023/0157102 | A1 | 5/2023 | Du et al. | |

FOREIGN PATENT DOCUMENTS

| | | | |
|---|---|---|---|
| CN | 106098727 | A | 11/2016 |
| CN | 106356381 | A | 1/2017 |
| CN | 209691758 | U | 11/2019 |
| CN | 111599308 | A | 8/2020 |
| CN | 113658995 | B | 4/2022 |
| CN | 114566519 | A | 5/2022 |
| CN | 114762032 | A | 7/2022 |
| CN | 114864640 | A | 8/2022 |
| CN | 114902322 | A | 8/2022 |
| CN | 114946030 | A | 8/2022 |
| JP | 2011090244 | A | 5/2011 |
| JP | 2015148722 | A | 8/2015 |
| KR | 20160017695 | A | 2/2016 |
| KR | 20210085502 | A | 7/2021 |
| WO | 2022082773 | A1 | 4/2022 |
| WO | 2022099610 | A1 | 5/2022 |
| WO | 2022109845 | A1 | 6/2022 |

OTHER PUBLICATIONS

International Search Report & Written Opinion mailed Dec. 21, 2022, regarding PCT/CN2022/115714.

First Office Action in the Chinese Patent Application No. 202280002961.9, dated Apr. 20, 2023; English translation attached.

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/115714, filed Aug. 30, 2022, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of pixel driving circuits configured to drive light emission in a plurality of subpixels; at least one dummy circuit incapable of driving light emission; and a plurality of voltage supply lines configured to provide a voltage; wherein the voltage is provided to a second capacitor electrode of at least one pixel driving circuit of the plurality of pixel driving circuits, and is provided to both capacitor electrodes of the at least one dummy circuit.

Optionally, a respective voltage supply line of the plurality of voltage supply lines is configured to provide the voltage to a storage capacitor of the at least one pixel driving circuit, and provide the voltage to a second storage capacitor of the at least one dummy circuit.

Optionally, the voltage is provided to a control electrode, a first electrode, and a second electrode of at least one transistor in the at least one dummy circuit.

Optionally, the at least one dummy circuit comprises a second driving transistor having a control electrode connected to a third capacitor electrode of the second storage capacitor; and the voltage is provided to a control electrode, a first electrode, and a second electrode of the second driving transistor.

Optionally, the array substrate further comprises a plurality of data lines, a respective data line configured to provide a data voltage to the at least one pixel driving circuit; wherein the at least one dummy circuit is disconnected from the plurality of data lines.

Optionally, the array substrate further comprises a plurality of second reset signal lines, a respective second reset signal line configured to provide a reset signal to a first electrode of a first transistor in the at least one pixel driving circuit; wherein the at least one dummy circuit is disconnected from the plurality of second reset signal lines.

Optionally, the array substrate further comprises a plurality of data lines, a respective data line configured to provide a data voltage to the at least one pixel driving circuit; wherein an orthographic projection of the plurality of second reset signal lines on a base substrate is non-overlapping with an orthographic projection of a plurality of data lines on the base substrate.

Optionally, each terminal of each transistor and capacitor in the at least one dummy circuit is configured to be provided with a same voltage as the respective voltage supply line.

Optionally, the array substrate further comprises a second node connecting line in a first signal line layer; wherein the second node connecting line connects a third capacitor electrode of the at least one dummy circuit and a portion of a semiconductor material layer together, the portion of the semiconductor material layer being between a first electrode of a seventh transistor and a second electrode of the second driving transistor.

Optionally, the array substrate further comprises a pad in a second signal line layer, the pad being connected to a second node connecting line and a respective voltage supply line of the plurality of voltage supply lines in a first signal line layer.

Optionally, an orthographic projection of the pad in a respective dummy circuit on a base substrate covers at least 50% of an orthographic projection of the second node connecting line in the respective dummy circuit on the base substrate.

Optionally, the array substrate further comprises a plurality of second reset signal lines in the first signal line layer; wherein an orthographic projection of the pad on a base substrate at least partially overlaps with an orthographic projection of a respective second reset signal line of the plurality of second reset signal lines on the base substrate.

Optionally, the array substrate further comprises a second initialization connecting line and a fourth relay electrode in a first signal line layer; wherein the second initialization connecting line and the fourth relay electrode are parts of a unitary structure which crosses over a respective second reset control signal line of a plurality of second reset control signal line.

Optionally, the array substrate further comprises a plurality of fifth reset signal lines in a second conductive layer, the plurality of fifth reset signal lines being in a row and disconnected and spaced apart from each other; wherein the second initialization connecting line is connected to a respective fifth reset signal line of the plurality of fifth reset signal lines; and the pad is connected to the second initialization connecting line, configured to provide a voltage of the respective voltage supply line to the respective fifth reset signal line.

Optionally, the array substrate further comprises a third relay electrode in a first signal line layer; wherein the third relay electrode is connected to a second electrode of an eighth transistor in a semiconductor material layer; and the pad is connected to the third relay electrode, configured to provide a voltage of the respective voltage supply line to the second electrode of the eighth transistor.

Optionally, the array substrate further comprises a plurality of second reset control signal line in a first conductive layer; wherein a respective second reset control signal line of the plurality of second reset control signal line is connected to a control electrode of a seventh transistor; and the respective voltage supply line in a first signal line layer is connected to the respective second reset control signal line, configured to provide a voltage of the respective voltage supply line to the control electrode of the seventh transistor.

Optionally, the array substrate further comprises a plurality of second gate lines in a row and disconnected and spaced apart from each other, and a plurality of second light emission control signal lines disconnected and spaced apart from each other; wherein a respective dummy circuit comprises a respective second gate line and a respective second light emission control signal line; the second storage capacitor in the respective dummy circuit comprises a third capacitor electrode; and the third capacitor electrode, the respective second gate line, and the respective second light emission control signal line are parts of a unitary structure in the respective dummy circuit.

Optionally, the respective dummy circuit comprises an eighth transistor, a control electrode of which is connected to the respective second light emission control signal line; and the respective second gate line crosses over the respective voltage supply line and a respective second reset signal line of a plurality of second reset signal lines.

Optionally, the array substrate comprises a semiconductor material layer, which comprises active layers of transistors of the at least one dummy circuit; wherein the semiconductor material layer does not cross over the plurality of second gate lines.

Optionally, a respective dummy circuit comprises the second storage capacitor, a seventh transistor, a second driving transistor, and an eighth transistor; wherein the second driving transistor comprises a control electrode and a second electrode connected to a pad configured to be provided with a voltage of the respective voltage supply line, and a first electrode connected to the respective voltage supply line; the seventh transistor comprises a control electrode connected to a respective second reset control signal line of a plurality of second reset control signal line, which is configured to be provided with a voltage of the respective voltage supply line, a second electrode connected to the pad; and the eighth transistor comprises a control electrode connected to a respective second light emission control signal line of a plurality of second light emission control signal lines, a first electrode connected to the second electrode of the second driving transistor, and a second electrode connected to the pad.

Optionally, the array substrate comprises a main display area, a GOA circuit area, and a fanout area; wherein dummy circuits are absent in at least a portion of the GOA circuit area or the fanout area; and in at least a portion of the main display area, the array substrate has a circuit pattern of N1 and n1 alternately arranged, wherein N1 stands for N1 number of rows of pixel driving circuits, and n1 stands for n1 number of rows of dummy circuits.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Accordingly, the present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of pixel driving circuits configured to drive light emission in a plurality of subpixels; at least one dummy circuit incapable of driving light emission; and a plurality of voltage supply lines, a respective voltage supply line configured to provide a voltage to a storage capacitor of at least one pixel driving circuit, and provide the voltage to a second storage capacitor of the at least one dummy circuit. Optionally, the voltage is provided to a second capacitor electrode of the at least one pixel driving circuit, and is provided to both capacitor electrodes of the at least one dummy circuit.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
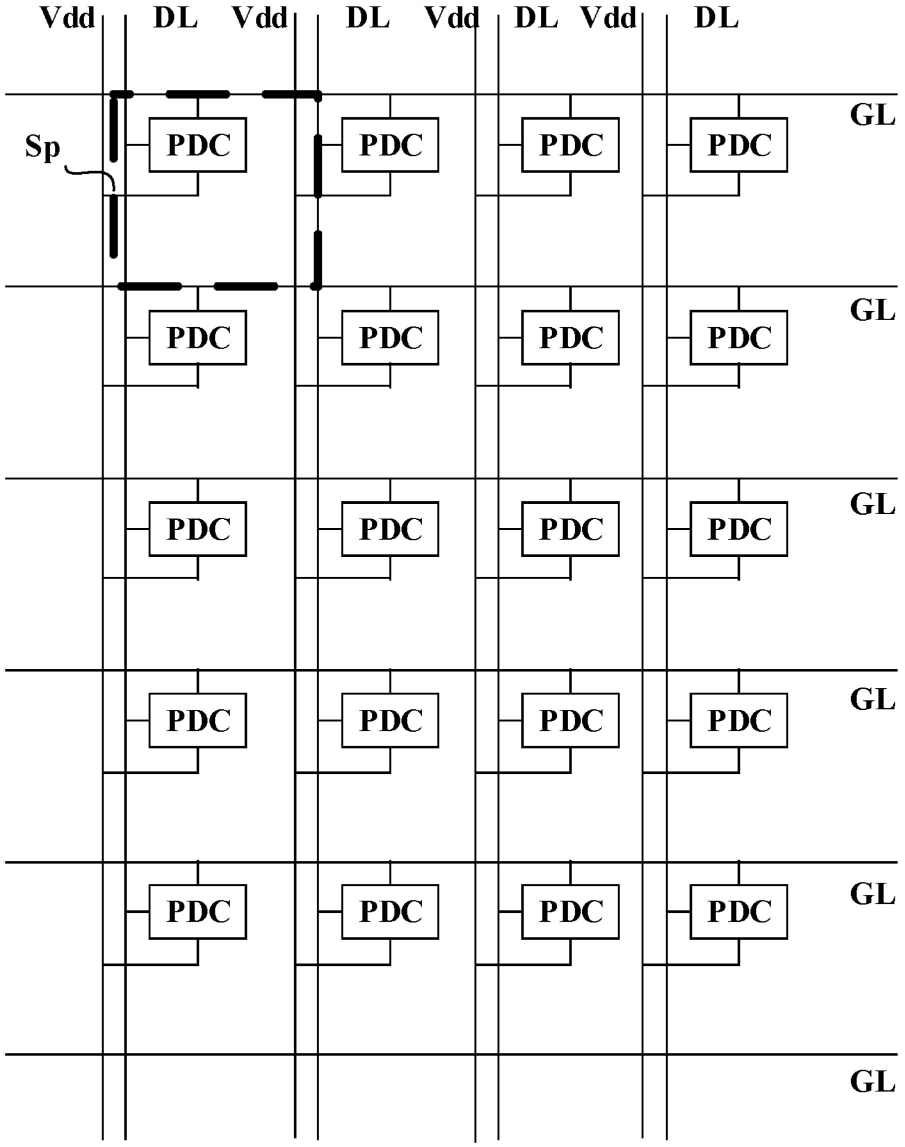
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, and a plurality of high voltage signal lines Vdd. Light emission in a respective subpixel is driven by a respective pixel driving circuit PDC. In one example, a high voltage signal is input, through a respective one of the plurality of high voltage signal lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage $\Delta V$ that drives light emission in the light emitting element.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, and the driving transistor Td.

Figure 2A:
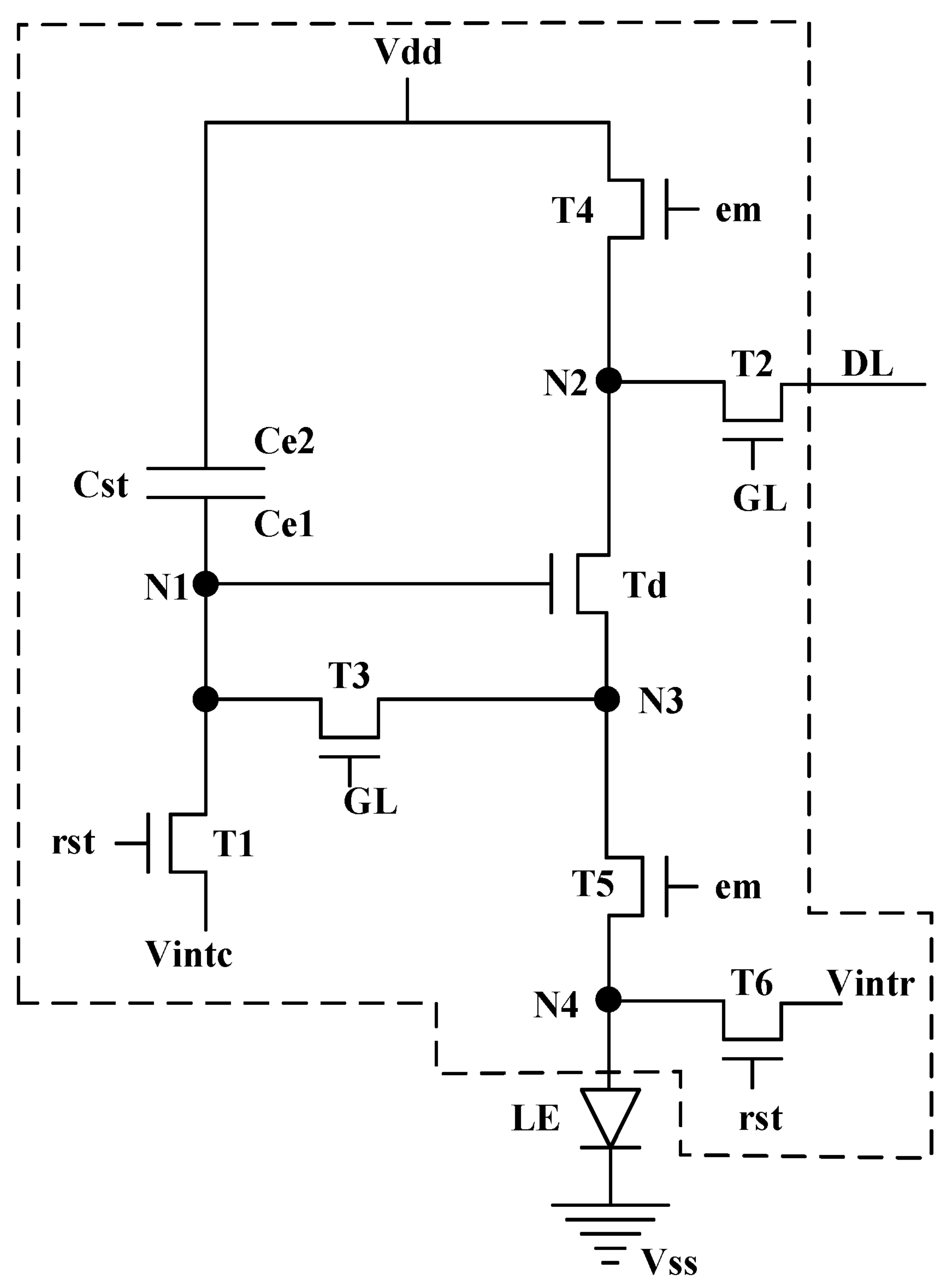
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the respective pixel driving circuit includes a driving transistor Td; a storage capacitor Cst having a first capacitor electrode Ce1 and a second capacitor electrode Ce2; a first transistor T1 having a control electrode connected to a respective reset control signal line of a plurality of reset control signal lines rst, a first electrode connected to a respective second reset signal line of a plurality of second reset signal lines Vintc, and a second electrode connected to a first capacitor electrode Ce1 of the storage capacitor Cst and a control electrode of the driving transistor Td; a second transistor T2 having a control electrode connected to a respective gate line of a plurality of gate lines GL, a first electrode connected to a respective data line of a plurality of data lines DL, and a second electrode connected to a first electrode of the driving transistor Td; a third transistor T3 having a control electrode connected to the respective gate line, a first electrode connected to the first capacitor electrode Ce1 of the storage capacitor Cst and the control electrode of the driving transistor Td, and a second electrode connected to a second electrode of the driving transistor Td; a fourth transistor T4 having a control electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a control electrode connected to the respective light emitting control signal line, a first electrode connected to second electrodes of the driving transistor Td and the third transistor T3, and a second electrode connected to an anode of a light emitting element LE; and a sixth transistor T6 having a control electrode connected to the respective reset control signal line of a plurality of reset control signal lines rst, a first electrode connected to a respective first reset signal line of the plurality of first reset signal lines Vintr, and a second electrode connected to the second electrode of the fifth transistor and the anode of the light emitting element LE. The second capacitor electrode Ce2 is connected to the respective voltage supply line and the first electrode of the fourth transistor T4.

Figure 2B:
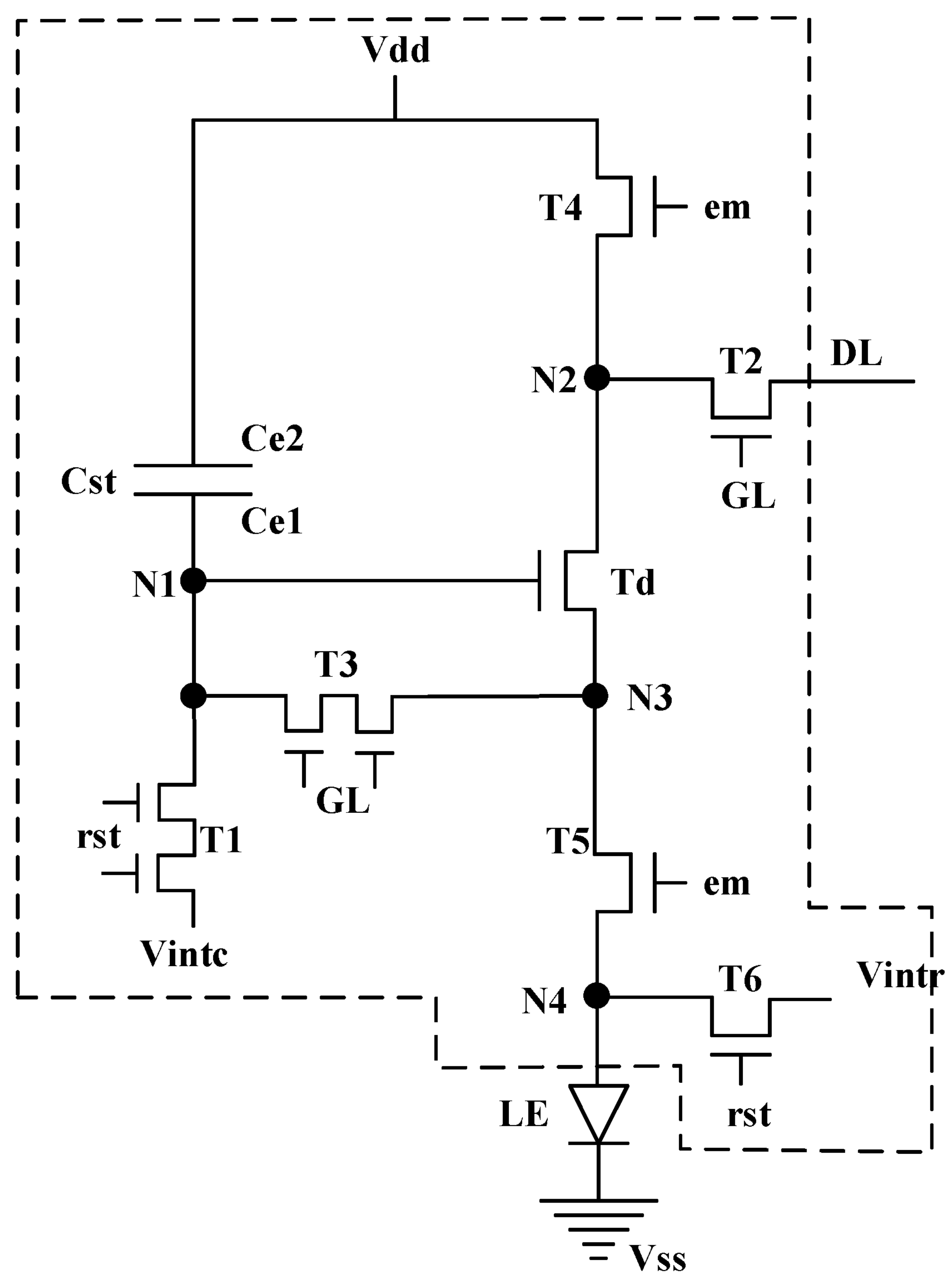
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the control electrode of the driving transistor Td, the first capacitor electrode Ce1, and the first electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the second electrode of the third transistor T3, and the first electrode of the fifth transistor T5. The fourth node N4 is connected to the second electrode of the fifth transistor T5, the second electrode of the sixth transistor T6 and the anode of the light emitting element LE.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

Figure 3A:
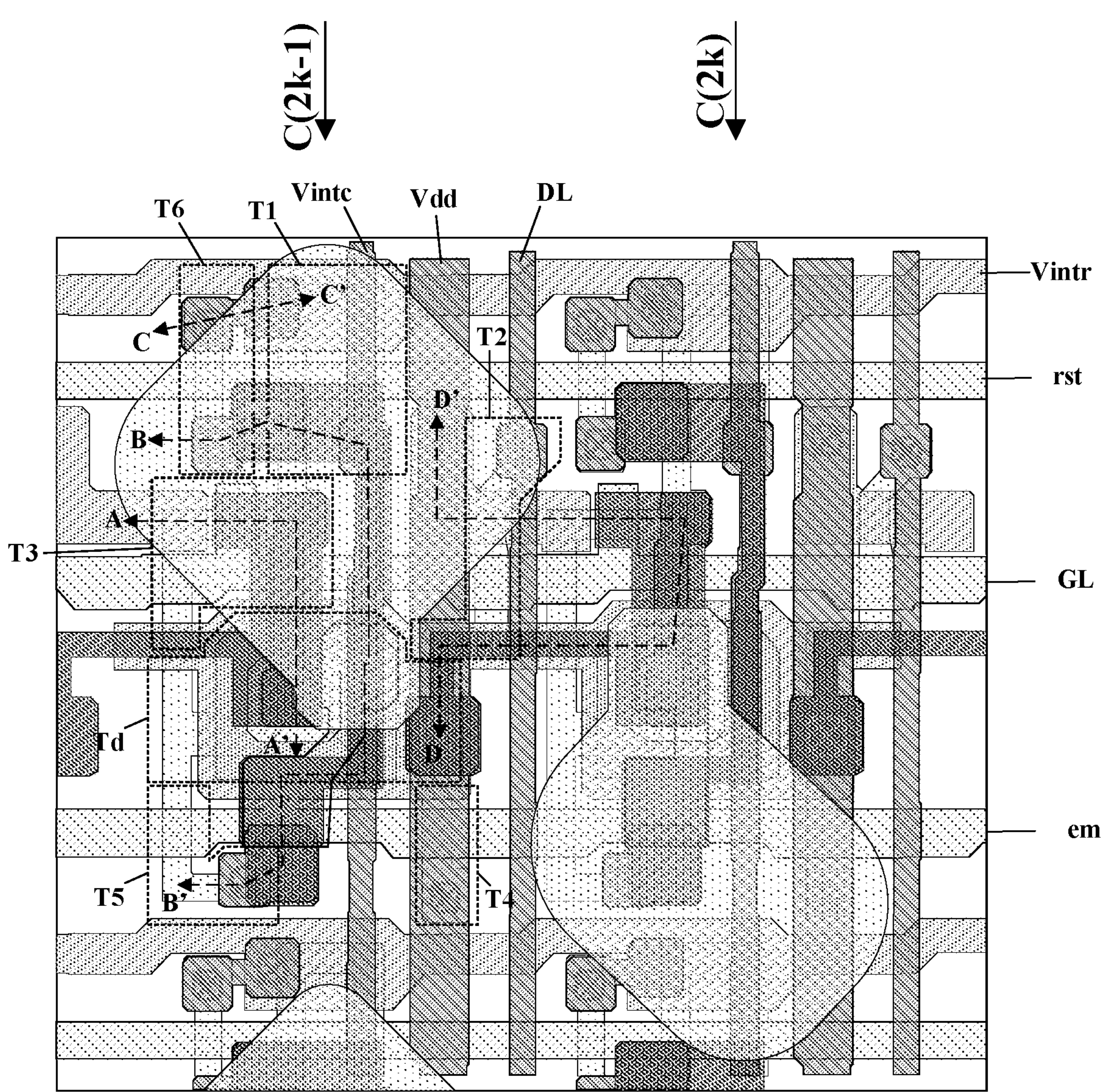
FIG. 3A is a diagram illustrating the structure of an array substrate in some embodiments according to the present disclosure.
Figure 3B:
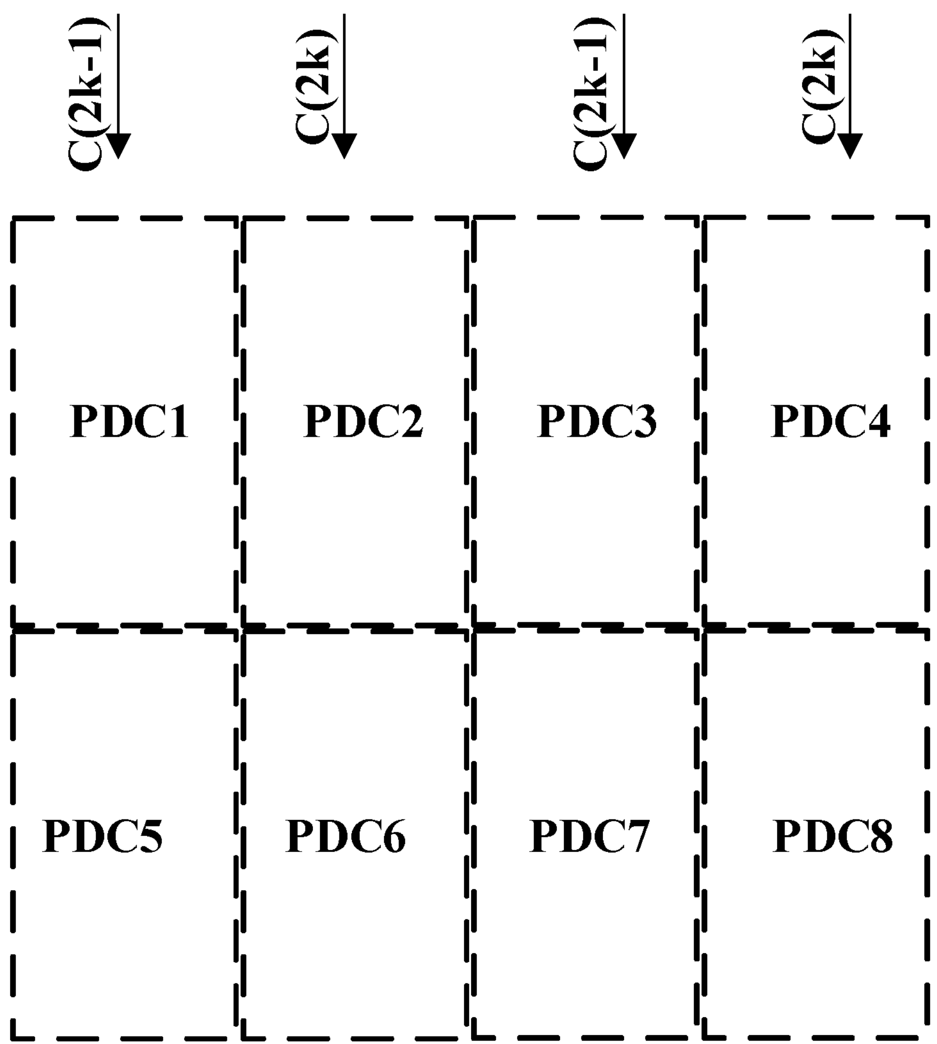
FIG. 3B is a schematic diagram illustrating an arrangement of a plurality of pixel driving circuits in an array substrate depicted in FIG. 3A.

FIG. 3A is a diagram illustrating the structure of an array substrate in some embodiments according to the present disclosure. FIG. 3B is a schematic diagram illustrating an arrangement of a plurality of pixel driving circuits in an array substrate depicted in FIG. 3A. FIG. 3B depicts a portion of the array substrate having eight pixel driving circuits, including PDC1, PDC2, PDC3, PDC4, PDC5, PDC6, PDC7, and PDC8. The pixel driving circuits are arranged in columns, including (2k−1)-th columns C(2k−1) and (2k)-th columns C(2k). FIG. 3A depicts a portion of the array substrate having two pixel driving circuits respectively in a (2k−1)-th column and a (2k)-th column. In one example, the two pixel driving circuits in FIG. 3A correspond to PDC1 and PDC2 in FIG. 3B.

As used herein, the term "(2k−1)-th column" and the term "(2k)-th column" are used in the context of the K columns. The array substrate may or may not include additional column(s) before the first column of the K columns and/or additional columns after the last column of the K columns. In the context of the array substrate, the term "(2k−1)-th column" does not necessarily denote an odd-numbered column in the array substrate, and the term "(2k)-th column does not necessarily denote an even-numbered column in the array substrate. In one example, the (2k−1)-th column is an odd-numbered column in the context of the K columns, but may be an even-numbered column in the context of the array substrate. In another example, the (2k−1)-th column is an odd-numbered column in the context of the K columns, and also an odd-numbered column in the context of the array substrate. In one example, the (2k)-th column is an even-numbered column in the context of the K columns, but may be an odd-numbered column in the context of the array substrate. In another example, the (2k)-th column is an even-numbered column in the context of the K columns, and also an even-numbered column in the context of the array substrate.

Figure 3C:
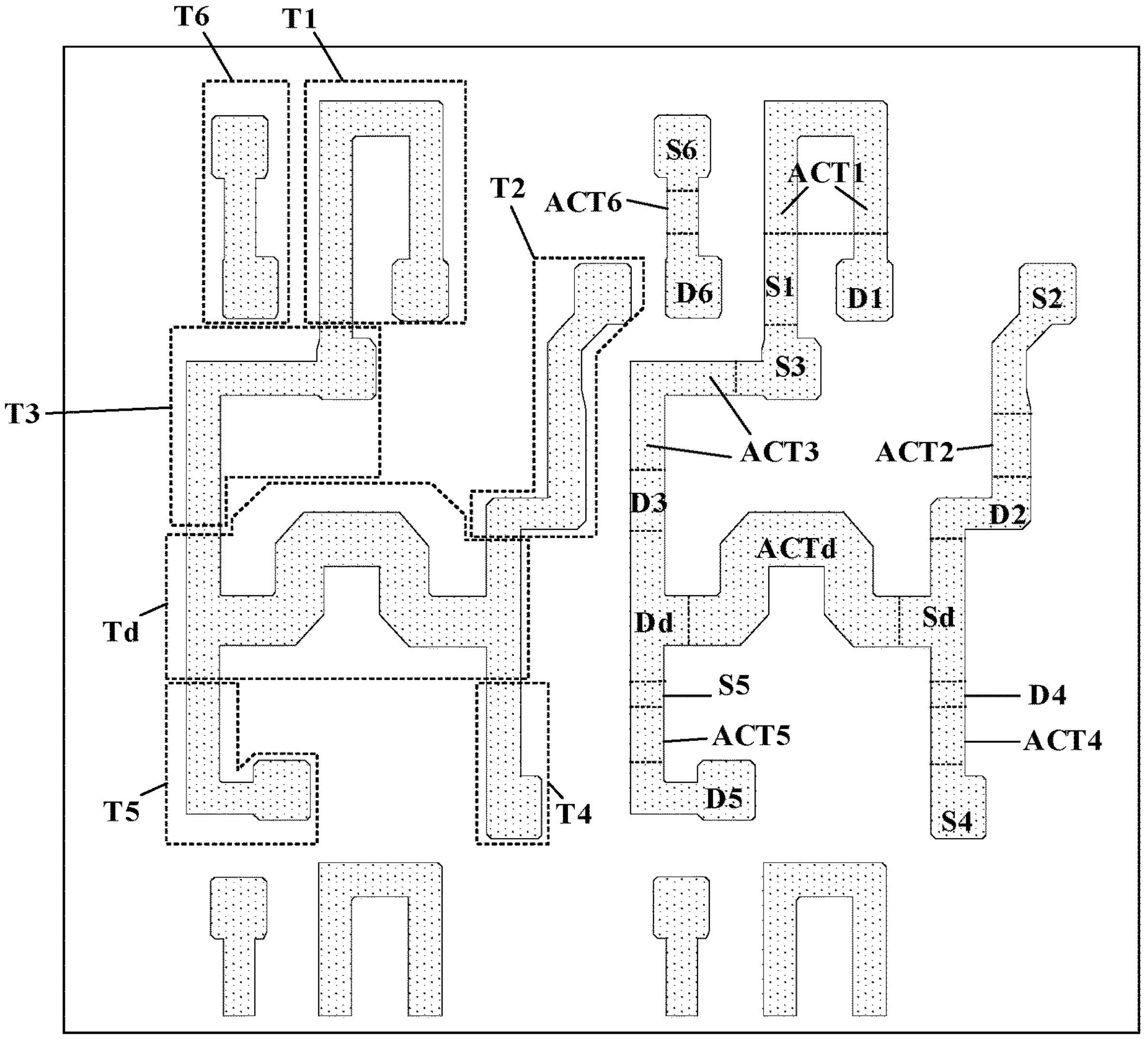
FIG. 3C is a diagram illustrating the structure of a semiconductor material layer in an array substrate depicted in FIG. 3A.
Figure 3D:
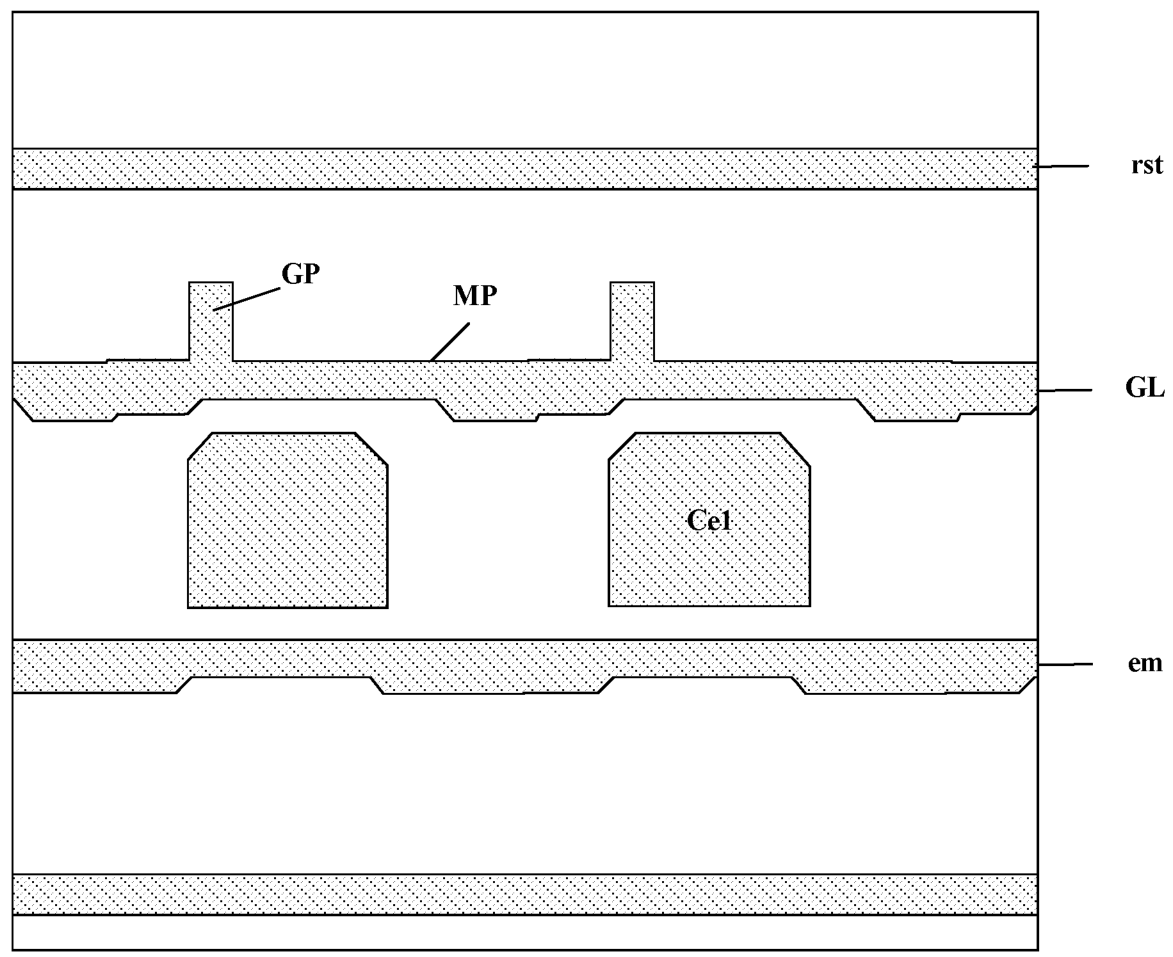
FIG. 3D is a diagram illustrating the structure of a first conductive layer in an array substrate depicted in FIG. 3A.
Figure 3E:
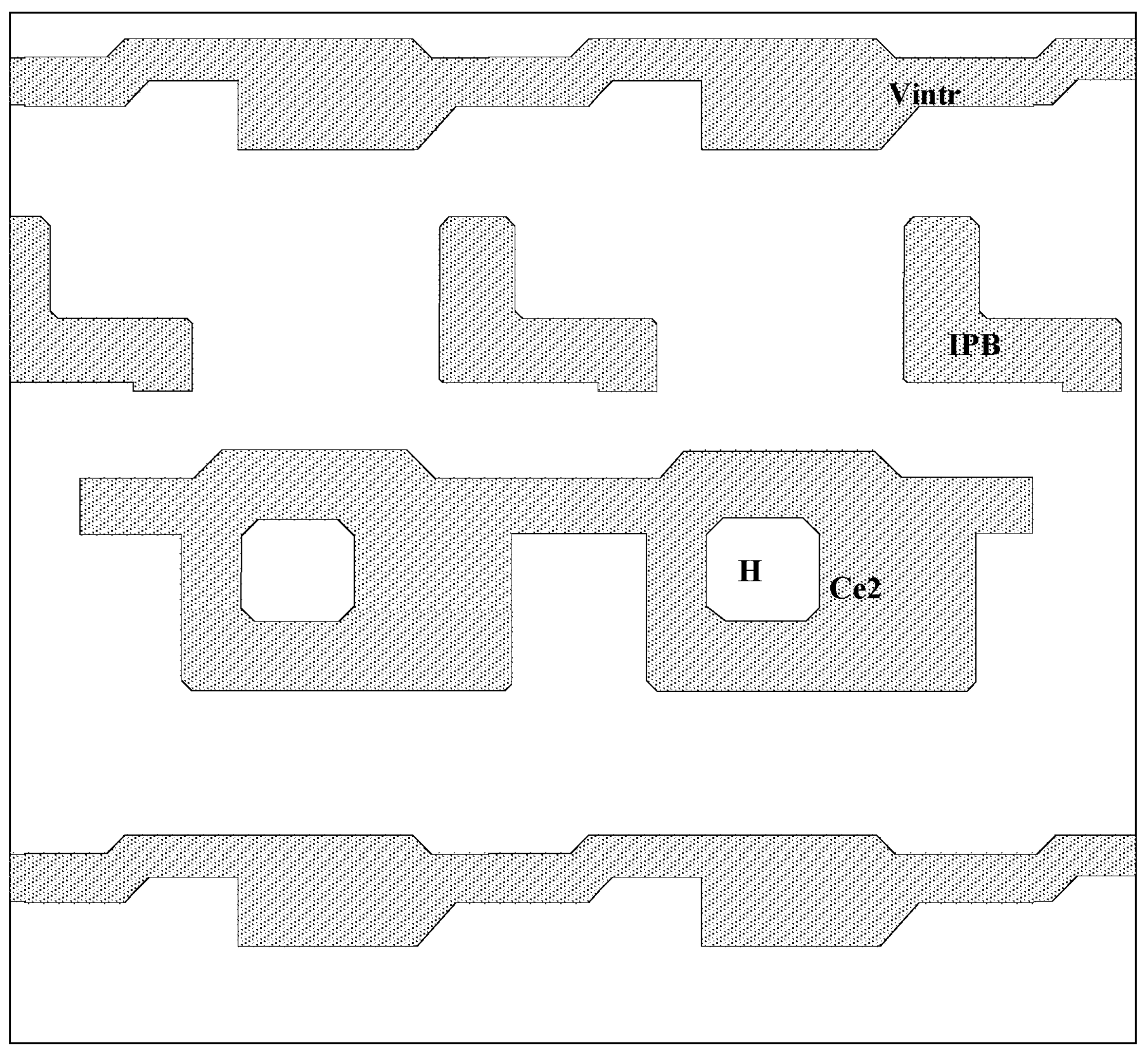
FIG. 3E is a diagram illustrating the structure of a second conductive layer in an array substrate depicted in FIG. 3A.
Figure 3F:
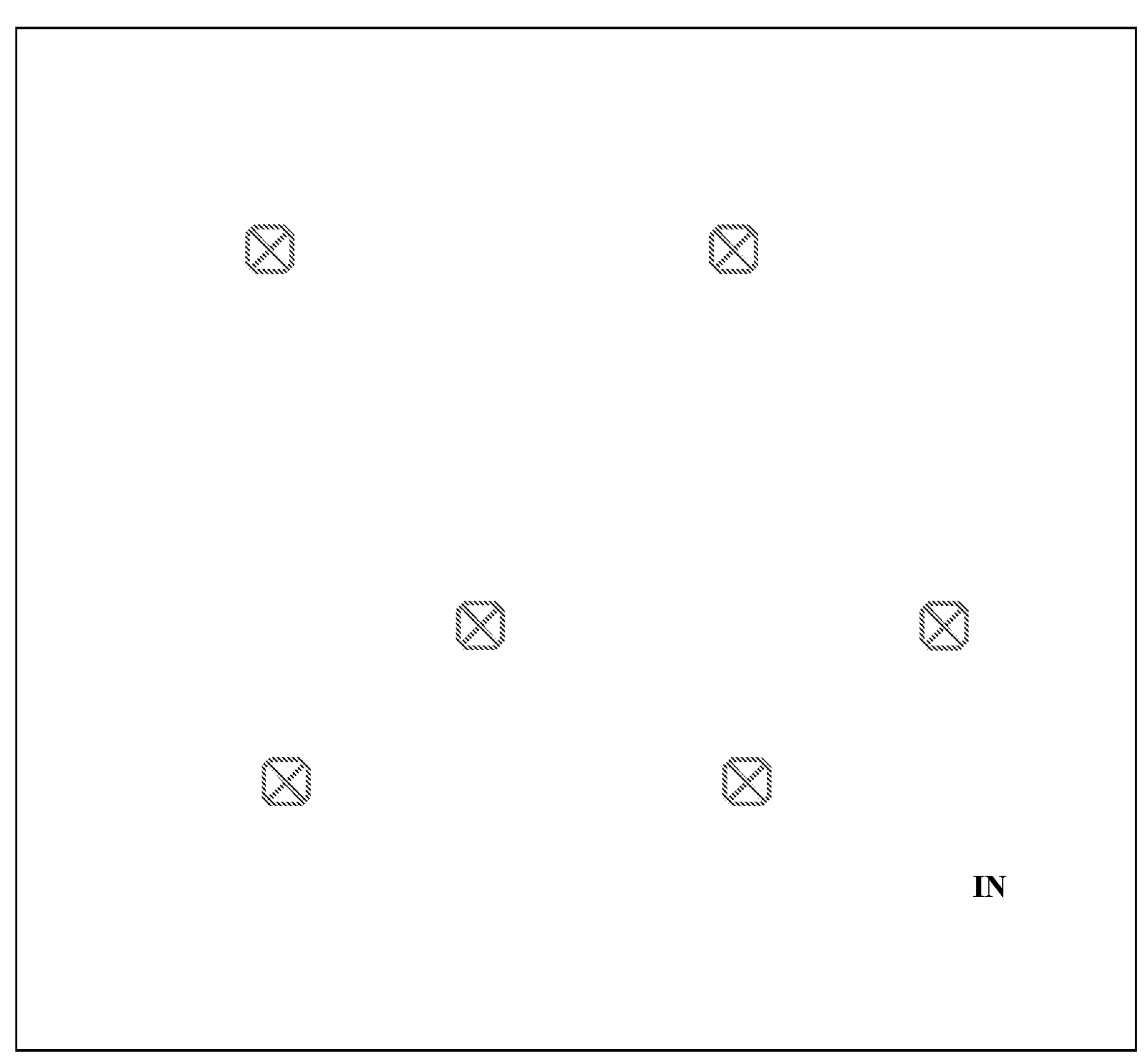
FIG. 3F is a diagram illustrating the structure of an insulating layer in an array substrate depicted in FIG. 3A.
Figure 3G:
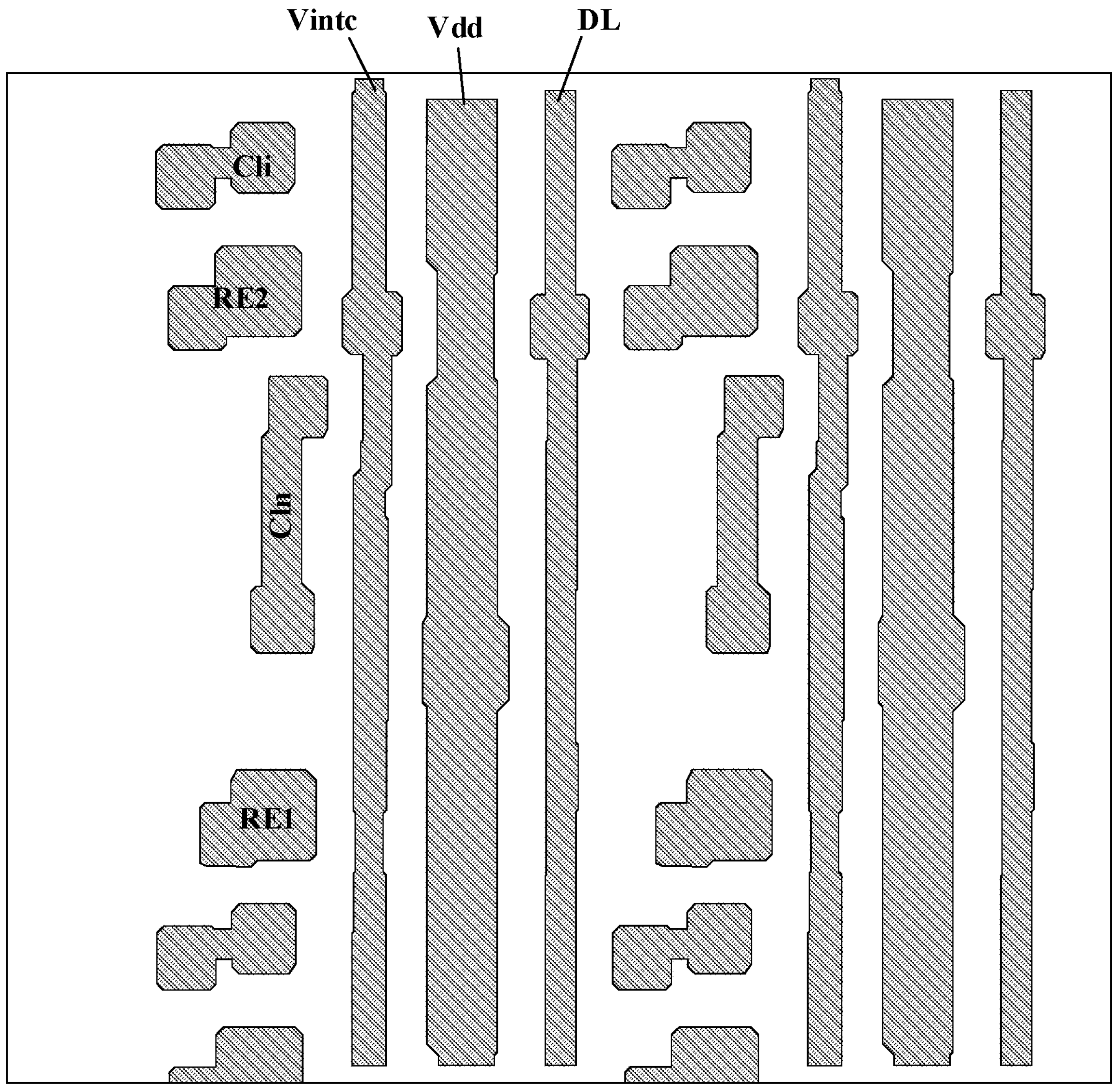
FIG. 3G is a diagram illustrating the structure of a first signal line layer in an array substrate depicted in FIG. 3A.
Figure 3H:
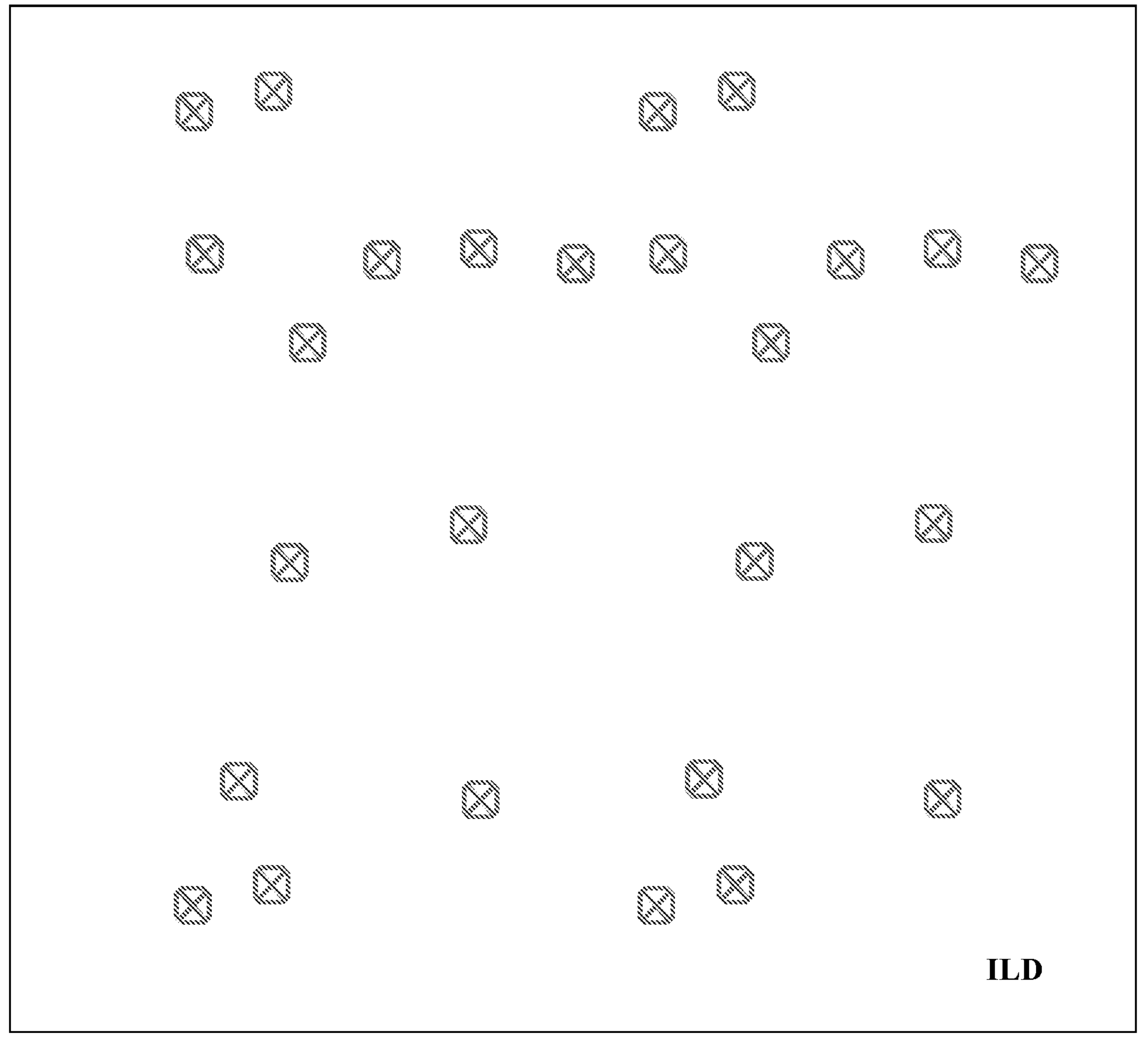
FIG. 3H is a diagram illustrating the structure of an inter-layer dielectric layer in an array substrate depicted in FIG. 3A.
Figure 3I:
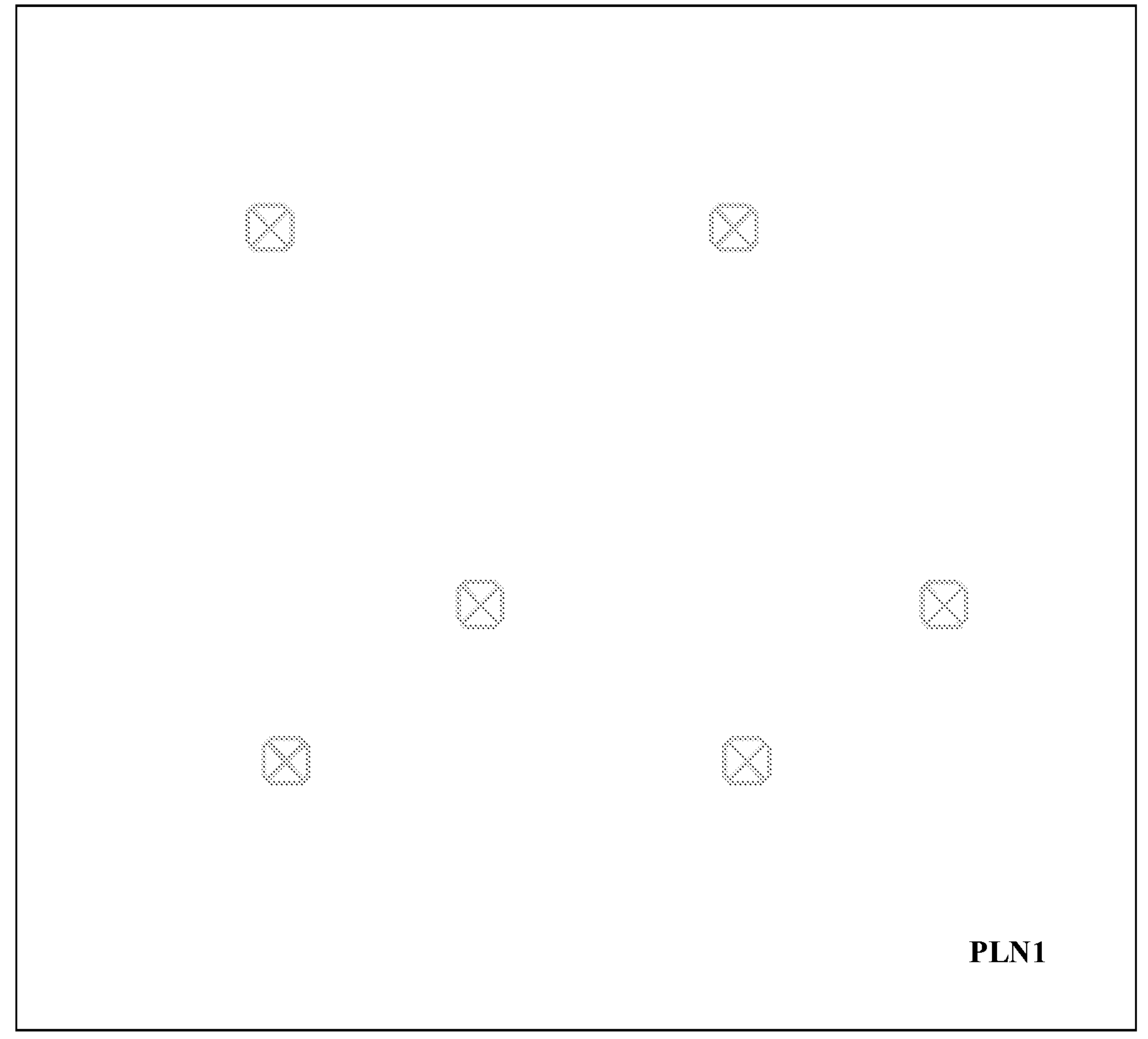
FIG. 3I is a diagram illustrating the structure of a first planarization layer in an array substrate depicted in FIG. 3A.
Figure 3J:
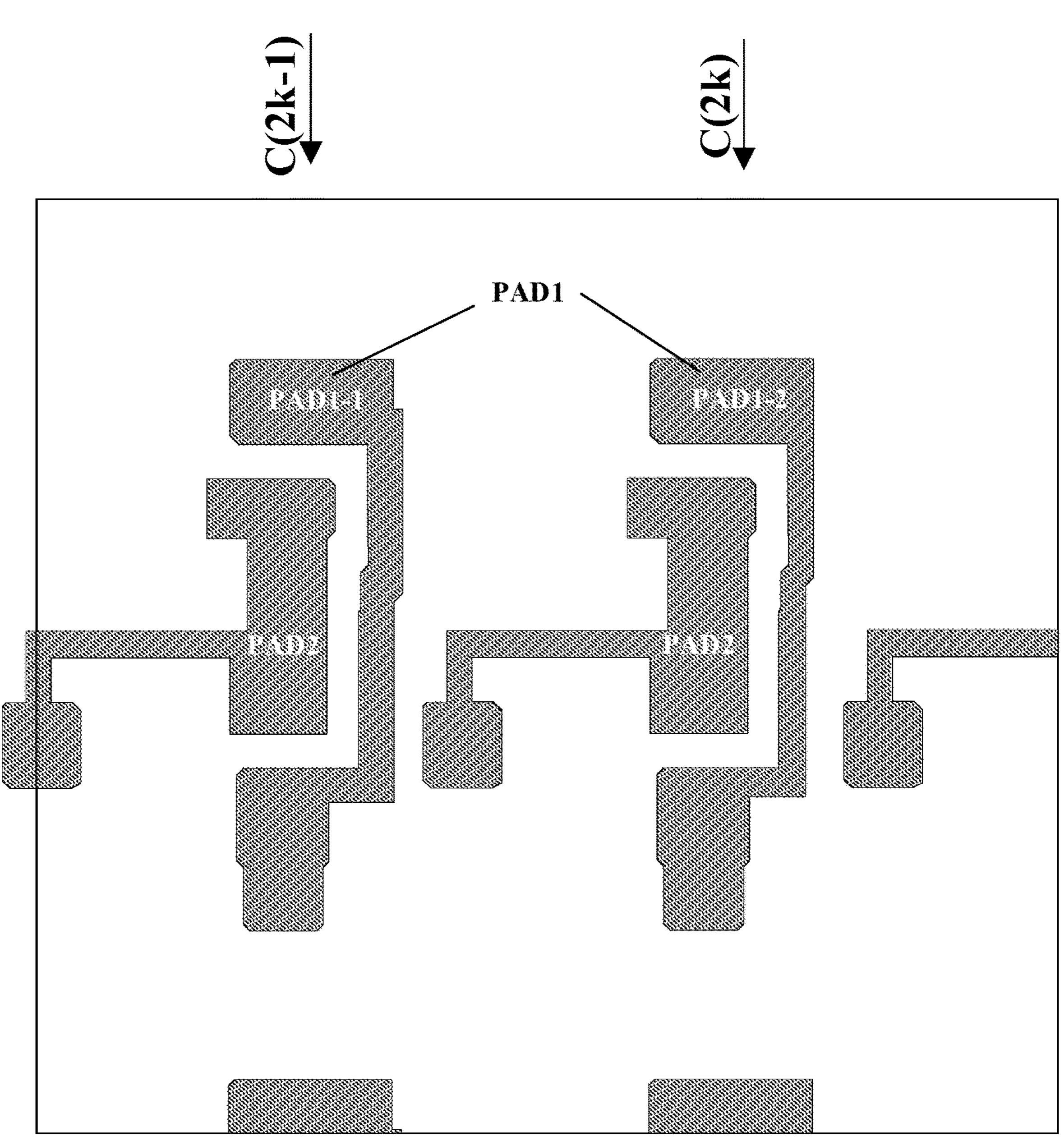
FIG. 3J is a diagram illustrating the structure of a second signal line layer in an array substrate depicted in FIG. 3A.
Figure 3K:
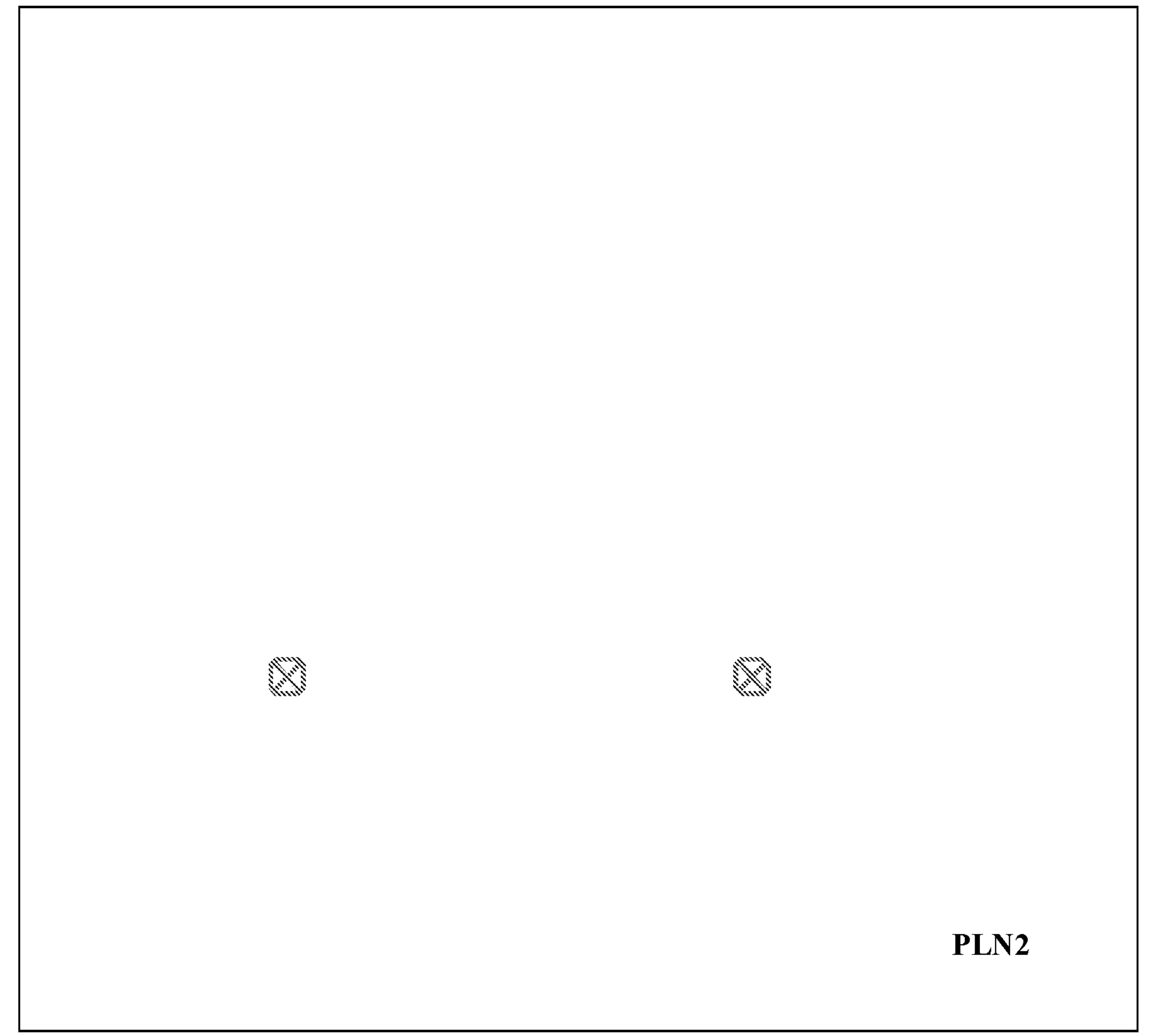
FIG. 3K is a diagram illustrating the structure of a second planarization layer in an array substrate depicted in FIG. 3A.
Figure 3L:
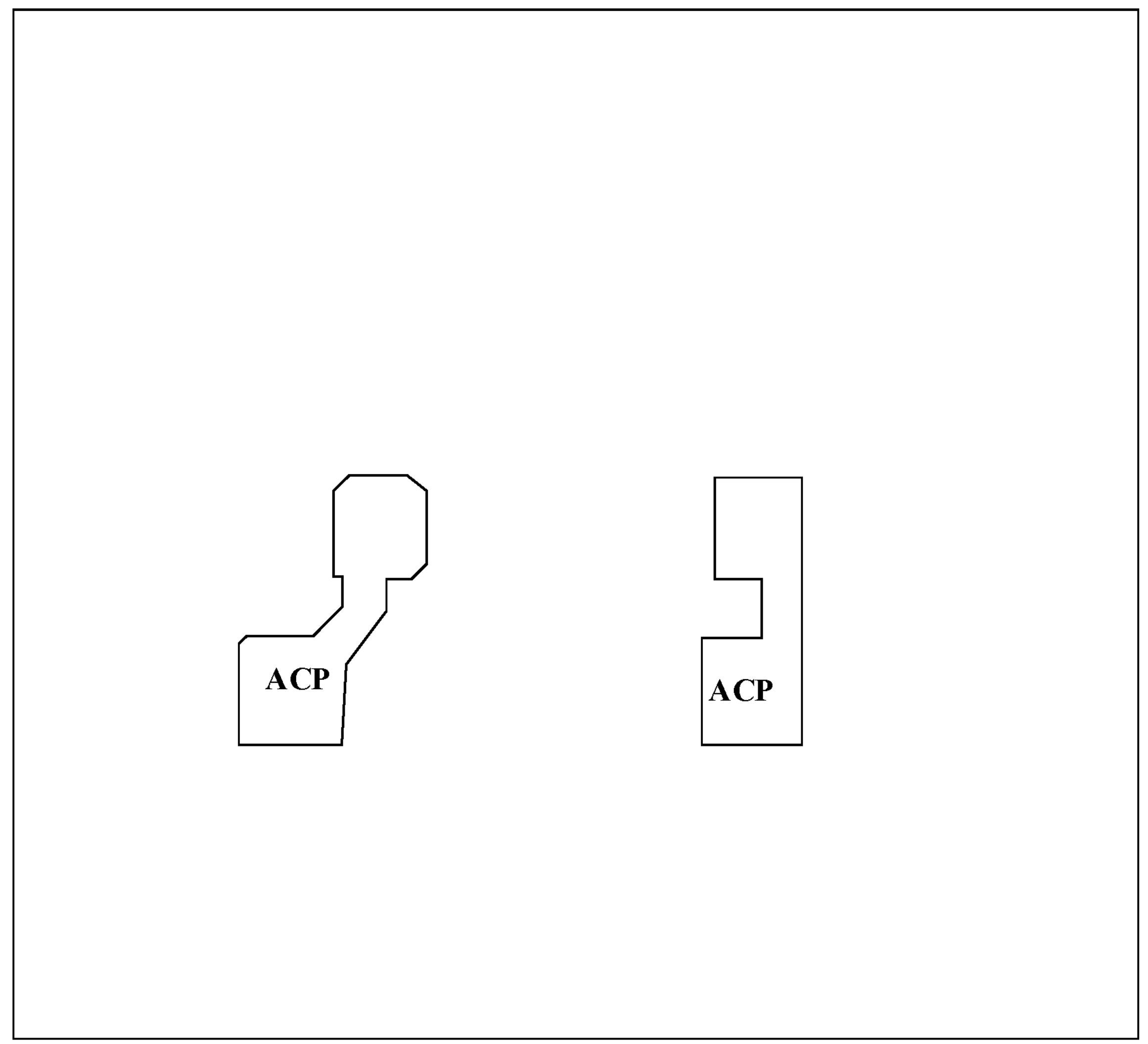
FIG. 3L is a diagram illustrating the structure of an anode connecting pad layer in an array substrate depicted in FIG. 3A.
Figure 3M:
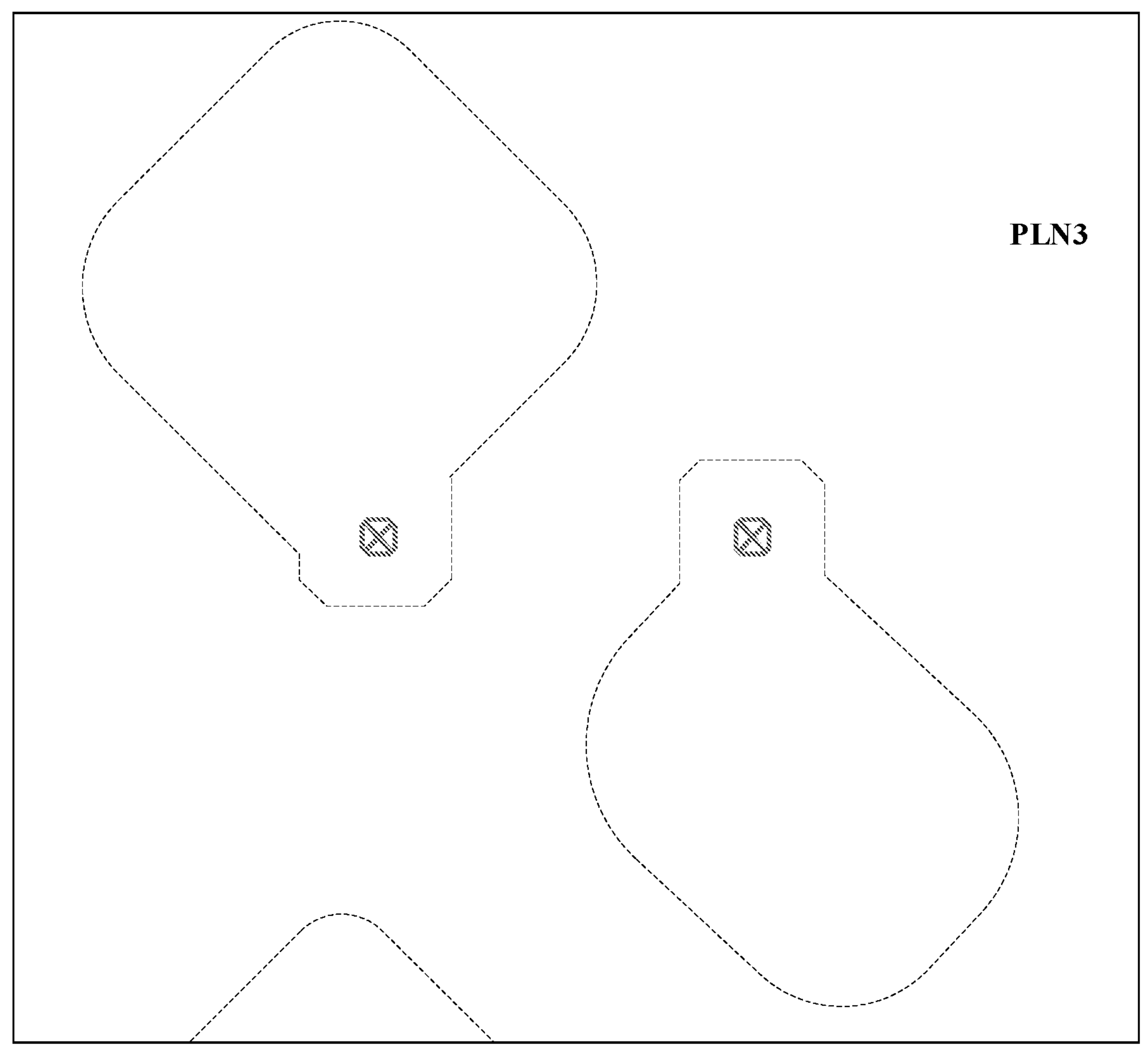
FIG. 3M is a diagram illustrating the structure of a third planarization layer in an array substrate depicted in FIG. 3A.
Figure 3N:
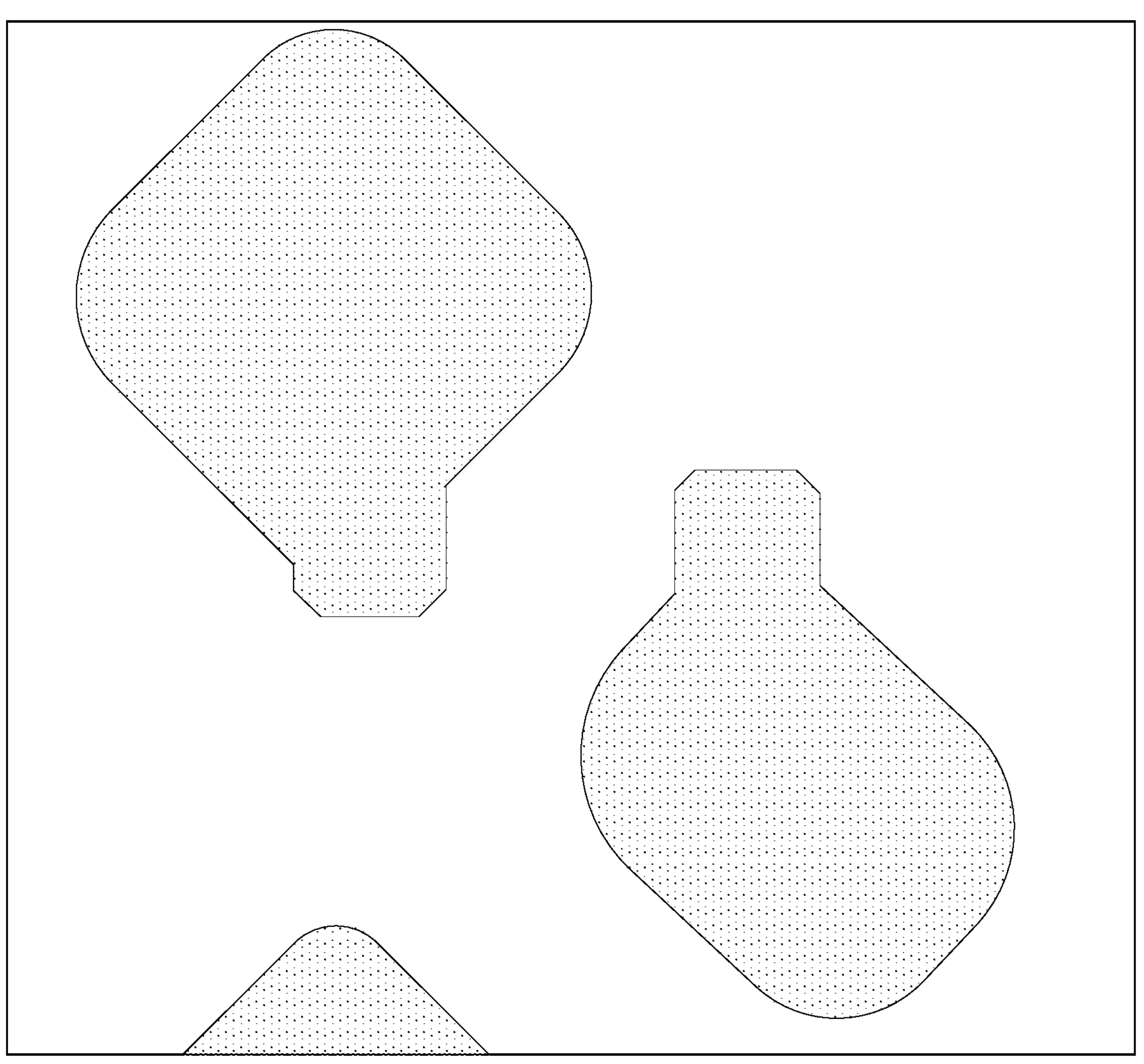
FIG. 3N is a diagram illustrating the structure of an anode layer in an array substrate depicted in FIG. 3A.
Figure 4A:
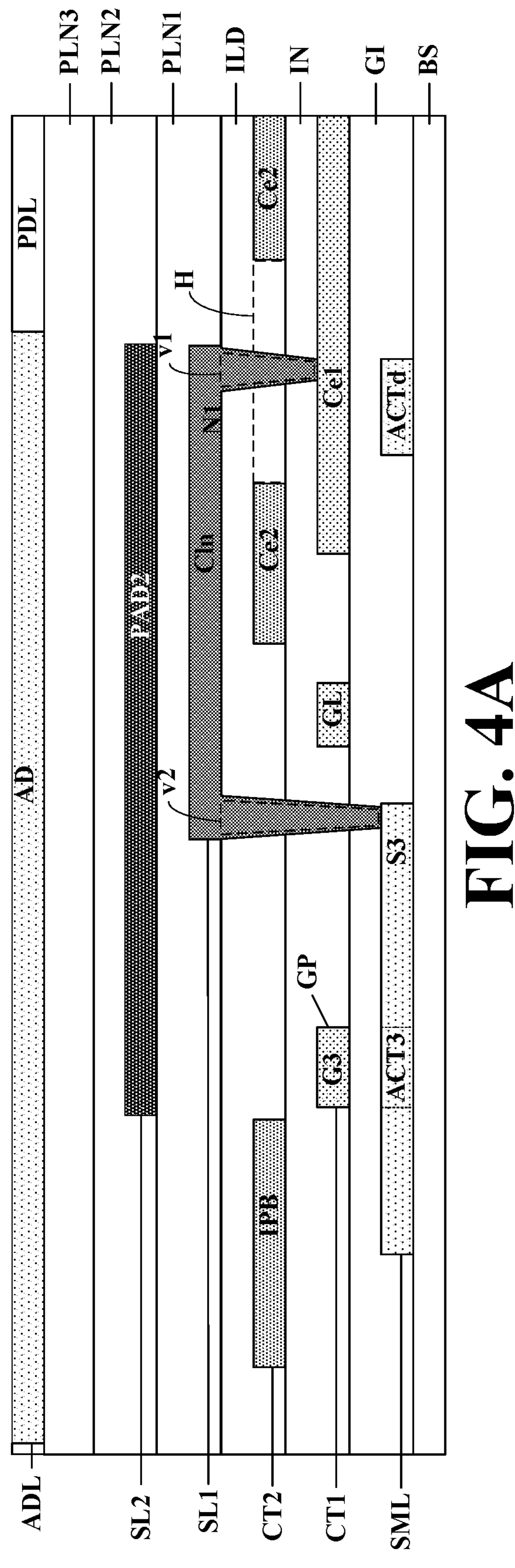
FIG. 4A is a cross-sectional view along an A-A' line in FIG. 3A.
Figure 4B:
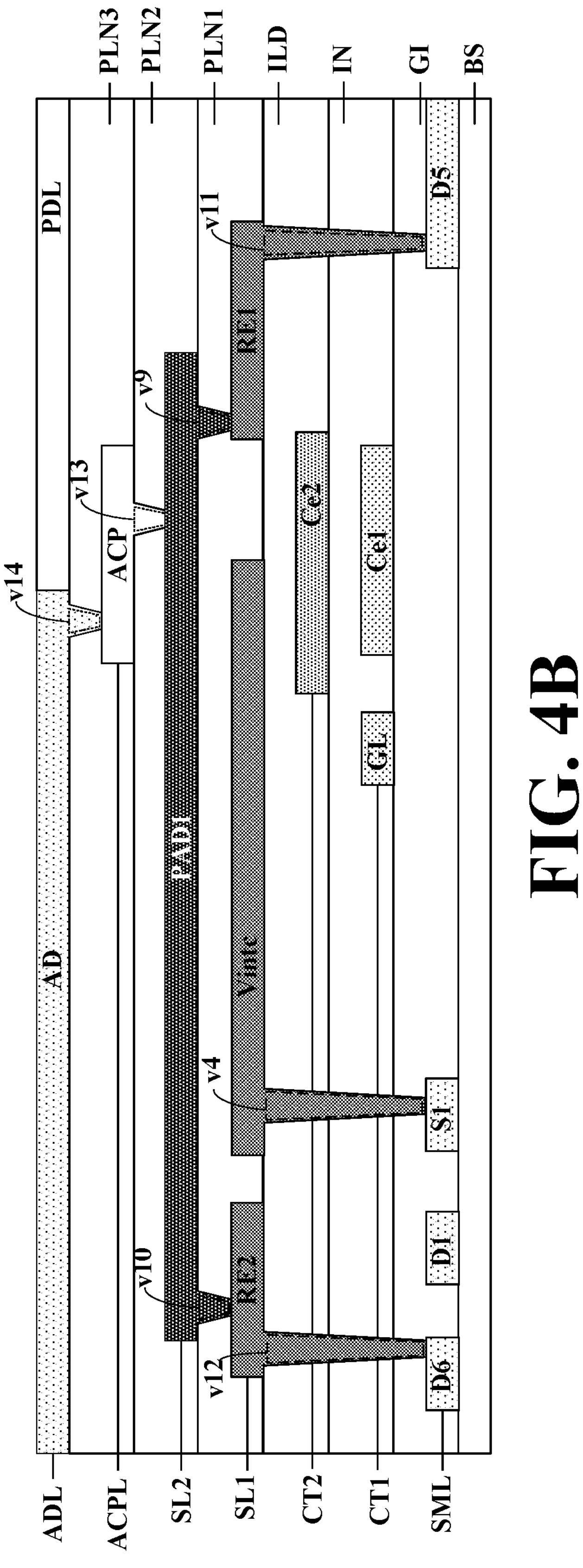
FIG. 4B is a cross-sectional view along a B-B' line in FIG. 3A.
Figure 4C:
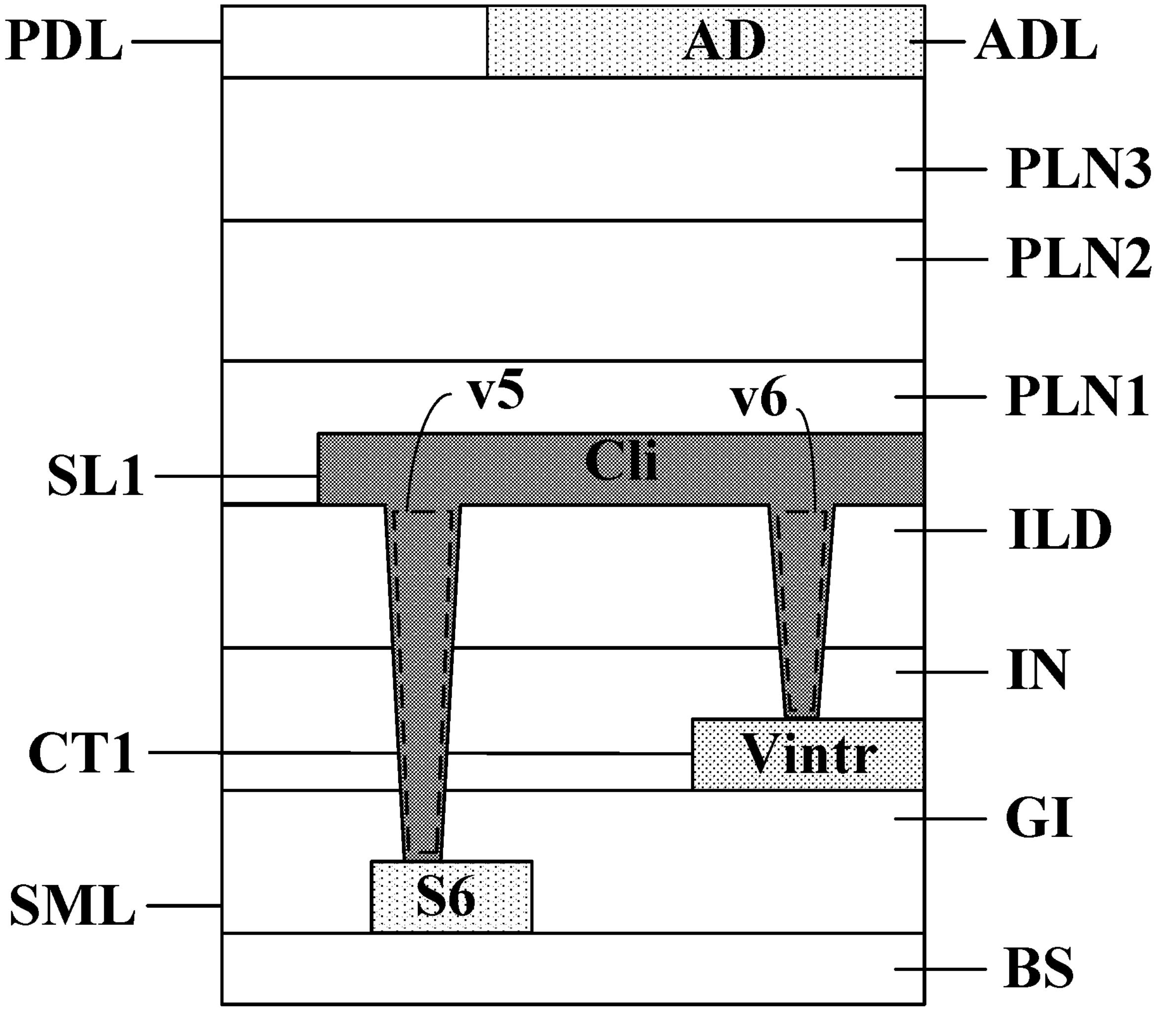
FIG. 4C is a cross-sectional view along a C-C' line in FIG. 3A.
Figure 4D:
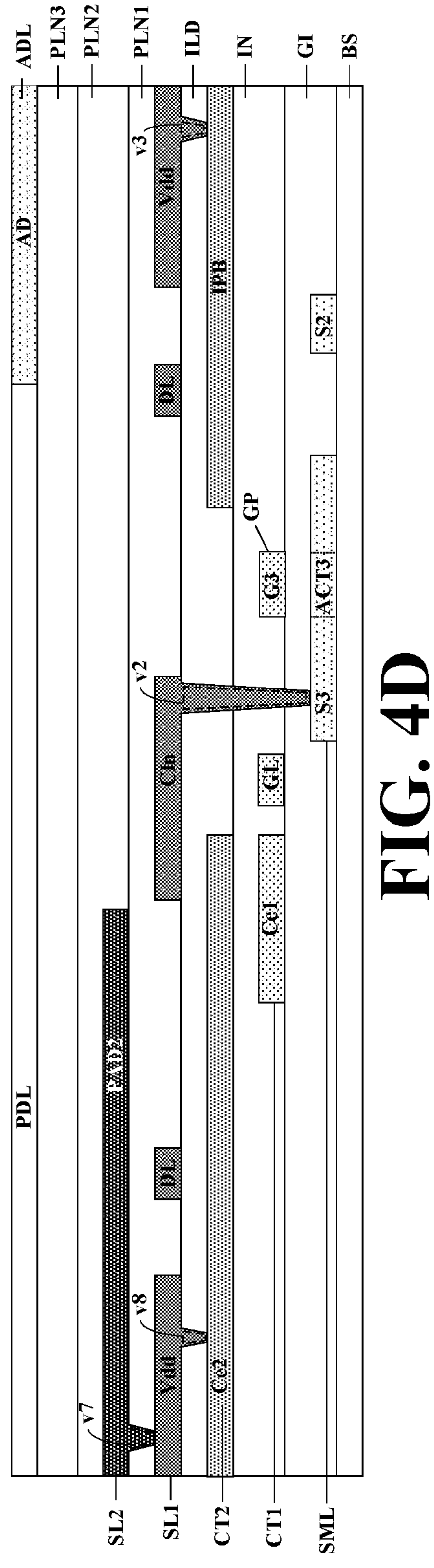
FIG. 4D is a cross-sectional view along a D-D' line in FIG. 3A.

FIG. 3C is a diagram illustrating the structure of a semiconductor material layer in an array substrate depicted in FIG. 3A. FIG. 3D is a diagram illustrating the structure of a first conductive layer in an array substrate depicted in FIG. 3A. FIG. 3E is a diagram illustrating the structure of a second conductive layer in an array substrate depicted in FIG. 3A. FIG. 3F is a diagram illustrating the structure of an insulating layer in an array substrate depicted in FIG. 3A. FIG. 3G is a diagram illustrating the structure of a first signal line layer in an array substrate depicted in FIG. 3A. FIG. 3H is a diagram illustrating the structure of an inter-layer dielectric layer in an array substrate depicted in FIG. 3A. FIG. 3I is a diagram illustrating the structure of a first planarization layer in an array substrate depicted in FIG. 3A. FIG. 3J is a diagram illustrating the structure of a second signal line layer in an array substrate depicted in FIG. 3A. FIG. 3K is a diagram illustrating the structure of a second planarization layer in an array substrate depicted in FIG. 3A. FIG. 3L is a diagram illustrating the structure of an anode connecting pad layer in an array substrate depicted in FIG. 3A. FIG. 3M is a diagram illustrating the structure of a third planarization layer in an array substrate depicted in FIG. 3A. FIG. 3N is a diagram illustrating the structure of an anode layer in an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A.

Referring to FIG. 3A to FIG. 3N, and FIG. 4A to FIG. 4D, in some embodiments, the array substrate includes a base substrate BS, a semiconductor material layer SML on the base substrate BS, a gate insulating layer G1 on a side of the semiconductor material layer SML away from the base substrate BS, a first conductive layer CT1 on a side of the gate insulating layer G1 away from the semiconductor material layer SML, an insulating layer IN on a side of the first conductive layer away from the gate insulating layer G1, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode connecting pad layer ACPL on a side of the second planarization layer PLN2 away from the second signal line layer SL2, a third planarization layer PLN3 on a side of the anode connecting pad layer ACPL away from the second planarization layer PLN2, and an anode layer ADL on a side of the third planarization layer PLN3 away from the anode connecting pad layer ACPL.

Referring to FIG. 2A, FIG. 2B, FIG. 3A, and FIG. 3C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd.

In some embodiments, the active layers (ACT1, ACT2, ACT3, ACT4, ACT5, ACT6, and ACTd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), at least portions of the first electrodes (S1, S2, S3, S4, S5, S6, and Sd), and at least portions of the second electrodes (D1, D2, D3, D4, D5, D6, and Dd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are in a same layer.

In some embodiments, the active layers ACT1, ACT2, ACT3, ACT4, ACT5, and ACTd of the transistors T1, T2, T3, T4, T5, and Td in the respective pixel driving circuit are parts of a first unitary structure. In another example, the active layers ACT1, ACT2, ACT3, ACT4, ACT5, and ACTd, the first electrodes S1, S2, S3, S4, S5, and Sd, and the second electrodes D1, D2, D3, D4, D5, and Dd, of the transistors T1, T2, T3, T4, T5, and Td in the respective pixel driving circuit are parts of a first unitary structure. As shown in FIG. 3C, in some embodiments, the active layer ACT6 of the transistor T6 in the respective pixel driving circuit is spaced apart from the first unitary structure comprising the active layers ACT1, ACT2, ACT3, ACT4, ACT5, and ACTd of the transistors T1, T2, T3, T4, T5, and Td in the respective pixel driving circuit.

In some embodiments, the active layer ACT6, at least a portion of the first electrode S6, and at least a portion of the second electrode D6, of the transistor T6 in the respective pixel driving circuit, are parts of a second unitary structure. Optionally, the active layer ACT6, the first electrode S6, and the second electrode D6, of the transistor T6 in the respective pixel driving circuit, are parts of a second unitary structure. The second unitary structure in the respective pixel driving circuit is spaced apart from the first unitary structure.

As used herein, the active layer refers to a component of the transistor comprising at least a portion of the semiconductor material layer whose orthographic projection on the base substrate overlaps with an orthographic projection of a control electrode on the base substrate. As used herein, a first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Referring to FIG. 2A, FIG. 2B, FIG. 3A, and FIG. 3D, the first conductive layer in some embodiments includes a plurality of gate lines GL, a plurality of reset control signal lines rst, a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of reset control signal lines rst, the plurality of light emitting control signal lines em, and the first capacitor electrode Ce1 are in a same layer.

As used herein, the term “same layer” refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term “same layer” does not always mean that the thickness of the layer or the height of the layer in a cross-sectional view is the same.

In some embodiments, in a respective pixel driving circuit, a respective gate line of the plurality of gate lines GL includes a main portion MP extending along an extension direction of the respective gate line, and a gate protrusion GP protruding away from the main portion MP, e.g., along a direction from the respective gate line of the plurality of gate lines GL in the respective pixel driving circuit toward the respective reset control signal line of the plurality of reset control signal lines rst in the respective pixel driving circuit.

In some embodiments, as discussed above, the third transistor T3 is a double gate transistor. In some embodiments, the gate protrusion GP is one of the double gates G3 in the third transistor T3. In some embodiments, and referring to FIG. 4A, an orthographic projection of the gate protrusion GP on the base substrate BS at least partially overlaps with an orthographic projection of the active layer ACT3 of the third transistor T3 on the base substrate BS.

Referring to FIG. 2A, FIG. 2B, FIG. 3A, and FIG. 3E, the second conductive layer in some embodiments includes a plurality of first reset signal lines Vintr, an interference preventing block IPB and a second capacitor electrode Ce2 of the storage capacitor Cst. The interference preventing block IPB can effectively reduce the cross-talk, particularly vertical cross-talk between the N1 node and the adjacent data lines. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines Vintr, the second capacitor electrode Ce2, and the interference preventing block IPB are in a same layer.

Vias extending through the insulating layer IN are depicted in FIG. 3F.

Referring to FIG. 2A, FIG. 2B, FIG. 3A, and FIG. 3G, the first signal line layer in some embodiments includes a plurality of voltage supply lines Vdd, a node connecting line Cln, an initialization connecting line Cli, a first relay electrode RE1, a second relay electrode RE2, a plurality of second reset signal lines Vintc, and a plurality of data lines DL. The node connecting line Cln connects the first capacitor electrode Ce1 and the first electrode of the third transistor T3 in a respective pixel driving circuit together. Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the node connecting line Cln, the initialization connecting line Cli, the first relay electrode RE1, the second relay electrode RE2, the plurality of second reset signal lines Vintc, and the plurality of data lines DL are in a same layer.

Vias extending through the inter-layer dielectric layer ILD are depicted in FIG. 3H.

Vias extending through the first planarization layer PLN1 are depicted in FIG. 3I.

Referring to Referring to FIG. 2A, FIG. 2B, FIG. 3A, and FIG. 3J, the second signal line layer in some embodiments includes a first pad PAD1 and a second PAD2 in a respective pixel driving circuit. The first pad PAD1 is configured to provide a parasitic capacitance at the fourth node N4. As shown in FIG. 2A and FIG. 2B, the fourth node N4 is connected to the second electrode of the fifth transistor T5, the second electrode of the sixth transistor T6, and the anode of the light emitting element LE. The first pad PAD1 is connected to the second electrode of the fifth transistor T5, the second electrode of the sixth transistor T6, and the anode of the light emitting element LE. Specifically, the second signal line layer in some embodiments includes K number of columns of first pads, a respective first pad in a respective pixel driving circuit. The K number of columns of first pads include a plurality of first-first pads PAD1-1 in (2k−1)-th columns C(2k−1) of the K columns and a plurality of second-first pads PAD1-2 in (2k)-th columns C(2k) of the K columns. The second pad PAD2 is configured to reduce cross-talk between the first node N1 and an adjacent first pad. The second pad PAD2 is connected to a respective voltage supply line of the plurality of voltage supply lines Vdd in an adjacent pixel driving circuit (e.g., a pixel driving circuit on the left) through a via extending through the first planarization layer PLN1. Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, a first pad PAD1 (e.g., the plurality of first-first pads PAD1-1 in the (2k−1)-th columns C(2k−1) of the K columns and the plurality of second-first pads PAD1-2 in the (2k)-th columns C(2k) of the K columns) and a second PAD2 are in a same layer.

Vias extending through the second planarization layer PLN2 are depicted in FIG. 3K.

Referring to Referring to FIG. 2A, FIG. 2B, FIG. 3A, and FIG. 3L, the anode connecting pad layer in some embodiments includes an anode connecting pad ACP in a respective pixel driving circuit. The anode connecting pad ACP connects an anode of a light emitting element in the respective pixel driving circuit to a first pad PAD1 in the respective pixel driving circuit. Various appropriate conductive materials and various appropriate fabricating methods may be used to make the anode connecting pad layer. For example, a conductive material may be deposited on the substrate by a plasma-enhanced chemical vapor deposition (PECVD) process and patterned. Examples of appropriate conductive materials for making the anode connecting pad layer include, but are not limited to, metal oxide materials such as indium tin oxide, and metallic materials such as aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Vias extending through the third planarization layer PLN3 are depicted in FIG. 3M. In FIG. 3M, corresponding positions of a plurality of anodes are depicted in dotted lines.

Referring to FIG. 2A, FIG. 2B, FIG. 3A, and FIG. 3N, the array substrate further includes an anode layer. A respective anode is connected to an anode connecting pad through a respective via extending through the third planarization layer PLN3.

Referring to FIG. 2A, FIG. 2B, FIG. 3A, FIG. 3D, FIG. 3E, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer G1. Optionally, the node connecting line Cln is connected to the first capacitor electrode Ce1 through the first via v1, and is connected node connecting line Cln is connected the semiconductor material layer SML through the second via v2. Optionally, the node connecting line Cln is connected to the first electrode S3 of third transistor, as depicted in FIG. 4A.

Referring to Referring to FIG. 2A, FIG. 2B, FIG. 3A, FIG. 3E, and FIG. 4D, in some embodiments, the interference preventing block IPB is in a same layer as the second capacitor electrode Ce2. A respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS.

Figure 5A:
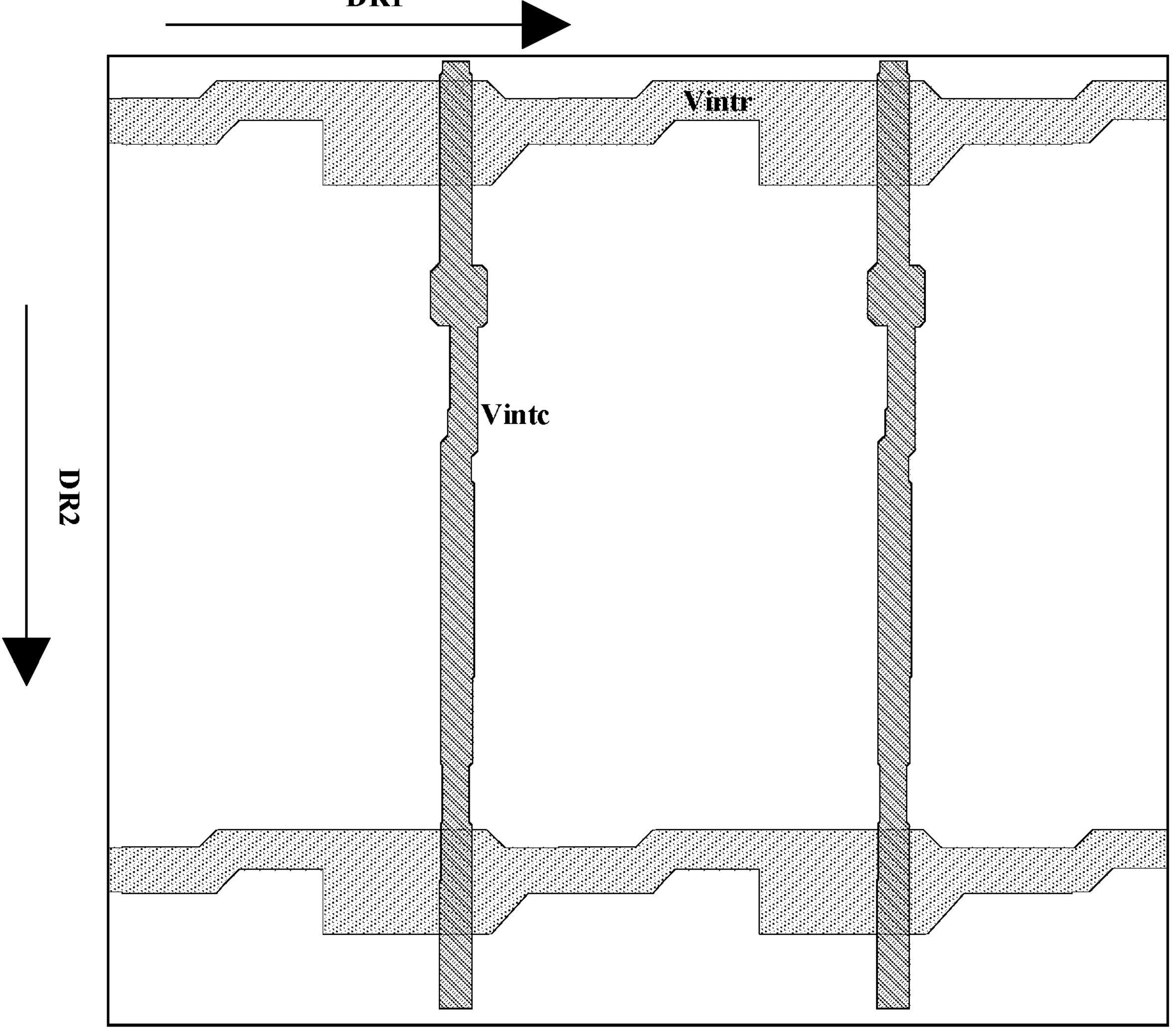
FIG. 5A illustrates a network of reset signal lines in an array substrate depicted in FIG. 3A

FIG. 5A illustrates a network of reset signal lines in an array substrate depicted in FIG. 3A. Referring to FIG. 5A and FIG. 3A, the network of reset signal lines in the array substrate includes a plurality of first reset signal lines Vintr extending along a first direction DR1, respectively; and a plurality of second reset signal lines Vintc extending along a second direction DR2. A respective first reset signal line crosses over multiple second reset signal lines. A respective second reset signal line crosses over multiple first reset signal lines. The respective first reset signal line is not connected to the multiple second reset signal lines where the respective first reset signal line crosses over the multiple second reset signal lines. The respective second reset signal line is not connected to the multiple first reset signal lines where the respective second reset signal line crosses over the multiple first reset signal lines. Optionally, an orthographic projection of the plurality of second reset signal lines Vinte on a base substrate is non-overlapping with an orthographic projection of a plurality of data lines DL on the base substrate.

Referring to FIG. 2A, FIG. 2B, FIG. 3A, and FIG. 4B, a respective second reset signal line of the plurality of second reset signal lines Vinte is connected to the first electrode S1 of the first transistor T1 through a fourth via v4 extending through the inter-layer dielectric layer ILD, the insulating layer IN, and the gate insulating layer G1, thereby providing an initialization signal to the first electrode S1 of the first transistor T1.

Referring to FIG. 2A, FIG. 2B, FIG. 3A, FIG. 3G, and FIG. 4C, the initialization connecting line Cli is connected to the first electrode S6 of the sixth transistor T6 through a fifth via v5 extending through the inter-layer dielectric layer ILD, the insulating layer IN, and the gate insulating layer GI; and is connected to a respective first reset signal line of the plurality of first reset signal lines Vintr through a sixth via v6 extending through the inter-layer dielectric layer ILD and the insulating layer IN; thereby providing an initialization signal to the first electrode S6 of the sixth transistor T6.

Figure 5B:
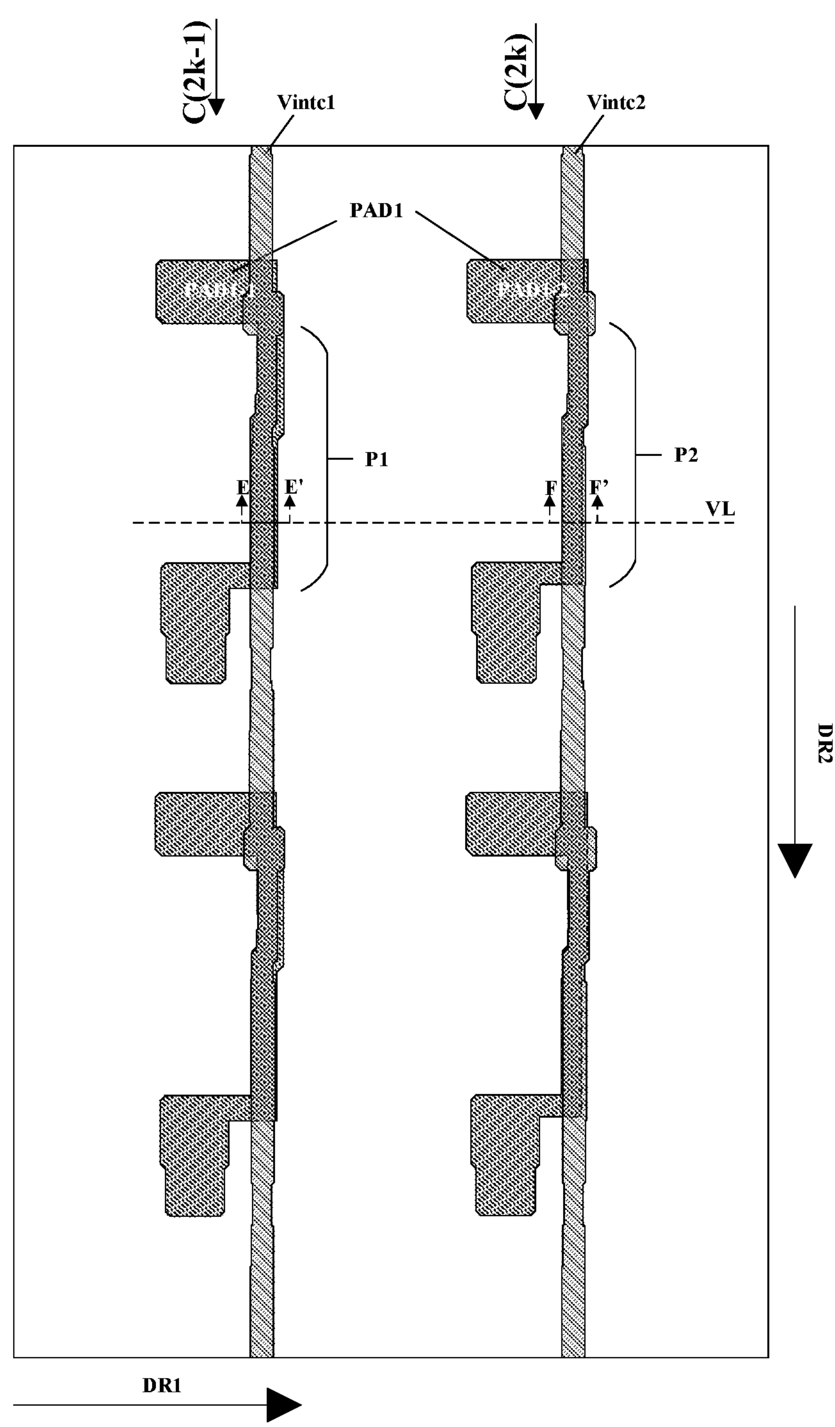
FIG. 5B illustrates the structure of first pads and second reset signal lines in an array substrate depicted in FIG. 3A.
Figure 5C:
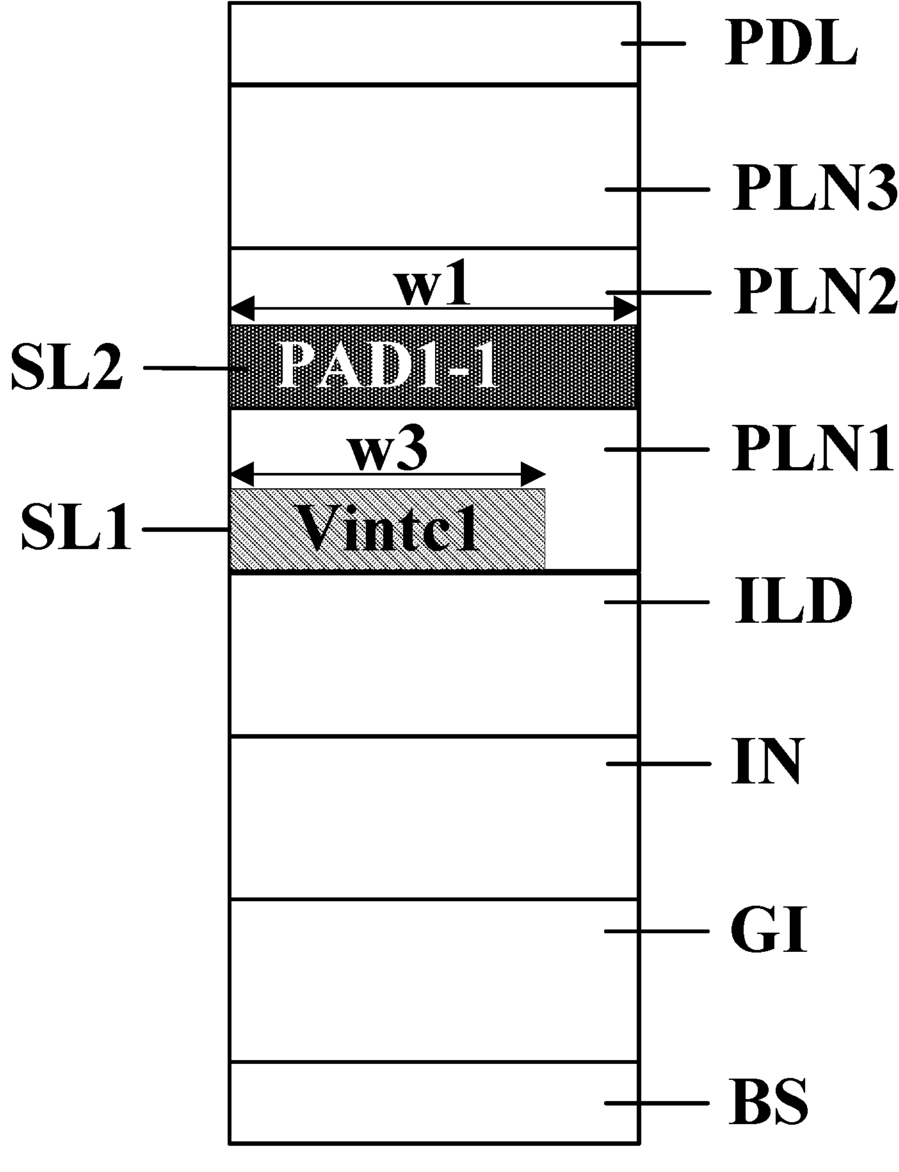
FIG. 5C is a cross-sectional view along a E-E' line in FIG. 5B.
Figure 5D:
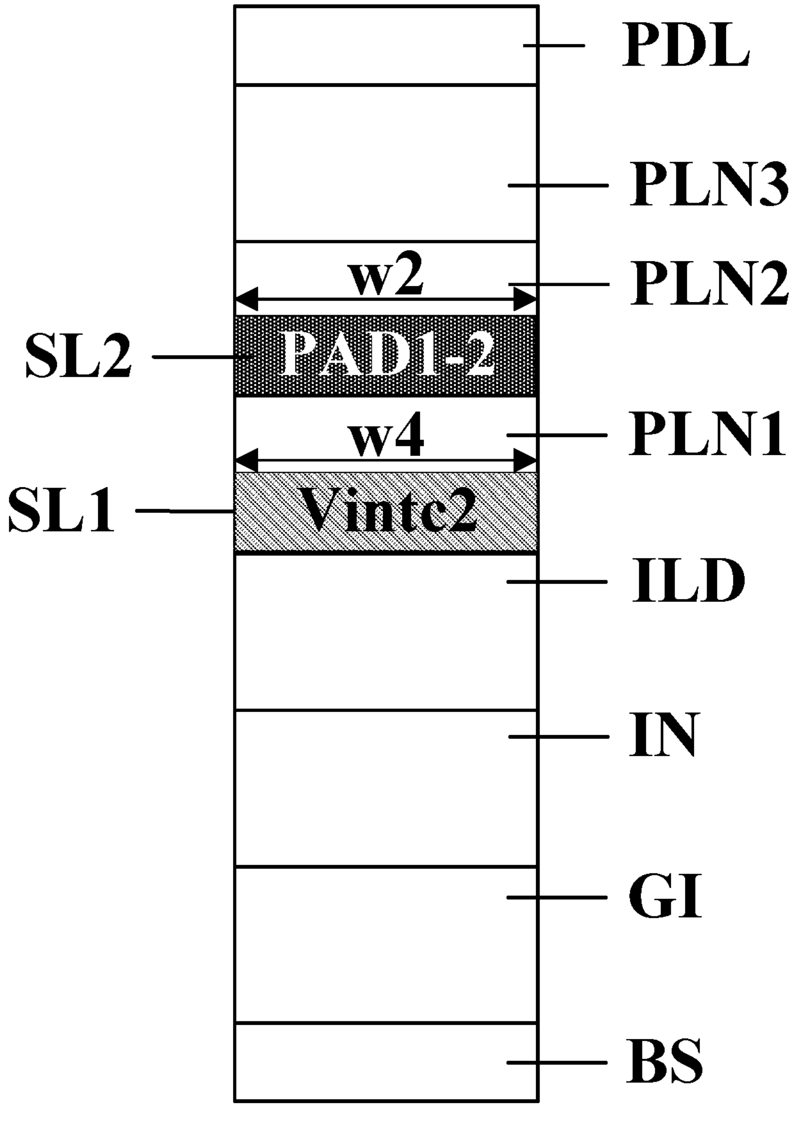
FIG. 5D is a cross-sectional view along an F-F' line in FIG. 5B.
Figures 5E, 5F:
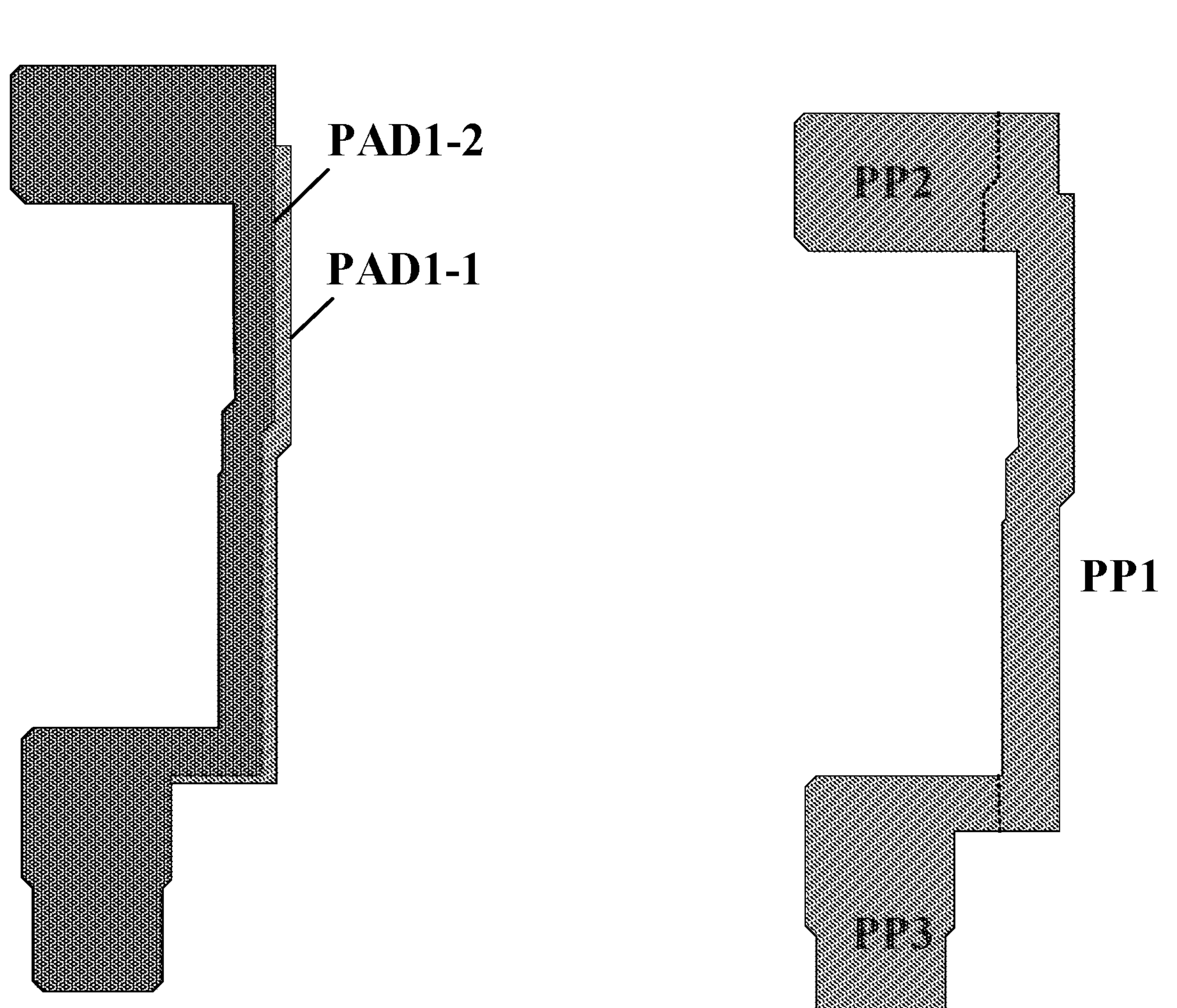
FIG. 5E is a schematic diagram illustrating a superimposition of a respective first-first pad and a respective second-first pad.
FIG. 5F illustrates the structure of a first pad in some embodiments according to the present disclosure.

FIG. 5B illustrates the structure of first pads and second reset signal lines in an array substrate depicted in FIG. 3A. FIG. 5C is a cross-sectional view along a E-E' line in FIG. 5B. FIG. 5D is a cross-sectional view along an F-F' line in FIG. 5B. FIG. 5E is a schematic diagram illustrating a superimposition of a respective first-first pad and a respective second-first pad. Referring to Referring to FIG. 2A, FIG. 2B, FIG. 3A, FIG. 3J, FIG. 4B, and FIG. 5A to FIG. 5E, the first pad PAD1 is configured to provide a parasitic capacitance at the fourth node N4. In one example, the parasitic capacitance at the fourth node N4 is formed between the first pad PAD1 and the respective first reset signal line of the plurality of first reset signal lines Vintr. An orthographic projection of the first pad PAD1 on a base substrate BS at least partially overlaps with an orthographic projection of the respective first reset signal line on the base substrate BS. The first pad PAD1 is connected to the second electrode of the fifth transistor T5, the second electrode of the sixth transistor T6, and the anode of the light emitting element LE.

In some embodiments, the first pad PAD1 crosses over a respective gate line of the plurality of gate lines GL. Optionally, an orthographic projection of the first pad PAD1 on the base substrate BS at least partially overlaps with an orthographic projection of a respective reset control signal line of the plurality of reset control signal lines rst on the base substrate BS. Optionally, the orthographic projection of the first pad PAD1 on the base substrate BS at least partially overlaps with an orthographic projection of a respective light emitting control signal line of the plurality of light emitting control signal lines em on the base substrate BS. In one example, the orthographic projection of the first pad PAD1 on the base substrate BS at least partially overlaps with the orthographic projection of the respective reset control signal line of the plurality of reset control signal lines rst on the base substrate BS, and at least partially overlaps with the orthographic projection of a respective light emitting control signal line of the plurality of light emitting control signal lines em on the base substrate BS.

In some embodiments, the array substrate includes K number of columns of first pads, a respective first pad in a respective pixel driving circuit. The K number of columns of first pads include a plurality of first-first pads PAD1-1 in (2k−1)-th columns C(2k−1)) of the K columns and a plurality of second-first pads PAD1-2 in (2k)-th columns C(2k) of the K columns. The plurality of second reset signal lines Vinte include multiple third reset signal lines Vintc1 and multiple fourth reset signal lines Vintc2 alternately arranged. The multiple third reset signal lines Vintc1 are in the (2k−1)-th columns C(2k−1)) of the K columns and the multiple fourth reset signal lines Vintc2 are in the (2k)-th columns C(2k) of the K columns. Optionally, the multiple third reset signal lines Vintc1 and the multiple fourth reset signal lines Vintc2 are parallel to each other.

In some embodiments, a first parasitic capacitance between a respective first-first pad and a respective third reset signal line Vintc1 in the (2k−1)-th columns C(2k−1)) of the K columns is different from a second parasitic capacitance between a respective second-first pad and a respective fourth reset signal line Vintc2 in the (2k)-th columns C(2k) of the K columns. Optionally, the first parasitic capacitance is greater than the second parasitic capacitance.

Optionally, the first parasitic capacitance is greater than the second parasitic capacitance by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first parasitic capacitance is greater than the second parasitic capacitance by 20%.

In some embodiments, orthographic projections of the respective first-first pad and the respective third reset signal line Vintc1 in the (2k−1)-th columns C(2k−1)) of the K columns overlap with each other in a first overlapping region having a first area, orthographic projections of the respective second-first pad and the respective fourth reset signal line Vintc2 in the (2k)-th columns C(2k) of the K columns overlap with each other in a second overlapping region having a second area, wherein the first area and the second area are different from each other. Optionally, the first area is greater than the second area.

Optionally, the first area is greater than the second area by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first area is greater than the second area by 20%.

In some embodiments, referring to FIG. 5B to FIG. 5E, a first portion P1 of the respective first-first pad in the first overlapping region has a first width w1 along a first direction DR1, a second portion P2 of the respective second-first pad in the second overlapping region has a second width w2 along the first direction DR1, the first width w1 and the second width w2 being different from each other, wherein a virtual line (e.g., a virtual line VL crossing over the E-E' line and the F-F' line in FIG. 5B) along the first direction DR1 crosses over the first portion P1 and the second portion P2. The first direction DR1 is perpendicular to extension direction of the respective third reset signal line Vintc1 and the respective fourth reset signal line Vintc2. Optionally, the first portion P1 is an elongated portion of the respective first-first pad in the first overlapping region, a longitudinal direction of which is parallel to the second direction DR2. Optionally, the second portion P2 is an elongated portion of the respective second-first pad in the second overlapping region, a longitudinal direction of which is parallel to the second direction DR2.

In some embodiments, the first width w1 is greater than the second width w2. Optionally, the first width w1 is greater than the second width w2 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first width w1 is greater than the second width w2 by 20%.

Optionally, the first width w1 is greater than the second width w2 by at least 0.05 μm, e.g., by at least 0.1 μm, by at least 0.15 μm, by at least 0.2 μm, by at least 0.25 μm, by at least 0.3 μm, by at least 0.35 μm, by at least 0.4 μm, by at least 0.45 μm, by at least 0.5 μm, by at least 0.55 μm, by at least 0.6 μm, by at least 0.65 μm, by at least 0.7 μm, by at least 0.75 μm, by at least 0.8 μm, by at least 0.85 μm, by at least 0.9 μm, by at least 0.95 μm, or by at least 1 μm. Optionally, the first width w1 is greater than the second width w2 by 0.4 μm. In one example, the first width w1 is 2.4 μm, the second width w2 is 2.0 μm.

In some embodiments, referring to FIG. 5B to FIG. 5E, along the virtual line VL, the respective third reset signal line Vintc1 has a third width w3 along the first direction DR1, and the respective fourth reset signal line Vintc2 has a fourth width w4 along the first direction DR1, the third width w3 being substantially the same as the fourth width w4. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Optionally, the second width w2 is substantially the same as the third width w3. Optionally, the second width w2 is substantially the same as the fourth width w4.

In some embodiments, the first width w1 is greater than the third width w3. Optionally, the first width w1 is greater than the third width w3 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first width w1 is greater than the third width w3 by 20%.

In some embodiments, the first width w1 is greater than the fourth width w4. Optionally, the first width w1 is greater than the fourth width w4 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first width w1 is greater than the fourth width w4 by 20%.

In some embodiments, the first portion P1 of the respective first-first pad in the first overlapping region has a first average width aw1 along the first direction DR1, the second portion P2 of the respective second-first pad in the second overlapping region has a second average width aw2 along the first direction DR1, the first average width aw1 and the second average width aw2 being different from each other.

In some embodiments, the first average width aw1 is greater than the second average width aw2. Optionally, the first average width aw1 is greater than the second average width aw2 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first average width aw1 is greater than the second average width aw2 by 20%.

Optionally, the first average width aw1 is greater than the second average width aw2 by at least 0.05 μm, e.g., by at least 0.1 μm, by at least 0.15 μm, by at least 0.2 μm, by at least 0.25 μm, by at least 0.3 μm, by at least 0.35 μm, by at least 0.4 μm, by at least 0.45 μm, by at least 0.5 μm, by at least 0.55 μm, by at least 0.6 μm, by at least 0.65 μm, by at least 0.7 μm, by at least 0.75 μm, by at least 0.8 μm, by at least 0.85 μm, by at least 0.9 μm, by at least 0.95 μm, or by at least 1 μm. Optionally, the first average width aw1 is greater than the second average width aw2 by 0.4 μm. In one example, the first average width aw1 is 2.4 μm, the second average width aw2 is 2.0 μm.

In some embodiments, the respective third reset signal line Vintc1 has a third average width aw3 along the first direction DR1, and the respective fourth reset signal line Vintc2 has a fourth average width aw4 along the first direction DR1, the third average width aw3 being substantially the same as the fourth average width aw4.

Optionally, the second average width aw2 is substantially the same as the third average width aw3. Optionally, the second average width aw2 is substantially the same as the fourth average width aw4.

In some embodiments, the first average width aw1 is greater than the third average width w3. Optionally, the first average width aw1 is greater than the third average width aw3 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first average width aw1 is greater than the third average width aw3 by 20%.

In some embodiments, the first average width aw1 is greater than the fourth average width aw4. Optionally, the first average width aw1 is greater than the fourth average width aw4 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first average width aw1 is greater than the fourth average width aw4 by 20%.

In some embodiments, a ratio of a total number of the multiple third reset signal lines Vintc1 to a total number of the plurality of first-first pads PAD1-1 is the same as a ratio of a total number of the multiple fourth reset signal lines Vintc2 to a total number of the plurality of second-first pads PAD1-2.

FIG. 5F illustrates the structure of first pad in some embodiments according to the present disclosure. Referring to FIG. 5B and FIG. 5F, the first pad in some embodiments includes a first pad part PP1, a second pad part PP2, and a third pad part PP3, the first pad part PP1 connecting the second pad part PP2 to the third pad part PP3. The second pad part PP2 and the third pad part PP3 extend from the first pad part PP1 to a same side (e.g., to the left side). An orthographic projection of the first pad part PP1 on the base substrate at least partially overlaps with an orthographic projection of the respective first reset signal line on the base substrate. An orthographic projection of the second pad part PP2 on the base substrate is at least partially non-overlapping with the orthographic projection of the respective first reset signal line on the base substrate, e.g., the orthographic projection of the second pad part PP2 on the base substrate is completely non-overlapping with the orthographic projection of the respective first reset signal line on the base substrate. An orthographic projection of the third pad part PP3 on the base substrate is at least partially non-overlapping with the orthographic projection of the respective first reset signal line on the base substrate, e.g., the orthographic projection of the third pad part PP3 on the base substrate is completely non-overlapping with the orthographic projection of the respective first reset signal line on the base substrate.

In some embodiments, the pixel driving circuits in the (2k−1)-th columns C(2k−1)) of the K columns are pixel driving circuits for driving light emission of subpixels of a first color and subpixels of a second color; the pixel driving circuits in the (2k)-th columns C(2k) of the K columns are pixel driving circuits for driving light emission of subpixels of a third color. In one example, the first color is red, the second color is blue, and the third color is green.

In related array substrates, typically it takes a longer time for green subpixels to light up as compared to red subpixels and blue subpixels, particularly when displaying images of lower grayscales, resulting in red trailing defects in the related array substrates. In the present array substrate, the parasitic capacitance at the fourth node N4 for the pixel driving circuits in the (2k−1)-th columns C(2k−1)) of the K columns is greater than the parasitic capacitance at the fourth node N4 for the pixel driving circuits in the (2k)-th columns C(2k) of the K columns. Accordingly, the higher parasitic capacitance at the fourth node N4 decreases the light-up speed in the red subpixels and blue subpixels, as compared to the green subpixels. The inventors of the present disclosure, surprisingly and unexpectedly, discover that the intricate structure of the present array substrate achieves a similar light-up speed in green subpixels, red subpixels, and blue subpixels, obviating the issue of red trailing defects in the related array substrates.

Figure 6A:
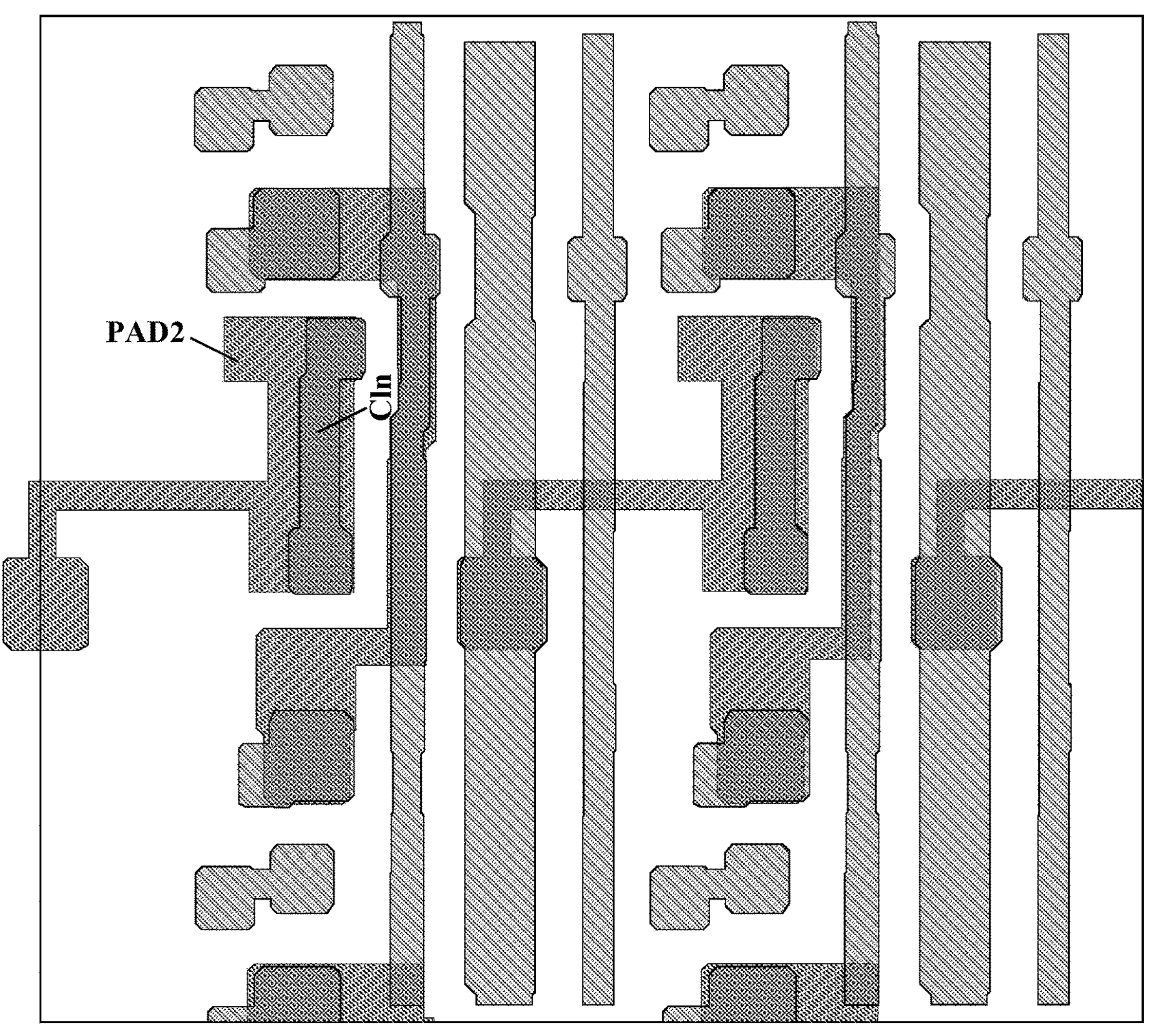
FIG. 6A illustrates the structure of a first signal line layer and a second signal line layer in some embodiments according to the present disclosure.

As discussed previously, the second pad PAD2 is configured to reduce cross-talk between the first node N1 and an adjacent first pad. Referring to FIG. 4D, the second pad PAD2 is connected to a respective voltage supply line of the plurality of voltage supply lines Vdd in an adjacent pixel driving circuit through a seventh via v7 extending through the first planarization layer PLN1. The respective voltage supply line of the plurality of voltage supply lines Vdd is connected to the second capacitor electrode Ce2 through an eighth via v8 extending through the inter-layer dielectric layer ILD. FIG. 6A illustrates the structure of a first signal line layer and a second signal line layer in some embodiments according to the present disclosure. As shown in FIG. 6A and FIG. 4A, in some embodiments, an orthographic projection of the second pad PAD2 in a respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the node connecting line Cln in the respective pixel driving circuit on the base substrate BS. In some embodiments, the orthographic projection of the second pad PAD2 in the respective pixel driving circuit on the base substrate BS at least partially overlaps with an orthographic projection of the active layer ACT3 of the third transistor T3 on the base substrate BS. In some embodiments, the orthographic projection of the second pad PAD2 in the respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the gate protrusion GP of a respective gate line of the plurality of gate lines GL on the base substrate BS.

Figure 6B:
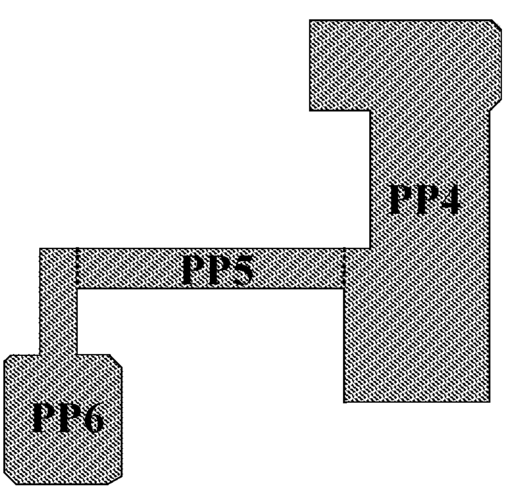
FIG. 6B illustrates the structure of a second pad in some embodiments according to the present disclosure.

FIG. 6B illustrates the structure of a second pad in some embodiments according to the present disclosure. Referring to FIG. 6B, the second pad in some embodiments includes a fourth pad part PP4, a fifth pad part PP5, and a sixth pad part PP6. The fifth pad part PP5 connects the fourth pad part PP4 to the sixth pad part PP6. Referring to FIG. 3A, FIG. 4D, FIG. 6A, and FIG. 6B, an orthographic projection of the fourth pad part PP4 on the base substrate BS at least partially overlaps with the orthographic projection of the node connecting line Cln in the respective pixel driving circuit on the base substrate BS, and at least partially overlaps with the orthographic projection of the gate protrusion GP of the respective gate line of the plurality of gate lines GL on the base substrate BS. An orthographic projection of the sixth pad part PP6 on the base substrate BS at least partially overlaps with an orthographic projection of a respective voltage supply line of the plurality of voltage supply lines Vdd in an adjacent pixel driving circuit on the base substrate BS. The fifth pad part PP5 crosses over a respective data line of the plurality of data lines DL in the adjacent pixel driving circuit. The adjacent pixel driving circuit and the respective pixel driving circuit are in a same row along the first direction DR1.

Referring to FIG. 3A and FIG. 4B, the first pad PAD1 is connected to a first relay electrode RE1 in the first signal line layer SL1 through a ninth via v9 extending through the first planarization layer PLN1, and is connected to a second relay electrode RE2 in the first signal line layer SL1 through a tenth via v10 extending through the first planarization layer PLN1. The first relay electrode RE1 is connected to the second electrode D5 of the fifth transistor T5 through an eleventh via v11 extending through the inter-layer dielectric layer ILD, the insulating layer IN, and the gate insulating layer GI. The second relay electrode RE2 is connected to the second electrode D6 of the sixth transistor T6 through a twelfth via v12 extending through the inter-layer dielectric layer ILD, the insulating layer IN, and the gate insulating layer GI. The anode connecting pad ACP is connected to the first pad PAD1 through a thirteenth via v13 extending through the second planarization layer PLN2. The anode AD is connected to the anode connecting pad ACP through a fourteenth via v14 extending through a third planarization layer PLN3.

Figure 7:
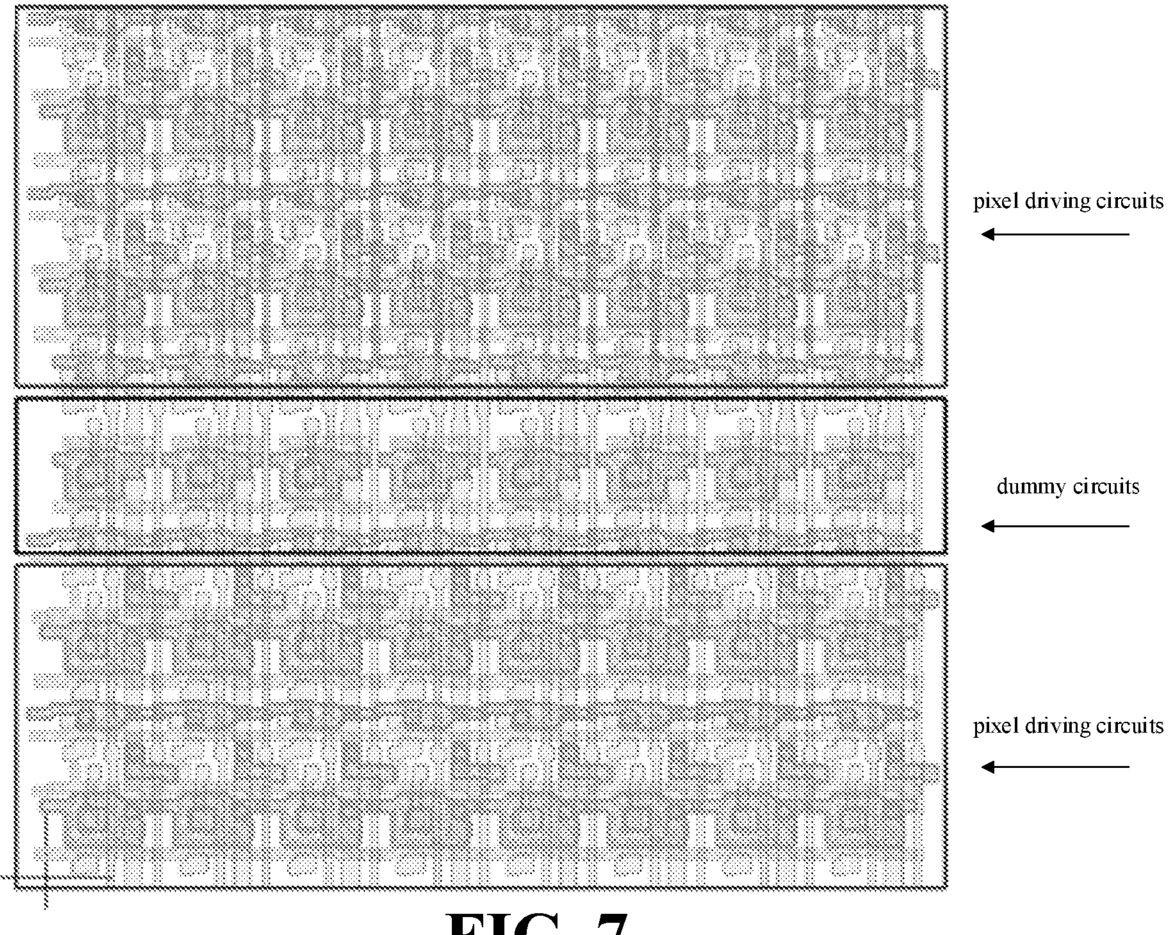
FIG. 7 is a plan view of an array substrate in some embodiments according to the present disclosure.

In some embodiments, the array substrate includes at least one dummy subpixel in which a dummy pixel driving circuit is non-functional and not capable of driving light emission. Optionally, the dummy pixel driving circuit in the dummy subpixel is not electrically connected to a light emitting element. FIG. 7 is a plan view of an array substrate in some embodiments according to the present disclosure. Referring to FIG. 7, the array substrate in some embodiments includes multiple rows of pixel driving circuits and at least one row of dummy circuits. The pixel driving circuits are functional pixel driving circuits that are capable of driving light emission in light elements, e.g., the pixel driving circuits depicted in FIG. 2A, FIG. 2B, and FIG. 3A. The dummy circuits are non-functional pixel driving circuits that are incapable of driving light emission in light elements.

Figure 8:
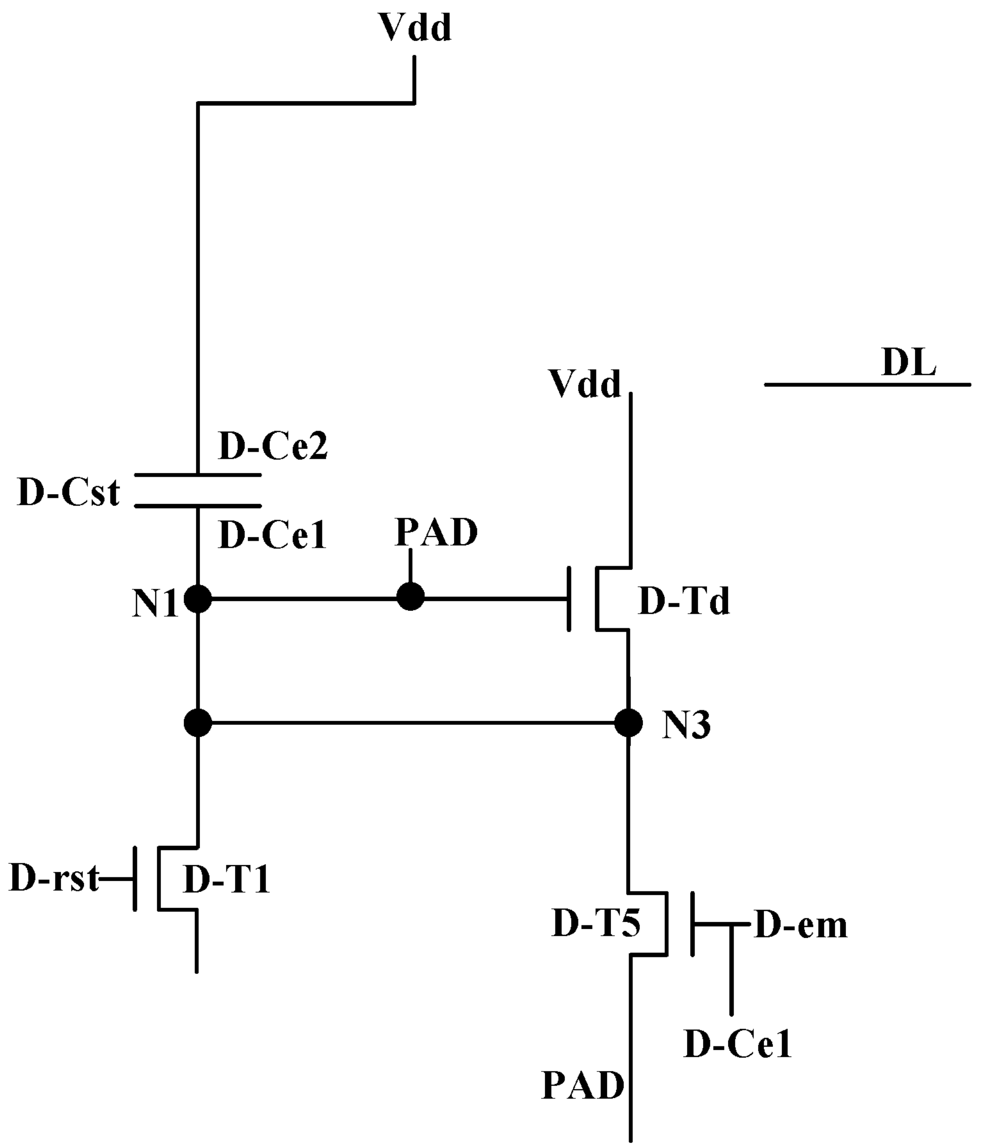
FIG. 8 is a circuit diagram illustrating the structure of a dummy circuit in some embodiments according to the present disclosure.

FIG. 8 is a circuit diagram illustrating the structure of a dummy circuit in some embodiments according to the present disclosure. Referring to FIG. 8, a respective dummy circuit in some embodiments includes a second storage capacitor D-Cst having a third capacitor electrode D-Ce1 and a fourth capacitor electrode D-Ce2, which is connected to a respective voltage supply line of the plurality of voltage supply lines Vdd; a second driving transistor D-Td having a control electrode and a second electrode connected to a pad configured to be provided with a voltage of the respective voltage supply line, and a first electrode connected to the respective voltage supply line; a seventh transistor D-T1 having a control electrode connected to a respective second reset control signal line of a plurality of second reset control signal line D-rst, which is configured to be provided with a voltage of the respective voltage supply line, a second electrode connected to the pad configured to be provided with a voltage of the respective voltage supply line, and a first electrode that is floating; and an eighth transistor D-T5 having a control electrode connected to a respective second light emission control signal line of a plurality of second light emission control signal lines D-em, a first electrode connected to the second electrode of the second driving transistor D-Td, and a second electrode connected to the pad. The respective dummy circuit is disconnected from the plurality of data lines DL.

Figure 9A:
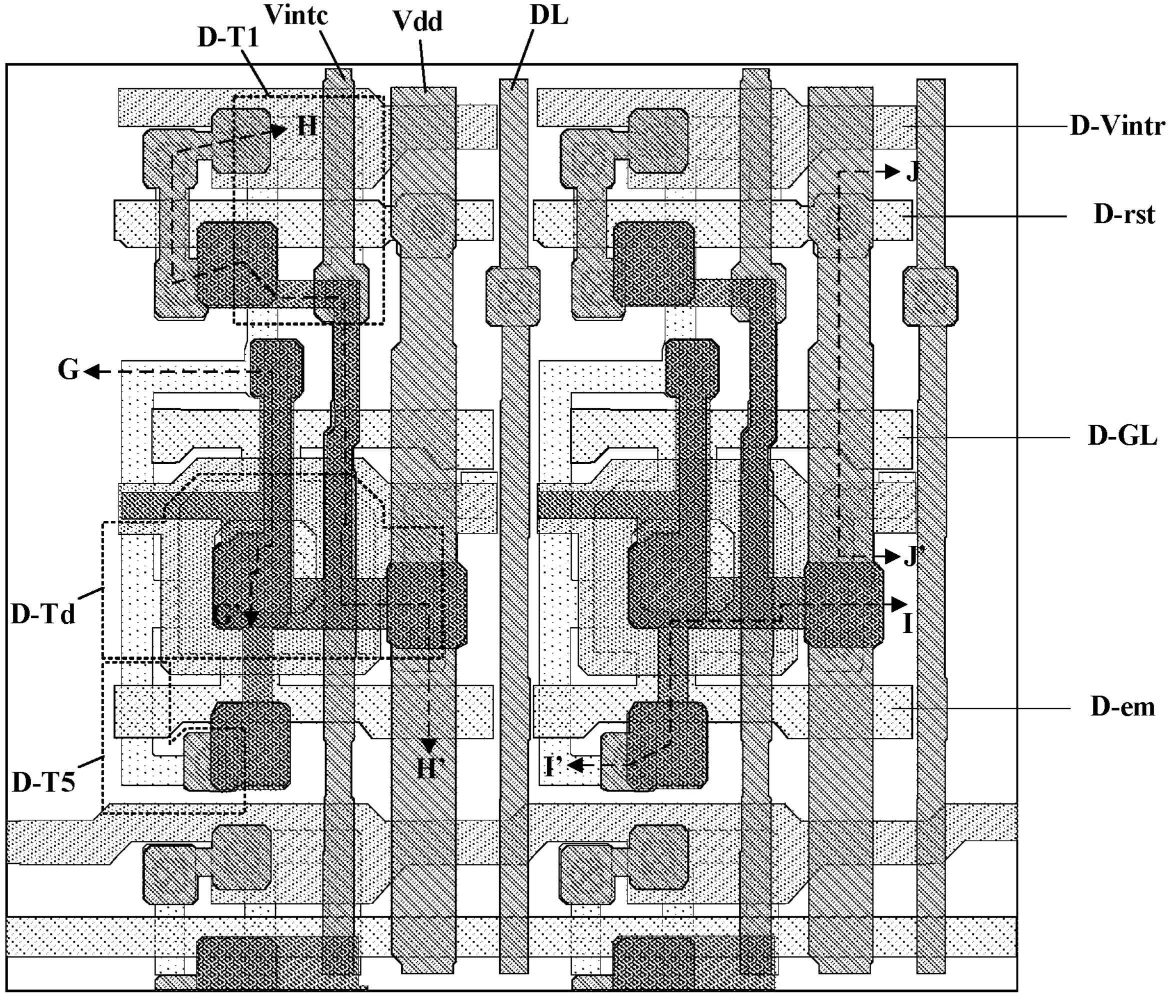
FIG. 9A is a diagram illustrating the structure of a plurality of dummy circuits in an array substrate in some embodiments according to the present disclosure.
Figure 9B:
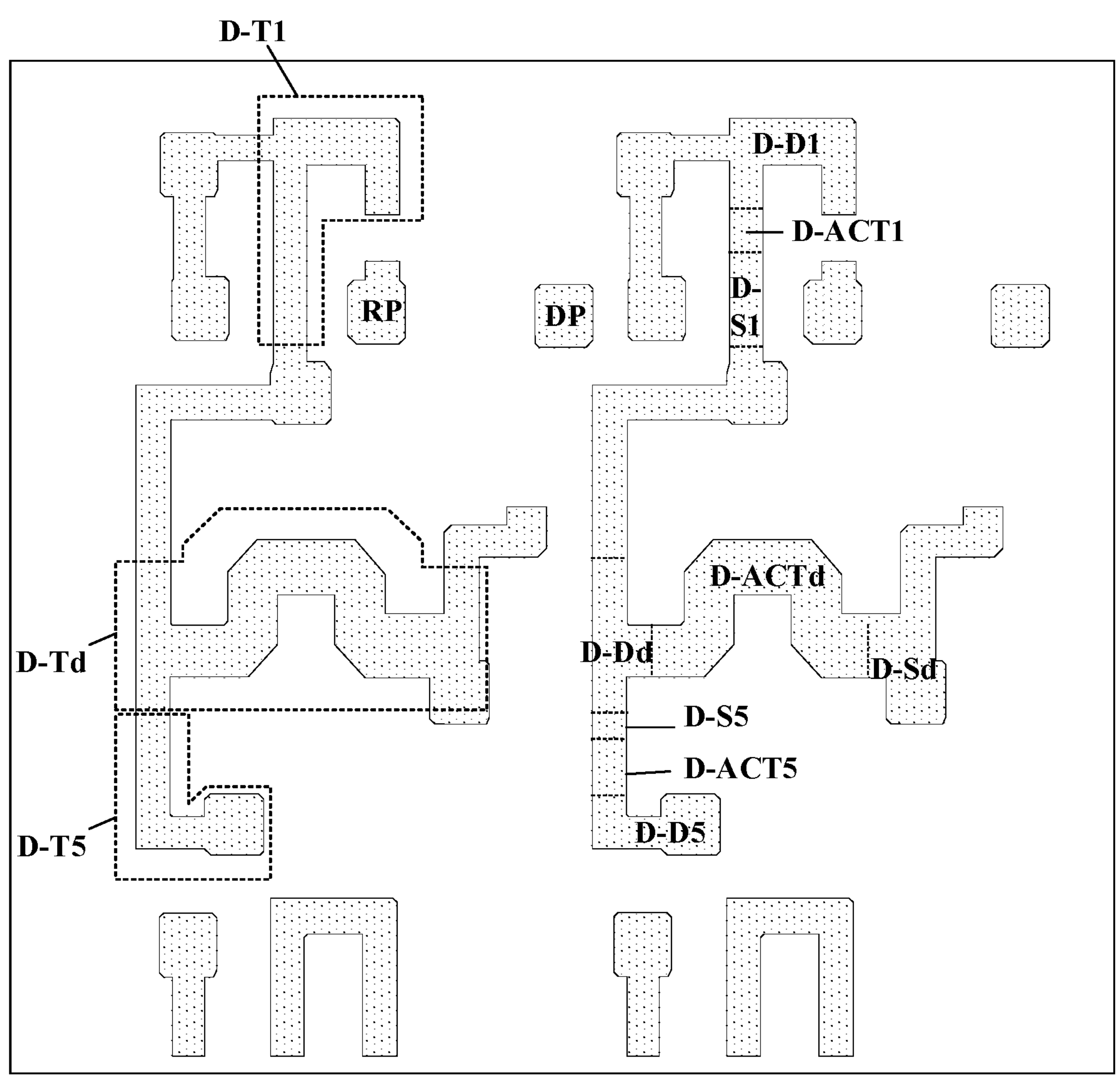
FIG. 9B is a diagram illustrating the structure of a semiconductor material layer in an array substrate depicted in FIG. 9A.
Figure 9C:
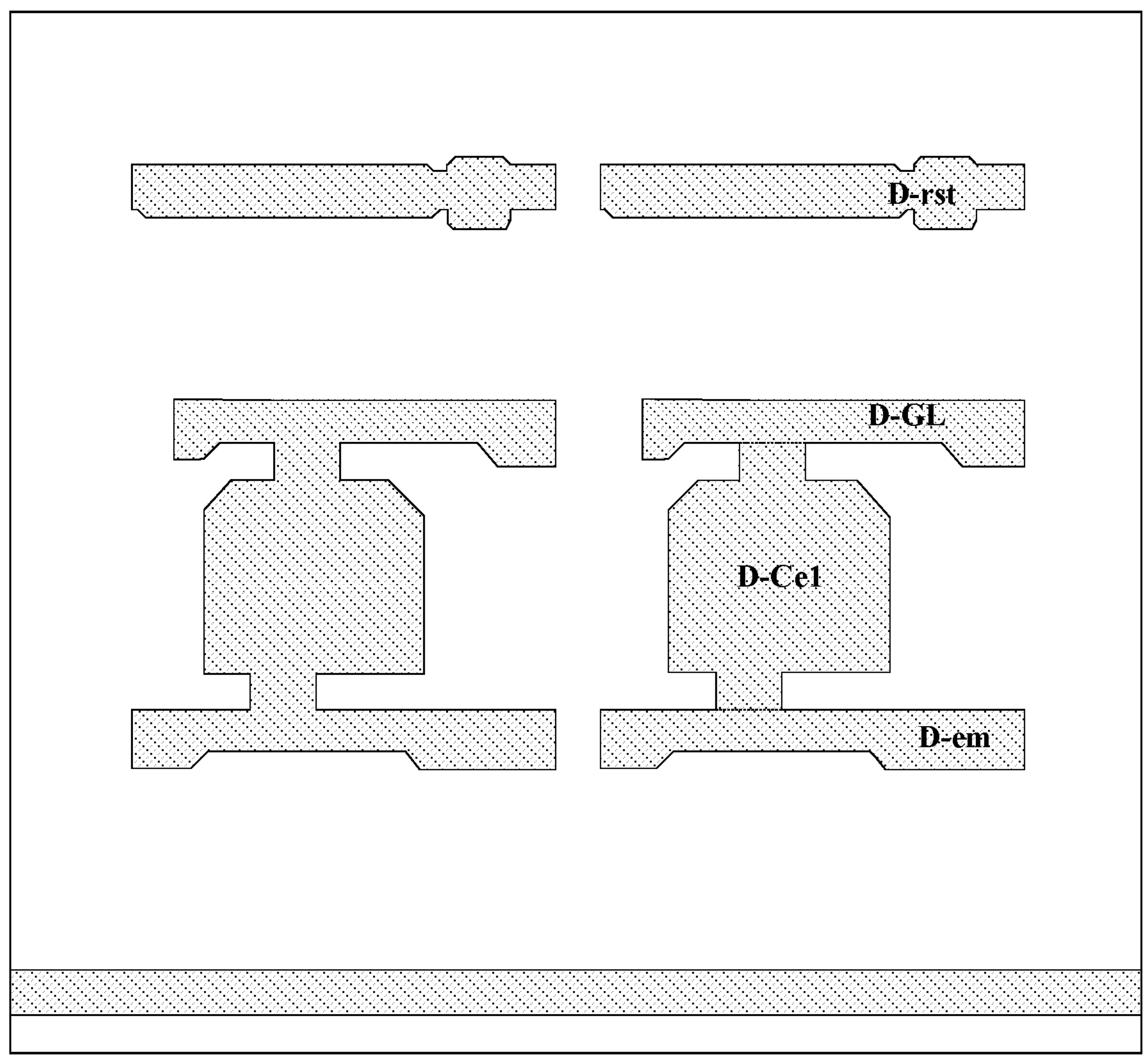
FIG. 9C is a diagram illustrating the structure of a first conductive layer in an array substrate depicted in FIG. 9A.
Figure 9D:
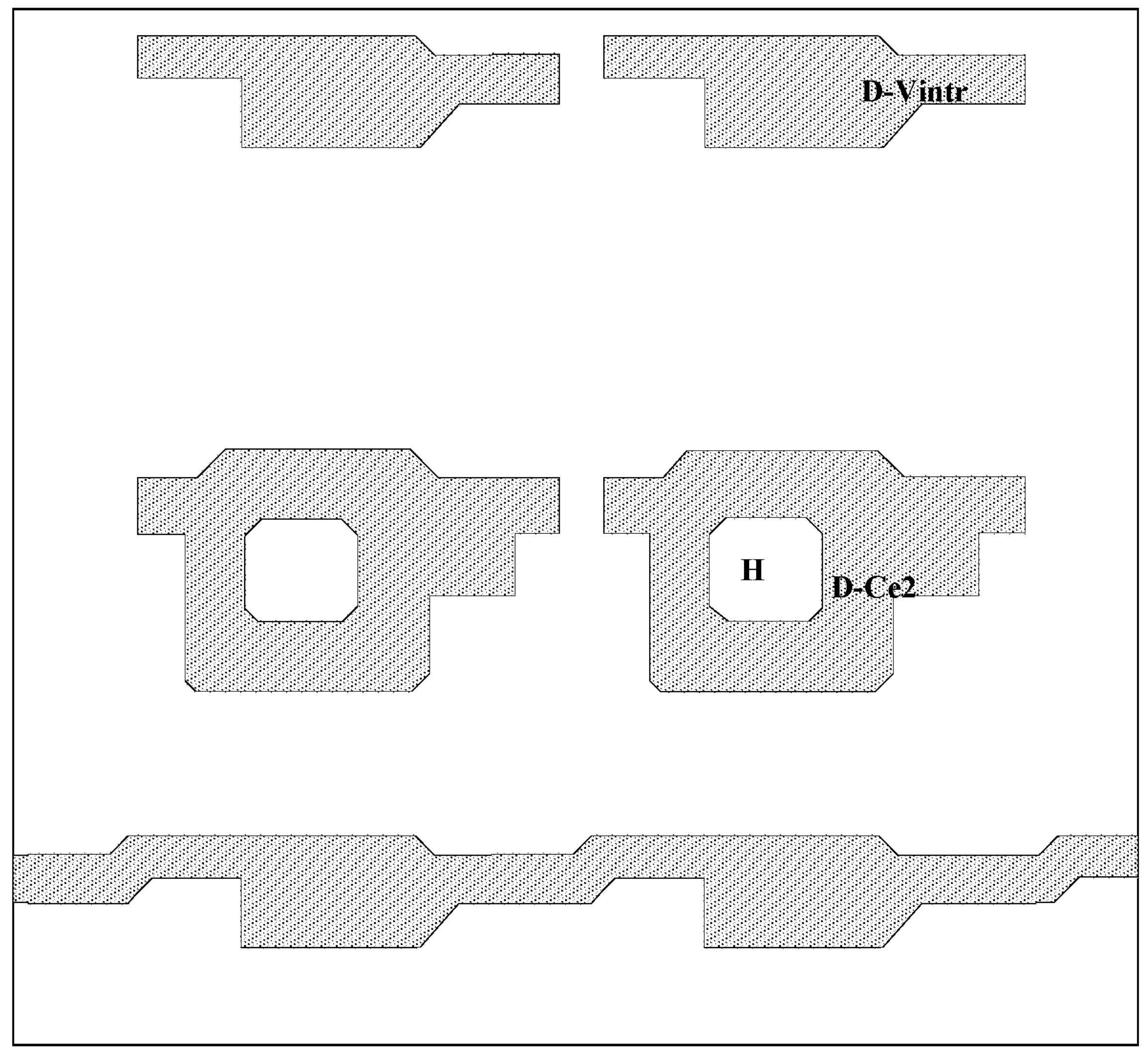
FIG. 9D is a diagram illustrating the structure of a second conductive layer in an array substrate depicted in FIG. 9A.
Figure 9E:
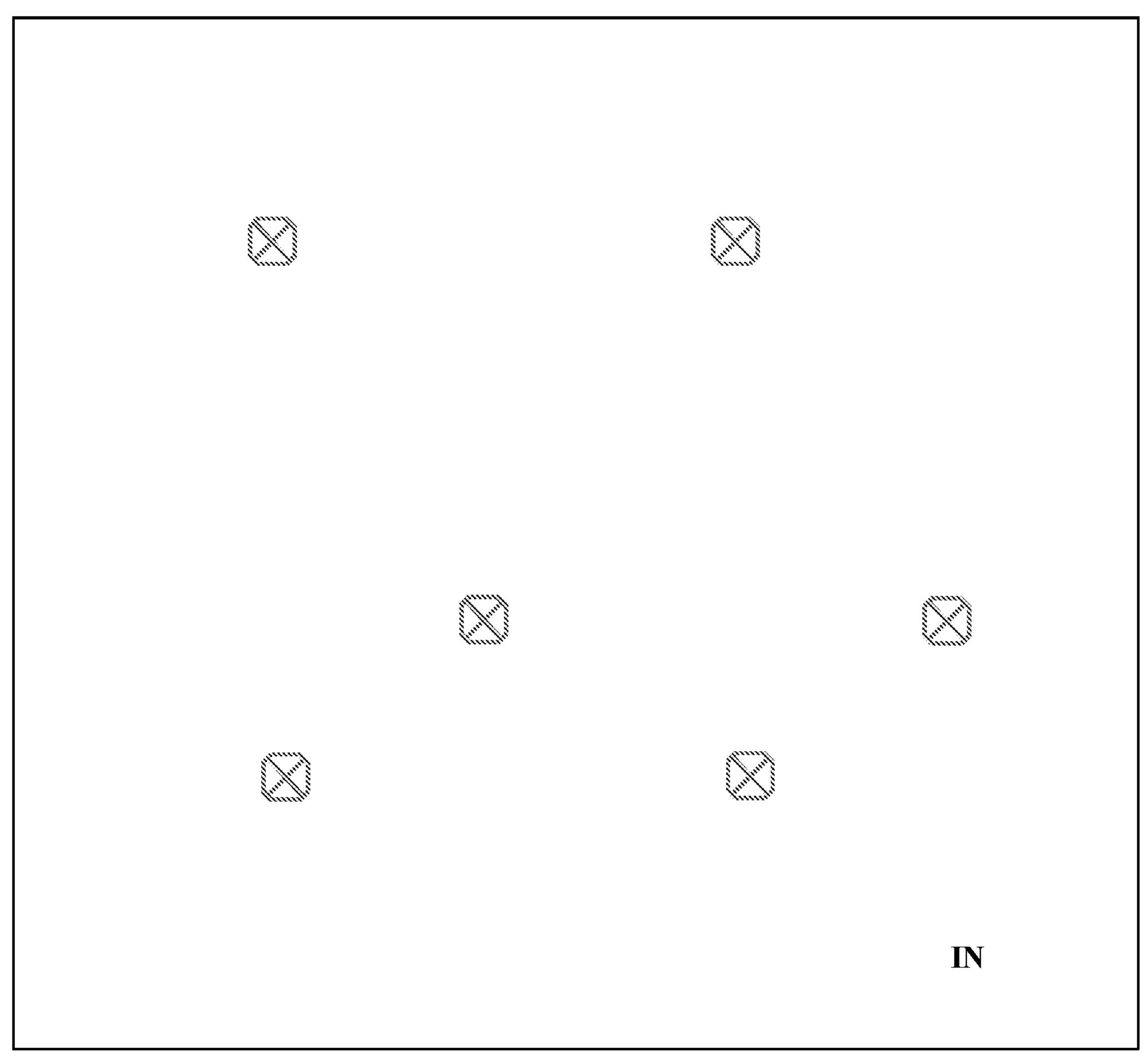
FIG. 9E is a diagram illustrating the structure of an insulating layer in an array substrate depicted in FIG. 9A.
Figure 9F:
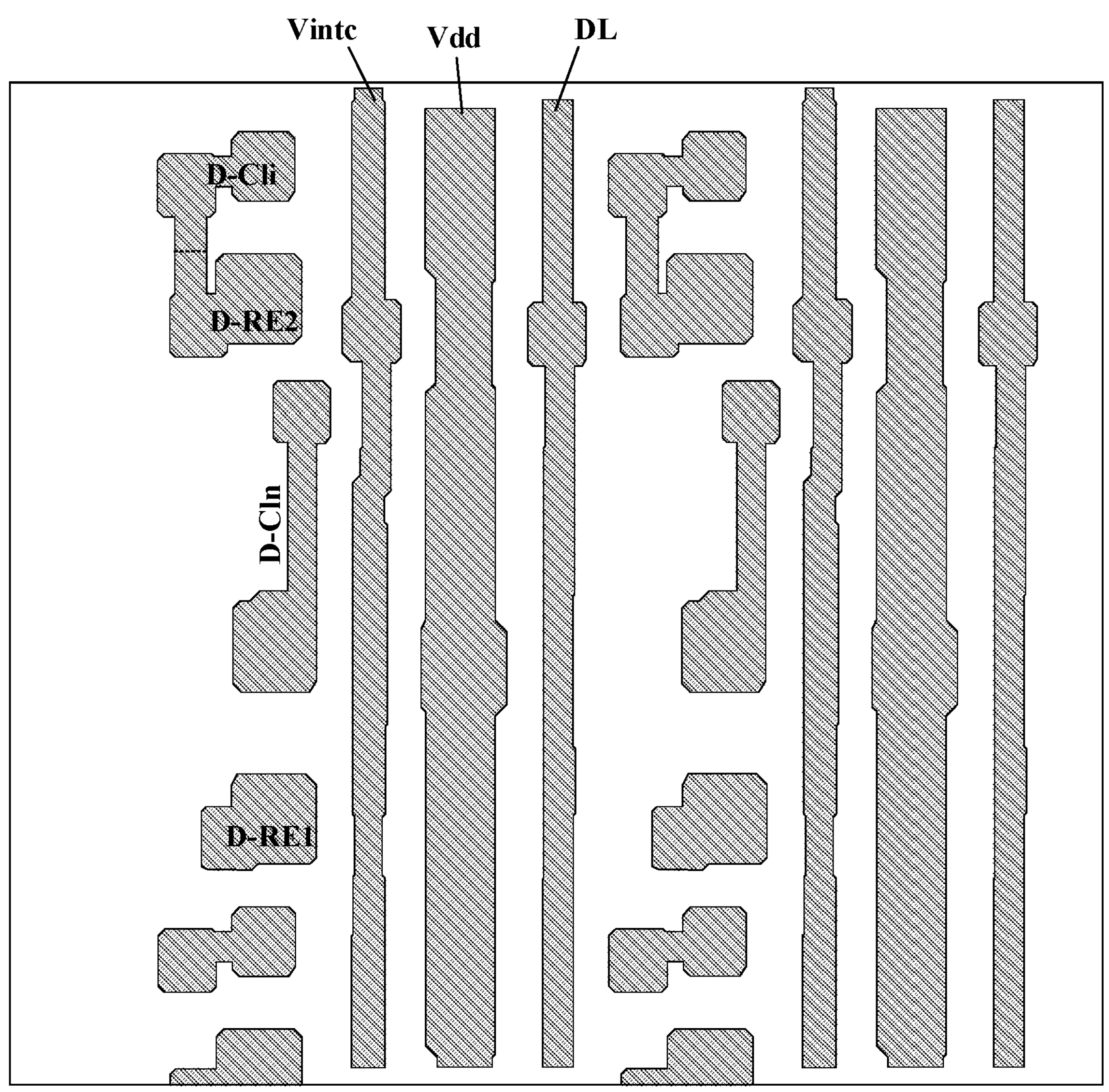
FIG. 9F is a diagram illustrating the structure of a first signal line layer in an array substrate depicted in FIG. 9A.
Figure 9G:
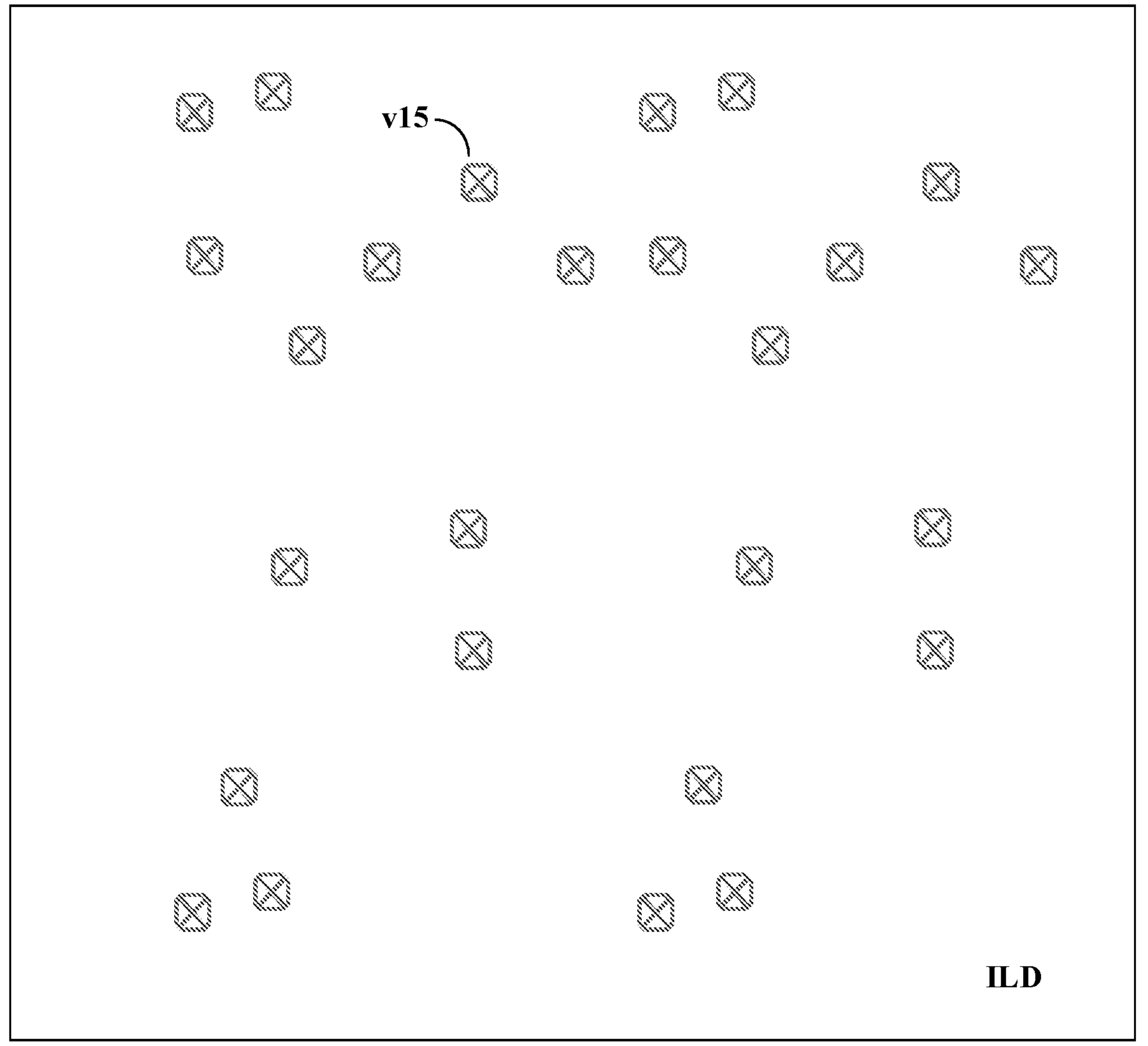
FIG. 9G is a diagram illustrating the structure of an inter-layer dielectric layer in an array substrate depicted in FIG. 9A.
Figure 9H:
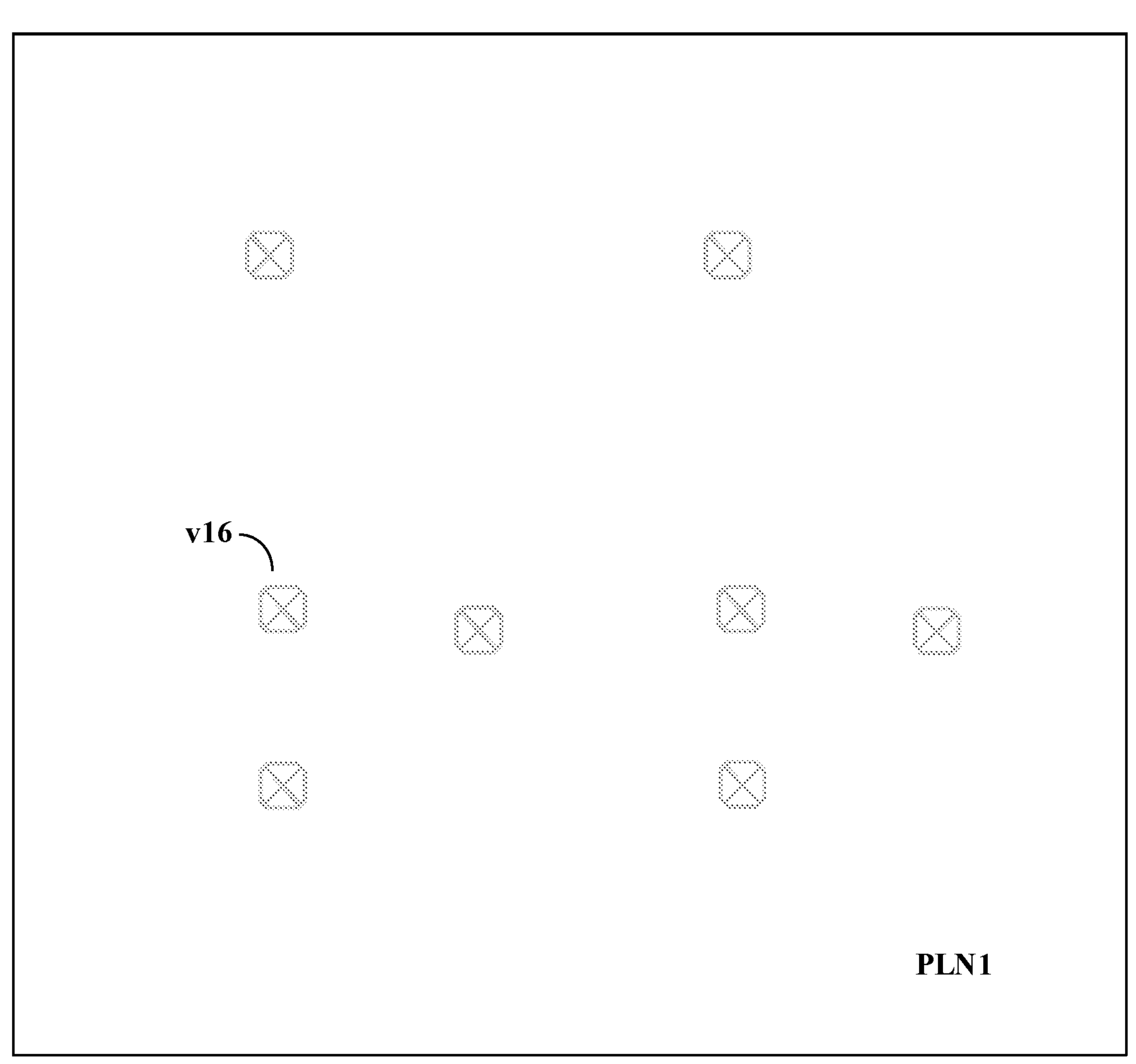
FIG. 9H is a diagram illustrating the structure of a first planarization layer in an array substrate depicted in FIG. 9A.
Figure 9I:
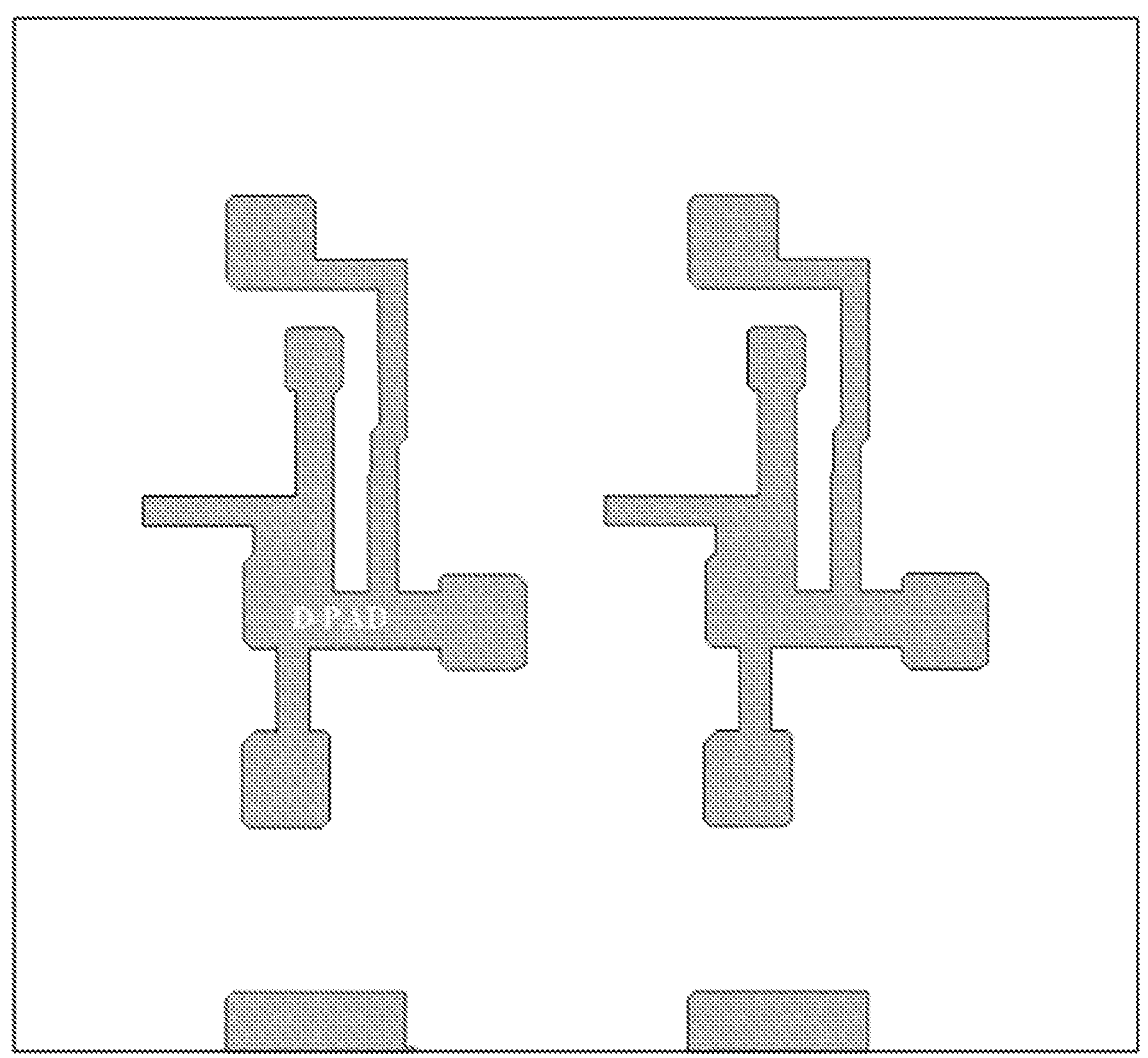
FIG. 9I is a diagram illustrating the structure of a second signal line layer in an array substrate depicted in FIG. 9A.
Figure 10A:
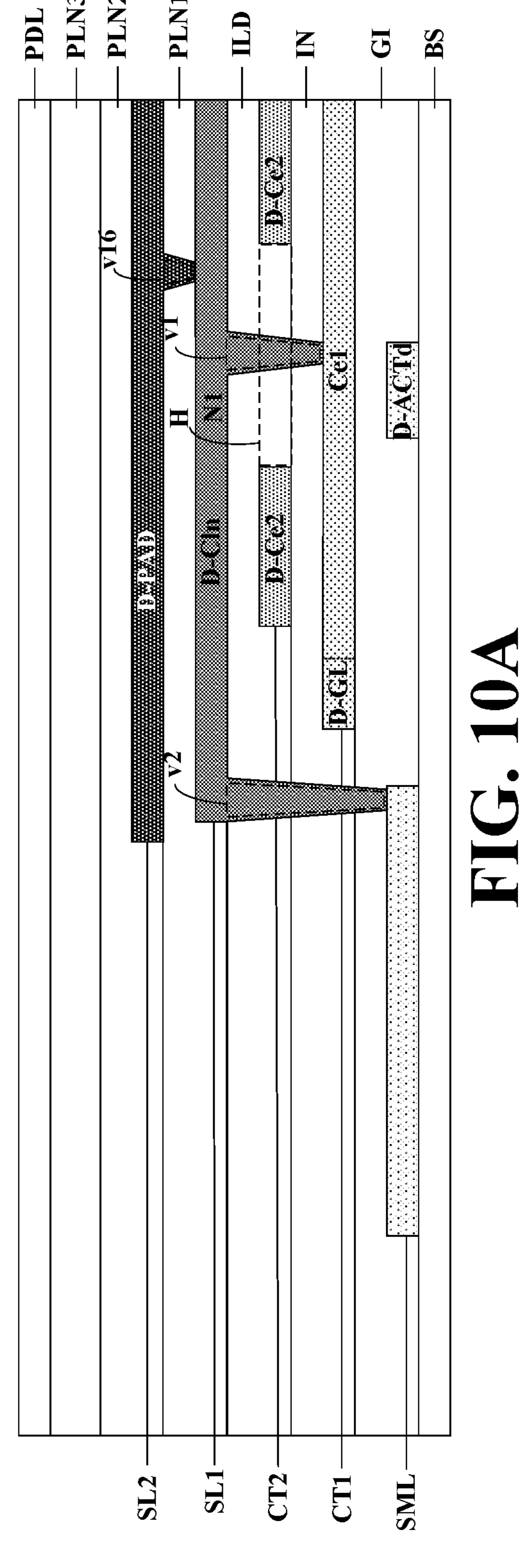
FIG. 10A is a cross-sectional view along a G-G' line in FIG. 9A.
Figure 10B:
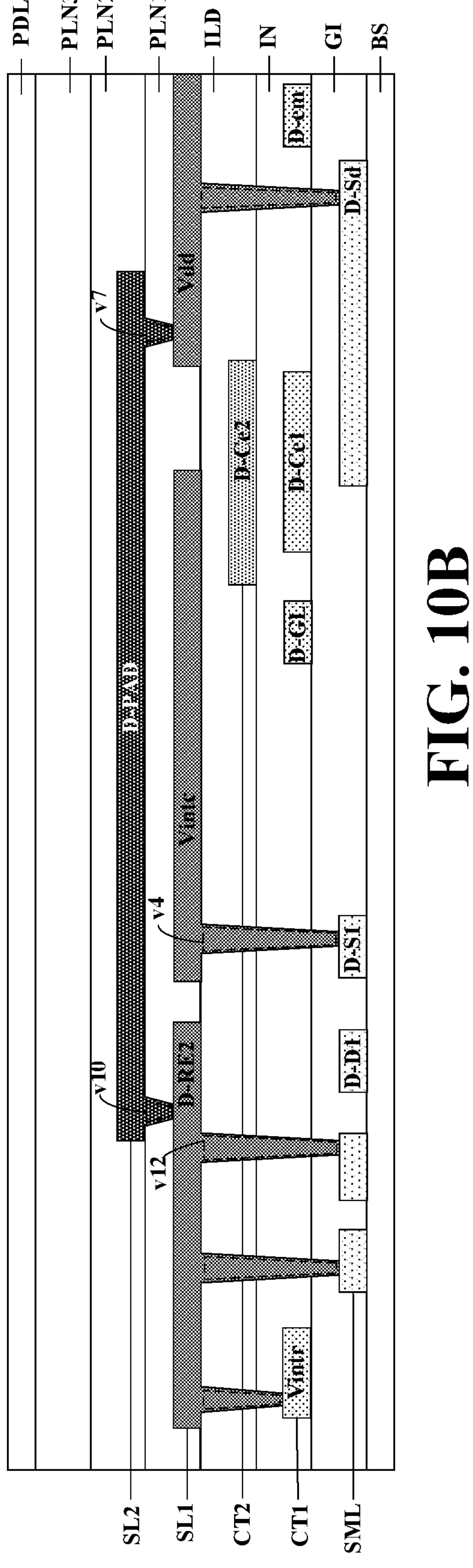
FIG. 10B is a cross-sectional view along an H-H' line in FIG. 9A.
Figure 10C:
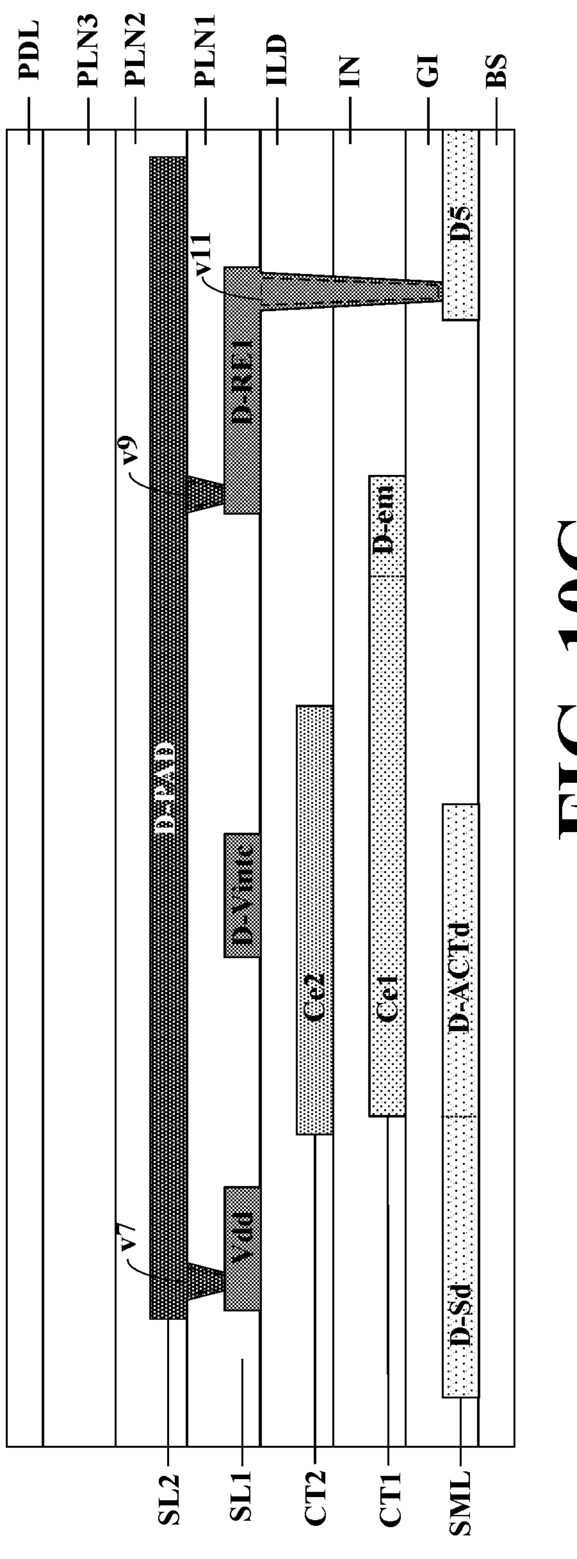
FIG. 10C is a cross-sectional view along an I-I' line in FIG. 9A.
Figure 10D:
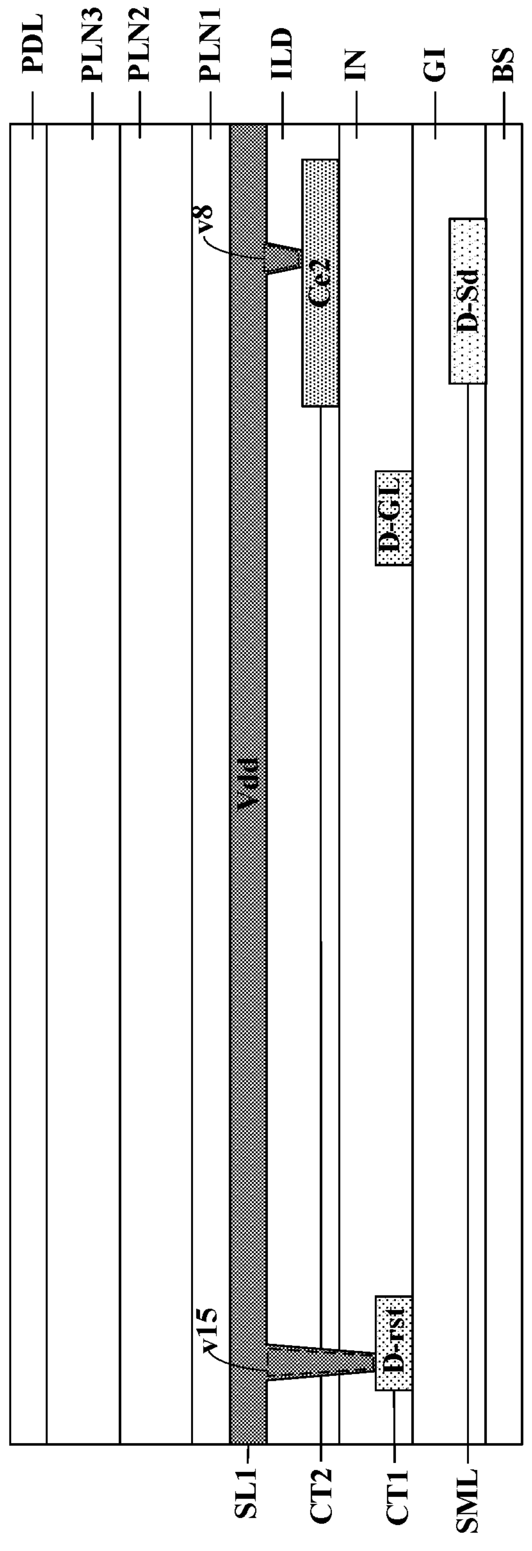
FIG. 10D is a cross-sectional view along a J-J' line in FIG. 9A.

FIG. 9A is a diagram illustrating the structure of a plurality of dummy circuits in an array substrate in some embodiments according to the present disclosure. FIG. 9B is a diagram illustrating the structure of a semiconductor material layer in an array substrate depicted in FIG. 9A. FIG. 9C is a diagram illustrating the structure of a first conductive layer in an array substrate depicted in FIG. 9A. FIG. 9D is a diagram illustrating the structure of a second conductive layer in an array substrate depicted in FIG. 9A. FIG. 9E is a diagram illustrating the structure of an insulating layer in an array substrate depicted in FIG. 9A. FIG. 9F is a diagram illustrating the structure of a first signal line layer in an array substrate depicted in FIG. 9A. FIG. 9G is a diagram illustrating the structure of an inter-layer dielectric layer in an array substrate depicted in FIG. 9A. FIG. 9H is a diagram illustrating the structure of a first planarization layer in an array substrate depicted in FIG. 9A. FIG. 9I is a diagram illustrating the structure of a second signal line layer in an array substrate depicted in FIG. 9A. FIG. 10A is a cross-sectional view along a G-G' line in FIG. 9A. FIG. 10B is a cross-sectional view along an H-H' line in FIG. 9A. FIG. 10C is a cross-sectional view along an I-I' line in FIG. 9A. FIG. 10D is a cross-sectional view along a J-J' line in FIG. 9A.

Referring to FIG. 9A, FIG. 9B, and FIG. 10A to FIG. 10D, the respective dummy circuit is annotated with labels indicating regions corresponding to the plurality of transistors in the respective dummy circuit, including the seventh transistor D-T1, the eighth transistor D-T5, and the second driving transistor D-Td. The respective dummy circuit is further annotated with labels indicating components of each of the plurality of transistors in the pixel driving circuit. For example, the seventh transistor D-T1 includes an active layer D-ACT1, a first electrode D-S1, and a second electrode D-D1. The eighth transistor D-T5 includes an active layer D-ACT5, a first electrode D-S5, and a second electrode D-D5. The second driving transistor D-Td includes an active layer D-ACTd, a first electrode D-Sd, and a second electrode D-Dd.

In some embodiments, the active layers (D-ACT1, D-ACT5, and D-ACTd) of the transistors (D-T1, D-T5, and D-Td) in the respective dummy circuit are in a same layer. Optionally, the active layers (D-ACT1, D-ACT5, and D-ACTd), at least portions of the first electrodes (D-S1, D-S5, and D-Sd), and at least portions of the second electrodes (D-D1, D-D5, and D-Dd) of the transistors (D-T1, D-T5, and D-Td) in the respective dummy circuit are in a same layer. Optionally, the active layers (D-ACT1, D-ACT5, and D-ACTd), the first electrodes (D-S1, D-S5, and D-Sd), and the second electrodes (D-D1, D-D5, and D-Dd) of the transistors (D-T1, D-T5, and D-Td) in the respective dummy circuit are in a same layer.

In some embodiments, the active layers (D-ACT1, D-ACT5, and D-ACTd) of the transistors (D-T1, D-T5, and D-Td) in the respective dummy circuit are parts of a unitary structure. In another example, the active layers (D-ACT1, D-ACT5, and D-ACTd), the first electrodes (D-S1, D-S5, and D-Sd), and the second electrodes (D-D1, D-D5, and D-Dd) of the transistors (D-T1, D-T5, and D-Td) in the respective dummy circuit are parts of a unitary structure.

In the functional pixel driving circuits as shown in FIG. 3C, the active layer ACT6 of the transistor T6 in the respective pixel driving circuit is spaced apart from the first unitary structure comprising the active layers ACT1, ACT2, ACT3, ACT4, ACT5, and ACTd of the transistors T1, T2, T3, T4, T5, and Td in the respective pixel driving circuit. In the respective dummy circuit as shown in FIG. 9B, the corresponding portion (the portion corresponding to the active layer ACT6 of the transistor T6 in the respective pixel driving circuit) is connected to the second electrode D-D1 of the seventh transistor D-T1 in the respective dummy circuit.

The semiconductor material layer includes a data pad DP that is connected to the respective data line of the plurality of data lines DL. The data pad DP is spaced apart from the unitary structure comprising the active layers (D-ACT1, D-ACT5, and D-ACTd) of the transistors (D-T1, D-T5, and D-Td) in the respective dummy circuit. Because the data pad DP is disconnected from the unitary structure, the respective dummy circuit is not configured to receive a data signal.

Comparing FIG. 9B with FIG. 3C, the portion of the semiconductor material layer corresponding to the active layer ACT2 of the second transistor T2 in FIG. 3C is absent in the respective dummy circuit, thereby disconnecting the data pad DP from the unitary structure in FIG. 9B. The dummy circuit does not have a counterpart of the second transistor T2 in the respective pixel driving circuit.

Referring to FIG. 8, FIG. 9A, and FIG. 9B, the semiconductor material layer in the dummy circuit is truncated so that it does not have a counterpart of the active layer ACT4 of the fourth transistor T4 in the respective pixel driving circuit in FIG. 9B. Thus, comparing FIG. 9B with FIG. 3C, the dummy circuit does not have a counterpart of the fourth transistor T4 in the respective pixel driving circuit.

In the respective pixel driving circuit as shown in FIG. 3A and FIG. 3C, the first transistor T1 is a double-gate transistor in which the active layer ACT1 of the first transistor T1 twice crosses over a respective reset control signal line of the plurality of reset control signal lines rst. Referring to FIG. 8, FIG. 9A, and FIG. 9B, the semiconductor material layer in the dummy circuit is truncated so that the active layer D-ACT1 of the seventh transistor D-T1 only once crosses over a respective second reset control signal line of the plurality of second reset control signal lines D-rst. Thus, the seventh transistor D-T1 in the respective dummy circuit is a single-gate transistor. A residual portion RP after the truncation of the semiconductor material layer is still connected to a respective second reset signal line of a plurality of second reset signal lines Vintc, but disconnected from the seventh transistor D-T1, rendering the second electrode D-D1 of the seventh transistor D-T1 floating.

Referring to FIG. 8, FIG. 9A, and FIG. 9C, the first conductive layer in some embodiments includes a plurality of second reset control signal lines D-rst in a row and disconnected and spaced apart from each other; a plurality of second gate lines D-GL in a row and disconnected and spaced apart from each other; a third capacitor electrode D-Ce1, and a plurality of second light emission control signal lines D-em disconnected and spaced apart from each other. A respective dummy circuit includes the third capacitor electrode D-Ce1, a respective second reset control signal line, a respective second gate line, and a respective second light emission control signal line. As shown in FIG. 9C, the third capacitor electrode D-Ce1, the respective second gate line, and the respective second light emission control signal line are parts of a unitary structure in a respective dummy circuit. For example, the respective second gate line in the respective dummy circuit is connected to the third capacitor electrode D-Ce1; and the respective second light emission control signal line in the respective dummy circuit is connected to the third capacitor electrode D-Ce1. The respective second gate line and the respective second light emission control signal line are configured to have a same voltage as the third capacitor electrode D-Ce1, which is configured to have same voltage as the respective voltage supply line. Unitary structures in adjacent dummy circuits in a same row are disconnected and spaced apart from each other. Second reset control signal lines in adjacent dummy circuits in a same row are disconnected and spaced apart from each other.

Referring to FIG. 8, FIG. 9A, FIG. 9B, and FIG. 9C, the semiconductor material layer in the dummy circuit does not cross over a respective second gate line of the plurality of second gate lines D-GL. The plurality of second gate lines D-GL are discrete line portions disconnected and spaced apart from each other, as compared to the respective gate line in FIG. 3A. For example, an orthographic projection of the semiconductor material layer on a base substrate is substantially non-overlapping with orthographic projections of the plurality of second gate lines D-GL on the base substrate.

Referring to FIG. 3D, the in a respective pixel driving circuit, a respective gate line of the plurality of gate lines GL includes a main portion MP extending along an extension direction of the respective gate line, and a gate protrusion GP protruding away from the main portion MP. Referring to FIG. 9C, the plurality of second gate lines D-GL do not include a gate protrusion GP. Because the plurality of second gate lines D-GL do not include a gate protrusion GP, and the respective second gate line of the plurality of second gate lines D-GL are truncated line portions, the semiconductor material layer in the dummy circuit does not cross over a respective second gate line of the plurality of second gate lines D-GL. Thus, comparing FIG. 9B with FIG. 3C, the dummy circuit does not have a counterpart of the third transistor T3 in the respective pixel driving circuit.

Referring to FIG. 8, FIG. 9A, and FIG. 9D, the second conductive layer in some embodiments includes a plurality of fifth reset signal lines D-Vintr in a row and disconnected and spaced apart from each other; and a fourth capacitor electrode D-Ce2. A respective dummy circuit includes the fourth capacitor electrode D-Ce2, and a respective fifth reset signal line. The fourth capacitor electrode D-Ce2 and the respective fifth reset signal line are configured to have a same voltage as the respective voltage supply line. Fourth capacitor electrodes in adjacent dummy circuits in a same row are disconnected and spaced apart from each other. Fifth reset signal lines in adjacent dummy circuits in a same row are disconnected and spaced apart from each other. Comparing FIG. 9D with FIG. 3E, the interference preventing block IPB in a respective pixel driving circuit is absent in a respective dummy circuit.

Vias extending through the insulating layer IN in a region having dummy circuits are depicted in FIG. 9E.

Referring to FIG. 8, FIG. 9A, and FIG. 9F, the first signal line layer in some embodiments includes a plurality of voltage supply lines Vdd, a second node connecting line D-Cln, a second initialization connecting line D-Cli, a third relay electrode D-RE1, a fourth relay electrode D-RE2, a plurality of second reset signal lines Vintc, and a plurality of data lines DL. The second node connecting line D-Cln connects the third capacitor electrode D-Ce1 and a portion of the semiconductor material layer together, the portion of the semiconductor material layer being between a first electrode D-S1 of the seventh transistor D-T1 and a second electrode D-Dd of the second driving transistor D-Td. In a respective dummy circuit, the second initialization connecting line D-Cli and the fourth relay electrode D-RE2 are parts of a unitary structure. The second initialization connecting line D-Cli is connected to the fourth relay electrode D-RE2, thus, a counterpart of the sixth transistor in a respective pixel driving circuit is absent in a respective dummy circuit.

Vias extending through the inter-layer dielectric layer ILD are depicted in FIG. 9G. Comparing FIG. 9G with FIG. 3H, the array substrate in a region having dummy circuits includes a fifteenth via v15 extending through the inter-layer dielectric layer ILD and the insulating layer IN, the fifteenth via v15 is absent in the region having pixel driving circuits (see, e.g., FIG. 3H). Referring to FIG. 10D, a respective voltage supply line is connected to a respective second reset control signal line of the plurality of second reset control signal line D-rst through the fifteenth via v15 extending through the inter-layer dielectric layer ILD and the insulating layer IN. Referring to FIG. 8 and FIG. 9A, the control electrode of the seventh transistor D-T1 is configured to be provided with a same voltage as the respective voltage supply line.

Vias extending through the first planarization layer PLN1 are depicted in FIG. 9H. Comparing FIG. 9H with FIG. 3I, the array substrate in a region having dummy circuits includes a sixteenth via v16 extending through the first planarization layer PLN1, the sixteenth via v16 is absent in in the region having pixel driving circuits (see, e.g., FIG. 3I). Referring to FIG. 10A, a pad D-PAD is connected to the second node connecting line D-Cln through the sixteenth via v16 extending through the first planarization layer PLN1. Referring to FIG. 8 and FIG. 9A, the first node N1 is configured to be provided with a same voltage as the pad D-PAD. Referring to FIG. 10B, the pad D-PAD is connected to a respective voltage supply line of the plurality of voltage supply lines Vdd through a seventh via v7 extending through the first planarization layer PLN1. Thus, because the second node connecting line D-Cln (the first node N1) is connected to the pad D-PAD, which is connected to the respective voltage supply line, the second node connecting line D-Cln (the first node N1) is configured to be provided with a same voltage as the respective voltage supply line.

Referring to FIG. 8, FIG. 9A, and FIG. 9I, the second signal line layer in some embodiments includes a pad D-PAD in a respective dummy circuit. In some embodiments, the pad D-PAD in each dummy circuit is a unitary structure. Referring to FIG. 10A to FIG. 10C, in some embodiments, the pad D-PAD is connected to a second node connecting line D-Cln through a sixteenth via v16 extending through the first planarization layer PLN1; connected to a respective voltage supply line through a seventh via v7 extending through the first planarization layer PLN1; connected to the fourth relay electrode D-RE2 through a tenth via v10 extending through the first planarization layer PLN1; and connected to a first-first relay electrode D-RE1 through a ninth via v9 extending through the first planarization layer PLN1.

Figure 11A:
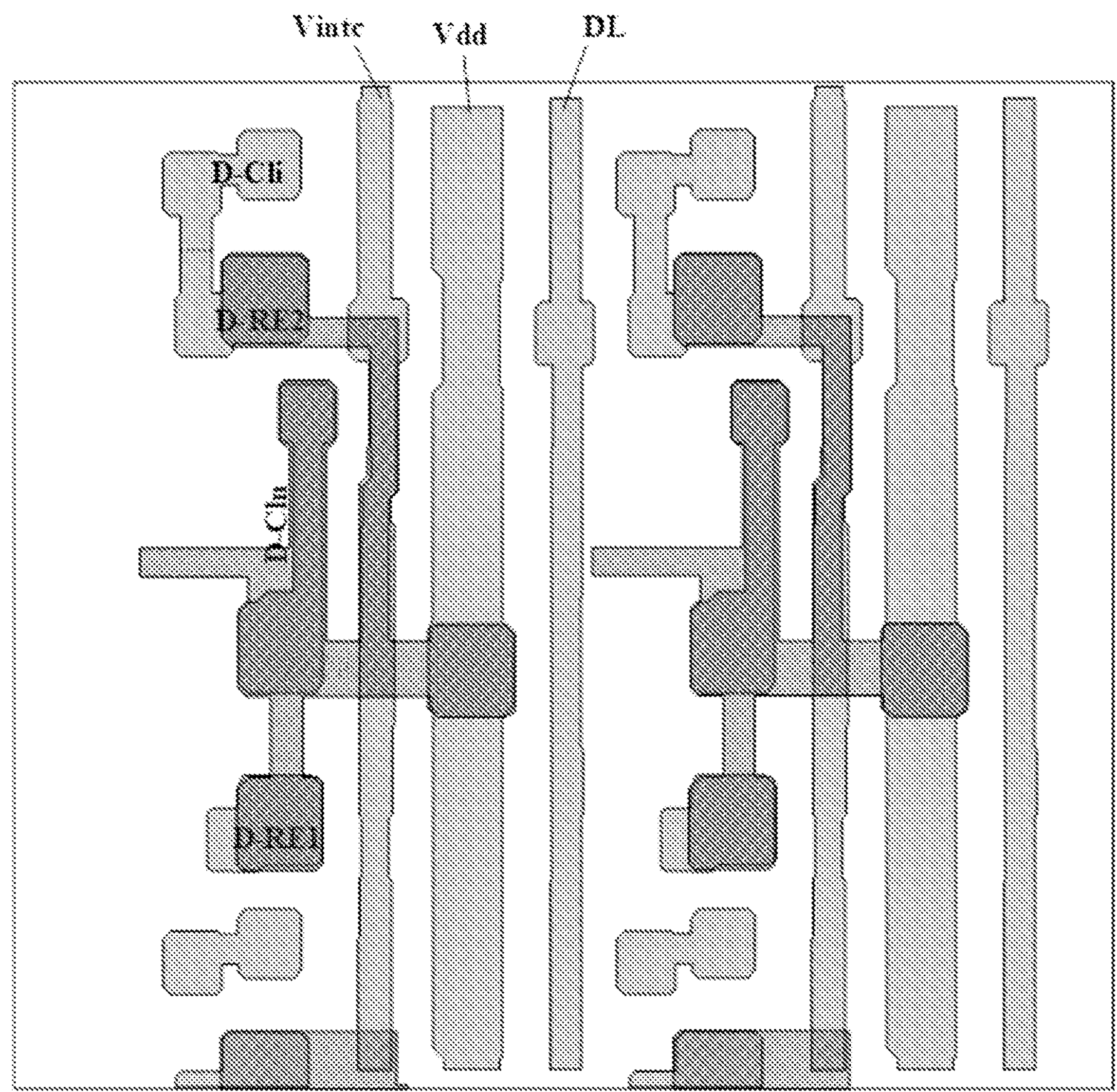
FIG. 11A illustrates the structure of a first signal line layer and a second signal line layer of the array substrate depicted in FIG. 9A.

FIG. 11A illustrates the structure of a first signal line layer and a second signal line layer of the array substrate depicted in FIG. 9A. Referring to FIG. 11A and FIG. 10A, in some embodiments, an orthographic projection of the pad D-PAD in a respective dummy circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the second node connecting line D-Cln in the respective dummy circuit on the base substrate BS. An orthographic projection of the pad D-PAD on a base substrate BS at least partially overlaps with an orthographic projection of the respective second reset signal line of the plurality of second reset signal lines Vintc on the base substrate BS.

Figure 11B:
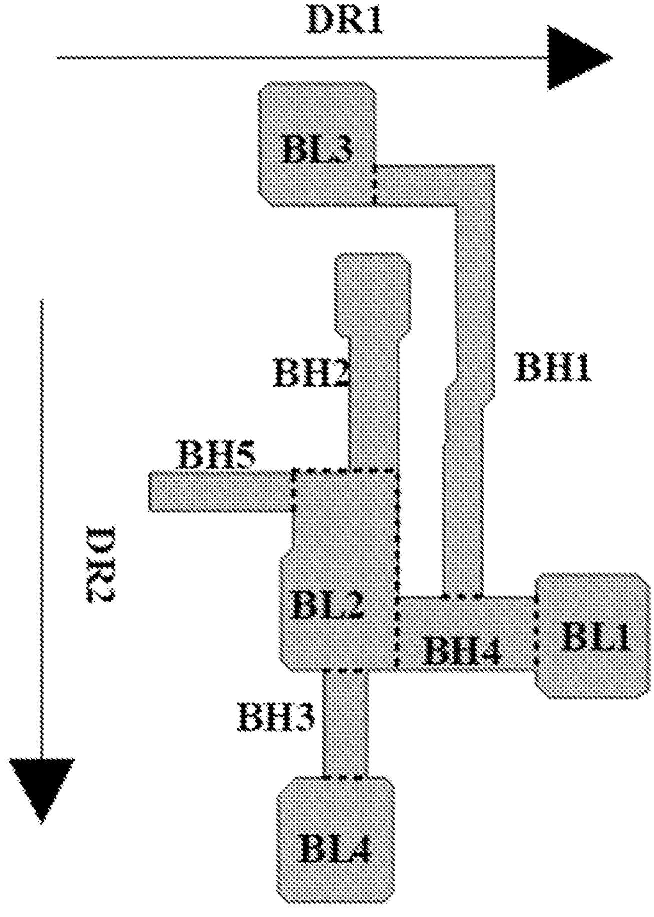
FIG. 11B illustrates the structure of a pad in some embodiments according to the present disclosure.

FIG. 11B illustrates the structure of a pad in some embodiments according to the present disclosure. Referring to FIG. 11B, FIG. 11A, FIG. 9A, and FIG. 10A to FIG. 10C, the pad D-PAD in some embodiments has a unitary structure including a first block BL1, a second block BL2, a third block BL3, and a fourth block BL4. The first block BL1 is connected to the respective voltage supply line through a seventh via v7 extending through the first planarization layer PLN1. The second block BL2 is connected to the second node connecting line D-Cln through a sixteenth via v16 extending through the first planarization layer PLN1. The third block BL3 is connected to the fourth relay electrode D-RE2 through a tenth via v10 extending through the first planarization layer PLN1. The fourth block BL4 is connected to a first-first relay electrode D-RE1 through a ninth via v9 extending through the first planarization layer PLN1. The unitary structure further includes a first branch BH1, a second branch BH2, a third branch BH3, a fourth branch BH4, and a fifth branch BH5. The fourth branch BH4 connects the first block BL1 and the second block BL2 together, and extends substantially along the first direction DR1. The first branch BH1 connects the third branch BL3 and the fourth branch BH4 together, extending from the third block BL3 substantially along the first direction DR1 then extending toward the fourth branch BH4 substantially along the second direction DR2. An orthographic projection of the first branch BH1 on a base substrate BS at least partially overlaps with an orthographic projection of the respective first reset signal line on the base substrate BS. The third branch BH3 connects the second block BL2 and the fourth block BL4 together, and extends substantially along the second direction DR2. The second branch BH2 extends away from the second block BL2 substantially along the second direction DR2. An orthographic projection of the second branch BH2 in a respective dummy circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the second node connecting line D-Cln in the respective dummy circuit on the base substrate BS. The fifth branch BH5 extends away from the second block BL2 substantially along the first direction DR1.

Referring to FIG. 8, in the respective dummy circuit, each terminal of each transistor and capacitor is configured to be provided with a same voltage as the respective voltage supply line. For example, control electrodes of the seventh transistor D-T1, the second driving transistor, the eighth transistor; first electrodes of the second driving transistor and the eighth transistor; second electrodes of the seventh transistor D-T1, the second driving transistor, the eighth transistor; are all configured to be provided with the same voltage as the respective voltage supply line. Moreover, the third capacitor electrode D-Ce1 and the fourth capacitor electrode D-Ce2 of the second storage capacitor D-Cst are also configured to be provided with the same voltage as the respective voltage supply line. When the control electrode of the seventh transistor D-T1 is provided with the same voltage as the respective voltage supply line, the seventh transistor D-T1 is turned on, and the first electrode of the seventh transistor D-T1 is connected to the second electrode of the seventh transistor D-T1, which is also provided with the same voltage as the respective voltage supply line. The inventors of the present disclosure discover that, by having all terminals of the respective dummy circuit configured with the same voltage as the respective voltage supply line, and disconnecting the data line from the dummy circuit, issues related to signal floating in the array substrate can be obviated. The advantage is particularly significant when the array substrate includes a large number of dummy circuits (e.g., circuits corresponding to “dummy” subpixels).

Figure 12:
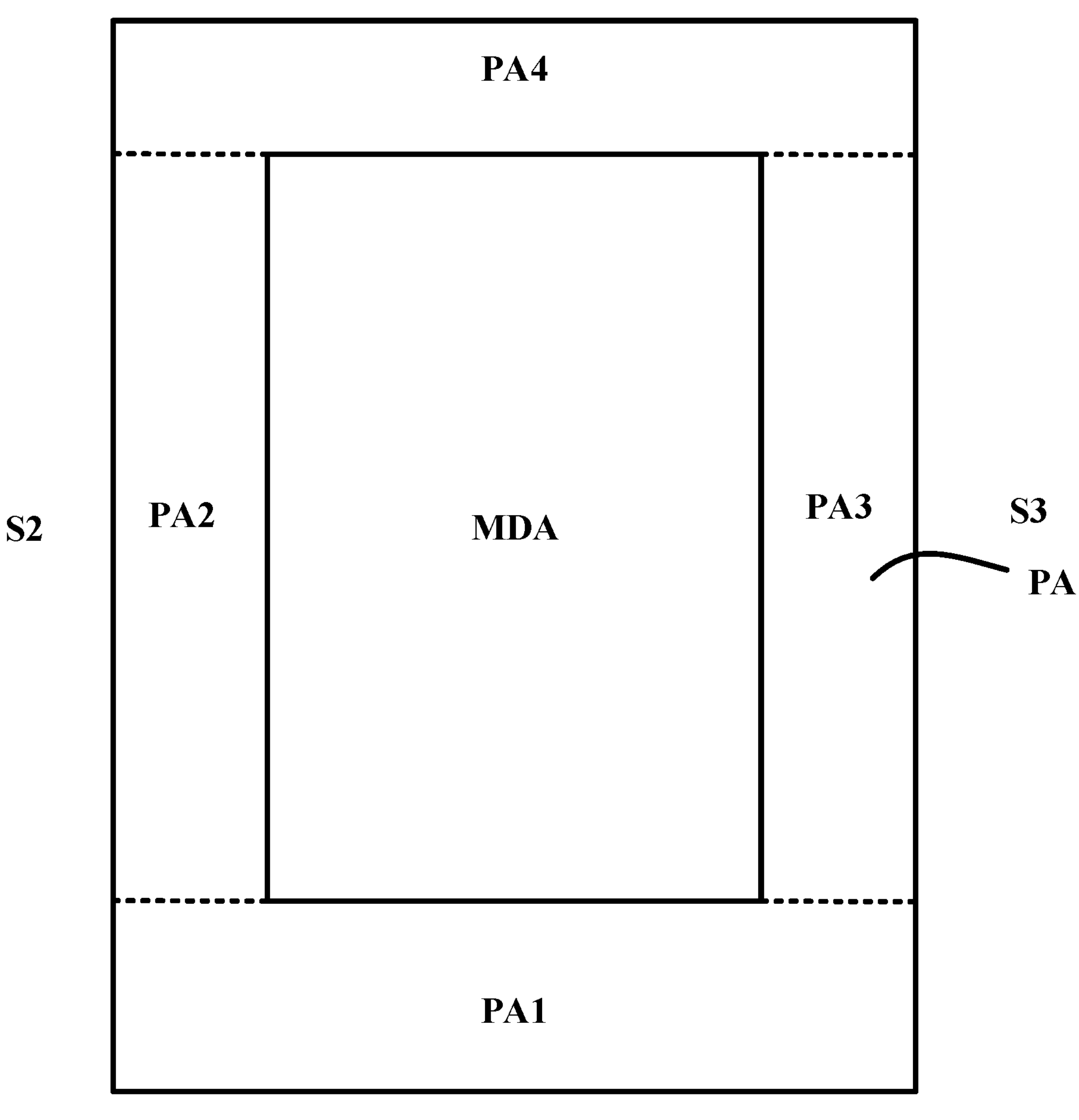
FIG. 12 is a schematic diagram illustrating a display area and a peripheral area in a display panel in some embodiments according to the present disclosure.

FIG. 12 is a schematic diagram illustrating a display area and a peripheral area in a display panel in some embodiments according to the present disclosure. Referring to FIG. 12, in some embodiments, the array substrate includes a main display area MDA and a peripheral area PA. As used herein, the term “display area” refers to an area of an array substrate where image is displayed. As used herein, the term “peripheral area” refers to an area of an array substrate where various circuits and wires (for example, GOA circuit and fanout signal lines) are provided to transmit signals to the array substrate. A peripheral area in the present array substrate may be configured to display image.

In some embodiments, the peripheral area PA includes a first sub-area PA1 on a first side S1 of the display area DA, a second sub-area PA2 on a second side S2 of the display area DA, a third sub-area PA3 on a third side S3 of the display area DA, a fourth sub-area PA4 on a fourth side S4 of the display area DA. Optionally, the first side S1 and the fourth side S4 are opposite to each other. Optionally, the second side S2 and the third side S3 are opposite to each other. Optionally, the first sub-area PA1 is a fanout area where signal lines are connected to an integrated circuit. Optionally, the second sub-area PA2 and/or the third sub-area PA3 are areas where a GOA (gate driver on array) circuit is at least partially present.

In some embodiments, in at least a portion of the array substrate (e.g., in at least a portion of the main display area MDA), one row or multiple rows of dummy circuits are disposed between first multiple rows of pixel driving circuits and second multiple rows of pixel driving circuits; one column or multiple columns of dummy circuits are disposed between first multiple columns of pixel driving circuits and second multiple columns of pixel driving circuits. In one example, in at least a portion of the array substrate (e.g., in at least a portion of the main display area MDA), the array substrate has a circuit pattern of N1 and n1 alternately arranged, wherein N1 stands for N1 number of rows of pixel driving circuits, and n1 stands for n1 number of rows of dummy circuits. In another example, in at least a portion of the array substrate, the array substrate has a circuit pattern of M1 and m1 alternately arranged, wherein M1 stands for M1 columns of pixel driving circuits, and m1 stands for m1 columns of dummy circuits. Optionally, N1 stands for four rows of pixel driving circuits, and n1 stands for one row of dummy circuits. Optionally, M1 stands for four columns of pixel driving circuits, and m1 stands for one column of dummy circuits.

In some embodiments, in at least a portion of the array substrate (e.g., in at least a portion of the first sub-area PA1, the second sub-area PA2, or the third sub-area PA3), the dummy circuits are absent. In one example, the dummy circuits are absent in at least a portion of the first sub-area PA1. In another example, the dummy circuits are absent in at least a portion of the second sub-area PA2. In another example, the dummy circuits are absent in at least a portion of the third sub-area PA3.

By having a reduced density of dummy circuits in the GOA circuit area or fanout area, these areas may have additional space for disposing display elements such as anodes and light emitting layers, which are electrically connected to pixel driving circuits in the main display area. Image may be displayed in at least a portion of the GOA circuit area or fanout area, significantly enlarging the effective image display area of the array substrate.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present invention provides a method of fabricating an array substrate. In some embodiments, the method includes forming a plurality of pixel driving circuits configured to drive light emission in a plurality of subpixels; forming at least one dummy circuit incapable of driving light emission; and forming a plurality of voltage supply lines, a respective voltage supply line configured to provide a voltage to a storage capacitor of at least one pixel driving circuit, and provide the voltage to a second storage capacitor of the at least one dummy circuit. Optionally, the voltage is provided to a second capacitor electrode of the at least one pixel driving circuit, and is provided to both capacitor electrodes of the at least one dummy circuit.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term “the invention”, “the present invention” or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use “first”, “second”, etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:

a plurality of pixel driving circuits configured to drive light emission in a plurality of subpixels;

at least one dummy circuit incapable of driving light emission;

a plurality of voltage supply lines configured to provide a voltage; and a second node connecting line in a first signal line layer;

wherein a second capacitor electrode of at least one pixel driving circuit of the plurality of pixel driving circuits is configured to have a same voltage level as the voltage of the plurality of voltage supply lines; and a first capacitor electrode and a second capacitor electrode of the at least one dummy circuit are configured to have a same voltage level as the voltage of the plurality of voltage supply lines;

wherein the second node connecting line connects a first capacitor electrode of the at least one dummy circuit and a portion of a semiconductor material layer together, the portion of the semiconductor material layer being between a first electrode of a seventh transistor of the at least one dummy circuit and a second electrode of the second driving transistor of the at least one dummy circuit.

2. The array substrate of claim 1, wherein a respective voltage supply line of the plurality of voltage supply lines is configured to provide the voltage to a storage capacitor of the at least one pixel driving circuit, and provide the voltage to a second storage capacitor of the at least one dummy circuit, so that the second capacitor electrode of the storage capacitor of the at least one pixel driving circuit, and the first capacitor electrode and a second capacitor electrode of the second storage capacitor of the at least one dummy circuit are configured to have a same voltage level as a voltage of the respective voltage supply line of the plurality of voltage supply lines.

3. The array substrate of claim 1, wherein each of a control electrode, a first electrode, and a second electrode of at least one transistor in the at least one dummy circuit are configured to have a same voltage level as the voltage of the plurality of voltage supply lines.

4. The array substrate of claim 1, wherein the at least one dummy circuit comprises a second driving transistor having a control electrode connected to a third capacitor electrode of the second storage capacitor; and each of a control electrode, a first electrode, and a second electrode of the second driving transistor are configured to have a same voltage level as the voltage of the plurality of voltage supply lines.

5. The array substrate of claim 1, further comprising a plurality of data lines, a respective data line configured to provide a data voltage to the at least one pixel driving circuit;

wherein the at least one dummy circuit is disconnected from the plurality of data lines.

6. The array substrate of claim 1, further comprising a plurality of second reset signal lines, a respective second reset signal line configured to provide a reset signal to a first electrode of a first transistor in the at least one pixel driving circuit;

wherein the at least one dummy circuit is disconnected from the plurality of second reset signal lines.

7. The array substrate of claim 6, further comprising a plurality of data lines, a respective data line configured to provide a data voltage to the at least one pixel driving circuit;

wherein an orthographic projection of the plurality of second reset signal lines on a base substrate is non-overlapping with an orthographic projection of a plurality of data lines on the base substrate.

8. The array substrate of claim 1, wherein each terminal of each transistor and capacitor in the at least one dummy circuit is configured to have a same voltage level as the voltage of the plurality of voltage supply lines.

9. An array substrate, comprising:

a plurality of pixel driving circuits configured to drive light emission in a plurality of subpixels;

at least one dummy circuit incapable of driving light emission; and a plurality of voltage supply lines configured to provide a voltage;

wherein a second capacitor electrode of at least one pixel driving circuit of the plurality of pixel driving circuits is configured to have a same voltage level as the voltage of the plurality of voltage supply lines; and a first capacitor electrode and a second capacitor electrode of the at least one dummy circuit are configured to have a same voltage level as the voltage of the plurality of voltage supply lines;

wherein the array substrate further comprises a pad in a second signal line layer, the pad being connected to a second node connecting line and a respective voltage supply line of the plurality of voltage supply lines in a first signal line layer.

10. The array substrate of claim 9, wherein an orthographic projection of the pad in a respective dummy circuit on a base substrate covers at least 50% of an orthographic projection of the second node connecting line in the respective dummy circuit on the base substrate.

11. The array substrate of claim 9, further comprising a plurality of second reset signal lines in the first signal line layer;

wherein an orthographic projection of the pad on a base substrate at least partially overlaps with an orthographic projection of a respective second reset signal line of the plurality of second reset signal lines on the base substrate.

12. The array substrate of claim 9, further comprising a second initialization connecting line and a fourth relay electrode in a first signal line layer;

wherein the second initialization connecting line and the fourth relay electrode are parts of a unitary structure crosses over a respective second reset control signal line of a plurality of second reset control signal line.

13. The array substrate of claim 12, further comprising a plurality of fourth reset signal lines in a second conductive layer, the plurality of fourth reset signal lines being in a row and disconnected and spaced apart from each other;

wherein the second initialization connecting line is connected to a respective fourth reset signal line of the plurality of fourth reset signal lines; and the pad is connected to the second initialization connecting line, configured to provide a voltage of the respective voltage supply line to the respective fourth reset signal line.

14. The array substrate of claim 9, further comprising a third relay electrode in a first signal line layer;

wherein the third relay electrode is connected to a second electrode of an eighth transistor in a semiconductor material layer; and the pad is connected to the third relay electrode, configured to provide a voltage of the respective voltage supply line to the second electrode of the eighth transistor.

15. The array substrate of claim 1, further comprising a plurality of second reset control signal line in a first conductive layer;

wherein a respective second reset control signal line of the plurality of second reset control signal line is connected to a control electrode of a seventh transistor; and the respective voltage supply line in a first signal line layer is connected to the respective second reset control signal line, configured to provide a voltage of the respective voltage supply line to the control electrode of the seventh transistor.

16. An array substrate, comprising:

a plurality of pixel driving circuits configured to drive light emission in a plurality of subpixels;

at least one dummy circuit incapable of driving light emission; and a plurality of voltage supply lines configured to provide a voltage;

wherein a second capacitor electrode of at least one pixel driving circuit of the plurality of pixel driving circuits is configured to have a same voltage level as the voltage of the plurality of voltage supply lines; and a first capacitor electrode and a second capacitor electrode of the at least one dummy circuit are configured to have a same voltage level as the voltage of the plurality of voltage supply lines;

wherein the array substrate further comprises a plurality of second gate lines in a row and disconnected and spaced apart from each other, and a plurality of second light emission control signal lines disconnected and spaced apart from each other;

wherein a respective dummy circuit comprises a respective second gate line and a respective second light emission control signal line;

the second storage capacitor in the respective dummy circuit comprises a third capacitor electrode; and the third capacitor electrode, the respective second gate line, and the respective second light emission control signal line are parts of a unitary structure in the respective dummy circuit.

17. The array substrate of claim 16, wherein the respective dummy circuit comprises an eighth transistor, a control electrode of which is connected to the respective second light emission control signal line; and the respective second gate line crosses over the respective voltage supply line and a respective second reset signal line of a plurality of second reset signal lines.

18. The array substrate of claim 16, comprising a semiconductor material layer, which comprises active layers of transistors of the at least one dummy circuit;

wherein the semiconductor material layer does not cross over the plurality of second gate lines.

19. A display apparatus, comprising the array substrate of claim 1, and an integrated circuit connected to the array substrate.

* * * * *